(12) United States Patent
Koezuka et al.

(10) Patent No.: US 11,695,078 B2
(45) Date of Patent: Jul. 4, 2023

(54) SEMICONDUCTOR DEVICE AND DISPLAY DEVICE INCLUDING SEMICONDUCTOR DEVICE

(71) Applicant: Semiconductor Energy Laboratory Co., Ltd., Atsugi (JP)

(72) Inventors: Junichi Koezuka, Tochigi (JP); Masami Jintyou, Shimotsuga (JP); Yukinori Shima, Tatebayashi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 117 days.

(21) Appl. No.: 17/114,765

(22) Filed: Dec. 8, 2020

(65) Prior Publication Data

US 2021/0119056 A1 Apr. 22, 2021

Related U.S. Application Data

(63) Continuation of application No. 16/992,373, filed on Aug. 13, 2020, now Pat. No. 10,903,368, which is a
(Continued)

(30) Foreign Application Priority Data

May 22, 2015 (JP) ................................ 2015-104502
Jul. 30, 2015 (JP) ................................ 2015-150231

(51) Int. Cl.
*H01L 29/786* (2006.01)
*H01L 29/49* (2006.01)
(Continued)

(52) U.S. Cl.
CPC ...... *H01L 29/7869* (2013.01); *H01L 21/0214* (2013.01); *H01L 21/0217* (2013.01);
(Continued)

(58) Field of Classification Search
CPC ........... H01L 29/7869; H01L 21/02164; H01L 27/1225; H01L 29/24; H01L 29/4966;
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 103456793 A 12/2013
EP 1737044 A 12/2006
(Continued)

OTHER PUBLICATIONS

Taiwanese Office Action (Application No. 110107158) dated May 25, 2022.
(Continued)

*Primary Examiner* — Jami Valentine Miller
(74) *Attorney, Agent, or Firm* — Robinson Intellectual Property Law Office; Eric J. Robinson

(57) ABSTRACT

The reliability of a transistor including an oxide semiconductor can be improved by suppressing a change in electrical characteristics. A transistor included in a semiconductor device includes a first oxide semiconductor film over a first insulating film, a gate insulating film over the first oxide semiconductor film, a second oxide semiconductor film over the gate insulating film, and a second insulating film over the first oxide semiconductor film and the second oxide semiconductor film. The first oxide semiconductor film includes a channel region in contact with the gate insulating film, a source region in contact with the second insulating film, and a drain region in contact with the second insulating film. The second oxide semiconductor film has a higher carrier density than the first oxide semiconductor film.

14 Claims, 42 Drawing Sheets

Related U.S. Application Data continuation of application No. 16/384,069, filed on Apr. 15, 2019, now Pat. No. 10,861,981, which is a continuation of application No. 15/819,008, filed on Nov. 21, 2017, now Pat. No. 10,319,861, which is a continuation of application No. 15/150,755, filed on May 10, 2016, now Pat. No. 9,837,547.

(51) Int. Cl.

| | | |
|---|---|---|
| *H01L 29/417* | (2006.01) | |
| *H01L 29/24* | (2006.01) | |
| *H01L 29/04* | (2006.01) | |
| *H01L 27/12* | (2006.01) | |
| *H01L 29/66* | (2006.01) | |
| *H01L 21/02* | (2006.01) | |
| *H01L 21/477* | (2006.01) | |
| *H01L 21/465* | (2006.01) | |
| *H01L 21/4757* | (2006.01) | |
| *H01L 29/423* | (2006.01) | |
| *H10K 59/12* | (2023.01) | |
| *H10K 59/121* | (2023.01) | |

(52) U.S. Cl.
CPC .... *H01L 21/0262* (2013.01); *H01L 21/02164* (2013.01); *H01L 21/02274* (2013.01); *H01L 21/02554* (2013.01); *H01L 21/02565* (2013.01); *H01L 21/02631* (2013.01); *H01L 21/465* (2013.01); *H01L 21/477* (2013.01); *H01L 21/47573* (2013.01); *H01L 27/1225* (2013.01); *H01L 27/1259* (2013.01); *H01L 29/045* (2013.01); *H01L 29/24* (2013.01); *H01L 29/41733* (2013.01); *H01L 29/42384* (2013.01); *H01L 29/4908* (2013.01); *H01L 29/4966* (2013.01); *H01L 29/66969* (2013.01); *H01L 29/78618* (2013.01); *H01L 29/78648* (2013.01); *H01L 29/78696* (2013.01); *H10K 59/1201* (2023.02); *H10K 59/1213* (2023.02)

(58) Field of Classification Search
CPC ......... H01L 29/66969; H01L 29/78696; H01L 27/3262; H01L 2227/323
USPC .......................................................... 257/43
See application file for complete search history.

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,021,916 B2* | 9/2011 | Akimoto | H01L 27/127 438/104 |
| 8,242,505 B2 | 8/2012 | Kawamura et al. | |
| 8,343,817 B2* | 1/2013 | Miyairi | H01L 29/1033 257/E21.414 |
| 8,445,902 B2 | 5/2013 | Sato et al. | |
| 8,629,451 B2 | 1/2014 | Kawamura et al. | |
| 8,748,886 B2 | 6/2014 | Yamazaki et al. | |
| 8,802,511 B2 | 8/2014 | Kawamura et al. | |
| 8,802,515 B2 | 8/2014 | Endo et al. | |
| 8,829,512 B2* | 9/2014 | Yamazaki | H01L 29/7869 257/E21.409 |
| 8,883,556 B2 | 11/2014 | Yamazaki | |
| 8,927,990 B2 | 1/2015 | Sasaki et al. | |
| 8,936,965 B2 | 1/2015 | Imoto et al. | |
| 8,945,981 B2* | 2/2015 | Yamazaki | H01L 27/1225 257/E29.296 |
| 8,981,374 B2 | 3/2015 | Kubota et al. | |
| 9,048,142 B2 | 6/2015 | Yamazaki | |
| 9,064,966 B2 | 6/2015 | Yamazaki et al. | |
| 9,070,778 B2* | 6/2015 | Sasaki | H01L 29/66969 |
| 9,177,969 B2 | 11/2015 | Kubota et al. | |
| 9,184,297 B2* | 11/2015 | Koezuka | H01L 29/78606 |
| 9,331,108 B2 | 5/2016 | Kubota et al. | |
| 9,331,156 B2 | 5/2016 | Yamazaki et al. | |
| 9,337,214 B2 | 5/2016 | Kubota et al. | |
| 9,443,984 B2 | 9/2016 | Yamazaki | |
| 9,443,987 B2* | 9/2016 | Miyanaga | H01L 29/4908 |
| 9,472,682 B2 | 10/2016 | Yamazaki et al. | |
| 9,530,804 B2 | 12/2016 | Kubota | |
| 9,577,107 B2 | 2/2017 | Shimomura et al. | |
| 9,659,977 B2 | 5/2017 | Kubota et al. | |
| 9,673,305 B2 | 6/2017 | Endo et al. | |
| 9,716,003 B2 | 7/2017 | Yamazaki | |
| 9,735,280 B2 | 8/2017 | Noda et al. | |
| 9,748,279 B2 | 8/2017 | Kubota et al. | |
| 9,780,225 B2 | 10/2017 | Yamazaki | |
| 9,881,939 B2 | 1/2018 | Takahashi et al. | |
| 9,905,586 B2 | 2/2018 | Yamazaki et al. | |
| 9,917,116 B2 | 3/2018 | Kubota et al. | |
| 9,954,004 B2 | 4/2018 | Yamazaki | |
| 9,960,279 B2 | 5/2018 | Sasaki et al. | |
| 9,978,855 B2 | 5/2018 | Noda et al. | |
| 10,043,913 B2 | 8/2018 | Shimomura et al. | |
| 10,068,932 B2 | 9/2018 | Kawamura et al. | |
| 10,153,360 B2 | 12/2018 | Endo et al. | |
| 10,559,602 B2 | 2/2020 | Kubota et al. | |
| 10,777,585 B2 | 9/2020 | Kubota et al. | |
| 10,811,521 B2 | 10/2020 | Yamazaki et al. | |
| 10,811,522 B2 | 10/2020 | Endo et al. | |
| 11,393,918 B2 | 7/2022 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0113077 A1* | 6/2004 | Franzen | G01N 21/553 250/338.1 |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1* | 6/2006 | Den | H01L 29/66969 257/79 |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |

(56) References Cited

U.S. PATENT DOCUMENTS

| | | |
|---|---|---|
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0075319 A1* | 4/2007 | Konno ............... H01L 33/14 257/E21.126 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278120 A1* | 11/2009 | Lee ............... H01L 29/7869 257/E29.296 |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0038641 A1* | 2/2010 | Imai ............... H01L 29/7869 257/E29.29 |
| 2010/0051936 A1* | 3/2010 | Hayashi ............... H01L 27/1225 257/E21.414 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0042670 A1 | 2/2011 | Sato et al. |
| 2011/0127523 A1* | 6/2011 | Yamazaki ............... H01L 29/24 257/E29.296 |
| 2011/0284844 A1 | 11/2011 | Endo et al. |
| 2012/0032173 A1 | 2/2012 | Sato et al. |
| 2012/0132902 A1 | 5/2012 | Imoto et al. |
| 2012/0161125 A1 | 6/2012 | Yamazaki |
| 2012/0315730 A1 | 12/2012 | Koezuka et al. |
| 2012/0315735 A1 | 12/2012 | Koezuka et al. |
| 2013/0153889 A1 | 6/2013 | Yamazaki et al. |
| 2013/0248850 A1 | 9/2013 | Choi et al. |
| 2013/0320328 A1 | 12/2013 | Lee et al. |
| 2014/0339539 A1* | 11/2014 | Yamazaki ............... H01L 29/78606 257/43 |
| 2014/0361292 A1* | 12/2014 | Yamazaki ............... H01L 29/045 257/43 |
| 2015/0021596 A1* | 1/2015 | Yamazaki ............... H01L 29/78693 257/43 |
| 2015/0021597 A1* | 1/2015 | Lu ............... H01L 27/127 430/286.1 |
| 2015/0053973 A1* | 2/2015 | Yamazaki ............... H01L 27/1225 257/532 |
| 2015/0187953 A1 | 7/2015 | Koezuka et al. |
| 2015/0221678 A1 | 8/2015 | Yamazaki et al. |
| 2015/0221774 A1* | 8/2015 | Yamazaki ............... H01L 29/78618 257/43 |
| 2015/0263174 A1 | 9/2015 | Yamazaki et al. |
| 2015/0270407 A1* | 9/2015 | Suzuki ............... H01L 29/7869 257/43 |
| 2015/0329371 A1 | 11/2015 | Kurosawa et al. |
| 2016/0005873 A1 | 1/2016 | Jintyou et al. |
| 2016/0204271 A1 | 7/2016 | Yamazaki et al. |
| 2016/0343868 A1* | 11/2016 | Koezuka ............... H01L 29/78693 |
| 2016/0380107 A1 | 12/2016 | Yamazaki |
| 2017/0033205 A1 | 2/2017 | Yamazaki et al. |
| 2017/0352690 A1* | 12/2017 | Yamazaki ............... H01L 29/78696 |
| 2018/0114855 A1* | 4/2018 | Yamazaki ............... H01L 29/78 |
| 2018/0219028 A1 | 8/2018 | Yamazaki |
| 2020/0411563 A1 | 12/2020 | Kubota et al. |
| 2021/0126114 A1 | 4/2021 | Endo et al. |
| 2022/0115411 A1 | 4/2022 | Yamazaki |

FOREIGN PATENT DOCUMENTS

| | | |
|---|---|---|
| EP | 1947695 A | 7/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 A | 6/2006 |
| JP | 2008-175842 A | 7/2008 |
| JP | 2009-272427 A | 11/2009 |
| JP | 2009-278115 A | 11/2009 |
| JP | 2012-009836 A | 1/2012 |
| JP | 2012-033836 A | 2/2012 |
| JP | 2012-119667 A | 6/2012 |
| JP | 2012-129511 A | 7/2012 |
| JP | 2012-151460 A | 8/2012 |
| JP | 2012-151463 A | 8/2012 |
| JP | 2013-102158 A | 5/2013 |
| JP | 2013-145876 A | 7/2013 |
| JP | 2013-211544 A | 10/2013 |
| JP | 2013-251526 A | 12/2013 |
| JP | 2014-030000 A | 2/2014 |
| JP | 2014-099430 A | 5/2014 |
| JP | 2014-197444 A | 10/2014 |
| JP | 2014-199428 A | 10/2014 |
| JP | 2015-038974 A | 2/2015 |
| JP | 2015-079946 A | 4/2015 |
| JP | 2015-111662 A | 6/2015 |
| KR | 2013-0107937 A | 10/2013 |
| KR | 2013-0136063 A | 12/2013 |
| KR | 2015-0028760 A | 3/2015 |
| TW | 201005950 | 2/2010 |
| TW | 201234598 | 8/2012 |
| TW | 201310644 | 3/2013 |
| TW | 201338156 | 9/2013 |
| TW | 201419549 | 5/2014 |
| TW | 201514583 | 4/2015 |
| TW | 201519419 | 5/2015 |

(56) References Cited

FOREIGN PATENT DOCUMENTS

| WO | WO-2004/114391 | 12/2004 |
|----|----------------|---------|
| WO | WO-2009/136645 | 11/2009 |
| WO | WO-2012/090973 | 7/2012  |
| WO | WO-2013/089115 | 6/2013  |
| WO | WO-2015/037500 | 3/2015  |
| WO | WO-2015/060203 | 4/2015  |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1 :Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions On Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:NUMERICAL Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1 Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the IN2O3 and Sc2O3—A2O3—Bo Systems [A; Fe, Ga, or Al; B: Mg, Mn, Fe, Nl, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-INCH) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way To Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD'08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure To Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.
Park.S et al., "Challenge To Future Displays: Transparent AM-OLED Driven By PEALD Grown ZnO TFT", IMID '07 Digest, 2007, pp. 1249-1252.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16TH International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
International Search Report (Application No. PCT/IB2016/052758) dated Jul. 19, 2016.
Written Opinion (Application No. PCT/IB2016/052758) dated Jul. 19, 2016.
Taiwanese Office Action (Application No. 105115502) dated Mar. 31, 2020.
Taiwanese Office Action (Application No. 110107158) dated Jan. 17, 2022.

\* cited by examiner

L/W=3/50 μm

L/W=3/50 μm

SEMICONDUCTOR DEVICE AND DISPLAY DEVICE INCLUDING SEMICONDUCTOR DEVICE

BACKGROUND OF THE INVENTION

1. Field of the Invention

One embodiment of the present invention relates to a semiconductor device including an oxide semiconductor film and a display device including the semiconductor device.

Note that one embodiment of the present invention is not limited to the above technical field. The technical field of one embodiment of the invention disclosed in this specification and the like relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic appliance may each include a semiconductor device.

2. Description of the Related Art

Attention has been focused on a technique for forming a transistor using a semiconductor thin film formed over a substrate having an insulating surface (also referred to as a field-effect transistor (FET) or a thin film transistor (TFT)). Such transistors are applied to a wide range of electronic appliances such as an integrated circuit (IC) and an image display device (display device). A semiconductor material typified by silicon is widely known as a material for a semiconductor thin film that can be used for a transistor. As another material, an oxide semiconductor has been attracting attention.

For example, a technique in which a transistor is manufactured using an amorphous oxide containing In, Zn, Ga, Sn, and the like as an oxide semiconductor is disclosed (see Patent Document 1). Furthermore, a technique in which a transistor using an oxide thin film and a self-aligned top-gate structure is manufactured is disclosed (see Patent Document 2).

Furthermore, a semiconductor device including, as a base insulating layer of an oxide semiconductor layer where a channel is formed, an insulating layer that releases oxygen by heating to reduce oxygen vacancies in the oxide semiconductor layer is disclosed (see Patent Document 3).

REFERENCE

Patent Document

[Patent Document 1] Japanese Published Patent Application No. 2006-165529
[Patent Document 2] Japanese Published Patent Application No. 2009-278115
[Patent Document 3] Japanese Published Patent Application No. 2012-009836

SUMMARY OF THE INVENTION

As examples of a transistor including an oxide semiconductor film, an inverted staggered transistor (also referred to as a transistor having a bottom-gate structure), a staggered transistor (also referred to as a transistor having a top-gate structure), and the like are given. In the case where a transistor including an oxide semiconductor film is used for a display device, an inverted staggered transistor is used more often than a staggered transistor because a manufacturing process thereof is relatively simple and manufacturing cost thereof can be kept low. However, signal delay or the like is increased by parasitic capacitance that exists between a gate electrode and source and drain electrodes of an inverted staggered transistor and accordingly image quality of a display device degrades, which has posed a problem, as an increase in screen size of a display device proceeds, or a display device is provided with a higher resolution image (e.g., a high-resolution display device typified by 4K×2K pixels (3840 pixels in the horizontal direction and 2160 pixels in the perpendicular direction) or 8K×4K pixels (7680 pixels in the horizontal direction and 4320 pixels in the perpendicular direction)). Thus, with regard to a staggered transistor including an oxide semiconductor film, development of a transistor which has a structure with stable semiconductor characteristics and high reliability is desired.

Furthermore, in the case where a transistor is manufactured using an oxide semiconductor film for a channel region, an oxygen vacancy which is formed in the channel region of the oxide semiconductor film adversely affects the transistor characteristics. For example, formation of oxygen vacancies in a channel region of an oxide semiconductor film causes carrier generation. The carrier generation in the channel region of the oxide semiconductor film causes a change in the electrical characteristics, typically, a shift in the threshold voltage, of the transistor including the oxide semiconductor film in the channel region. Furthermore, there is a problem in that electrical characteristics vary among the transistors. Therefore, it is preferable that the amount of oxygen vacancy in the channel region of the oxide semiconductor film be as small as possible. Meanwhile, in the transistor including the oxide semiconductor film in the channel region, it is preferable that the amount of oxygen vacancy in regions of the oxide semiconductor film that are in contact with source and drain electrodes be as large as possible and the resistance of the regions be as low as possible to reduce a contact resistance between the oxide semiconductor film and the source and drain electrodes.

In view of the foregoing problems, an object of one embodiment of the present invention is to suppress a change in electrical characteristics and to improve reliability in a transistor including an oxide semiconductor. Another object of one embodiment of the present invention is to provide a staggered transistor including an oxide semiconductor. Another object of one embodiment of the present invention is to provide a transistor including an oxide semiconductor and having high on-state current. Another object of one embodiment of the present invention is to provide a transistor including an oxide semiconductor and having low off-state current. Another object of one embodiment of the present invention is to provide a semiconductor device with low power consumption. Another object of one embodiment of the present invention is to provide a novel semiconductor device.

Note that the description of the above objects does not disturb the existence of other objects. In one embodiment of the present invention, there is no need to achieve all the objects. Other objects are apparent from and can be derived from the description of the specification and the like.

One embodiment of the present invention is a semiconductor device including a transistor. The transistor includes a first oxide semiconductor film over a first insulating film, a gate insulating film over the first oxide semiconductor film, a second oxide semiconductor film over the gate insulating film, and a second insulating film over the first oxide semiconductor film and the second oxide semiconductor film. The first oxide semiconductor film includes a channel region in contact with the gate insulating film, a source region in contact with the second insulating film, and a drain region in contact with the second insulating film. The second oxide semiconductor film has a higher carrier density than the first oxide semiconductor film.

Another embodiment of the present invention is a semiconductor device including a transistor. The transistor includes a first oxide semiconductor film over a first insulating film, a gate insulating film over the first oxide semiconductor film, a second oxide semiconductor film over the gate insulating film, a conductive film over the second oxide semiconductor film, and a second insulating film over the first oxide semiconductor film and the conductive film. The first oxide semiconductor film includes a channel region in contact with the gate insulating film, a source region in contact with the second insulating film, and a drain region in contact with the second insulating film. The second oxide semiconductor film has a higher carrier density than the first oxide semiconductor film.

In the above embodiment, it is preferable that an upper end portion of the gate insulating film be aligned with a lower end portion of the second oxide semiconductor film or positioned outside the lower end portion of the second oxide semiconductor film.

In the above embodiment, it is preferable that the second insulating film contain one or both of nitrogen and hydrogen.

In the above embodiment, it is preferable that the transistor further include a third insulating film over the second insulating film, a source electrode connected to the source region through an opening in the second insulating film and the third insulating film, and a drain electrode connected to the drain region through an opening in the second insulating film and the third insulating film.

In the above embodiment, it is preferable that the source region and the drain region each include a region with the same hydrogen concentration as the second oxide semiconductor film. Moreover, in the above embodiment, it is preferable that the source region and the drain region each contain one or more of hydrogen, boron, carbon, nitrogen, fluorine, phosphorus, sulfur, and a rare gas.

In the above embodiment, it is preferable that one or both of the first oxide semiconductor film and the second oxide semiconductor film contain oxygen, In, Zn, and M (M is Al, Ga, Y, or Sn). Moreover, in the above embodiment, it is preferable that one or both of the first oxide semiconductor film and the second oxide semiconductor film contain a crystal part, and that the crystal part has c-axis alignment.

Another embodiment of the present invention is a display device including the semiconductor device according to any one of the above embodiments, and a display element. Another embodiment of the present invention is a display module including the display device and a touch sensor. Another embodiment of the present invention is an electronic appliance including the semiconductor device according to any one of the above embodiments, the display device, or the display module; and an operation key or a battery.

With one embodiment of the present invention, the reliability of a transistor including an oxide semiconductor can be improved by suppressing a change in electrical characteristics. Furthermore, with one embodiment of the present invention, a staggered transistor including an oxide semiconductor can be provided. Furthermore, with one embodiment of the present invention, a transistor including an oxide semiconductor and having high on-state current can be provided. Furthermore, with one embodiment of the present invention, a transistor including an oxide semiconductor and having low off-state current can be provided. Furthermore, with one embodiment of the present invention, a semiconductor device with low power consumption can be provided. Furthermore, with one embodiment of the present invention, a novel semiconductor device can be provided.

Note that the description of these effects does not disturb the existence of other effects. One embodiment of the present invention does not necessarily achieve all the effects listed above.

Other effects will be apparent from and can be derived from the description of the specification, the drawings, the claims, and the like.

DETAILED DESCRIPTION OF THE INVENTION

Figure 1A:
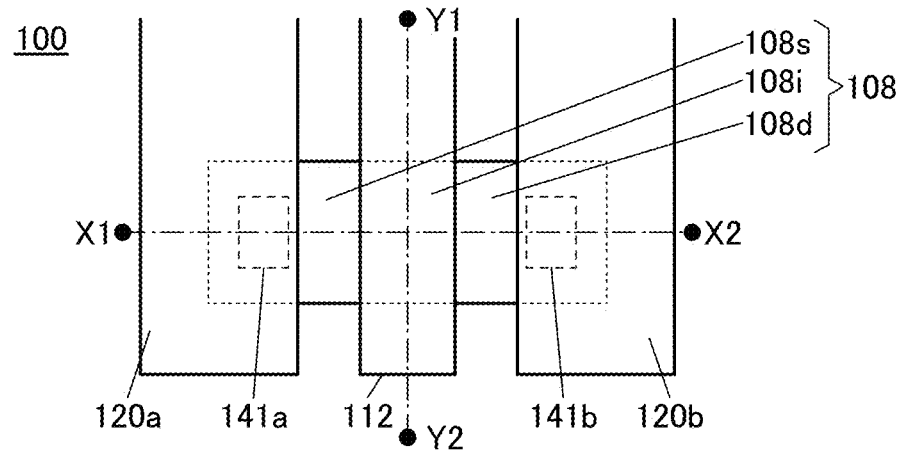
FIGS. 1A to 1C are a top view and cross-sectional views of a semiconductor device.

Hereinafter, embodiments and examples will be described with reference to drawings. However, the embodiments and examples can be implemented with various modes. It will be readily appreciated by those skilled in the art that modes and details can be changed in various ways without departing from the spirit and scope of the present invention. Thus, the present invention should not be interpreted as being limited to the following description of the embodiments and examples.

In the drawings, the size, the layer thickness, or the region is exaggerated for clarity in some cases. Therefore, embodiments and examples of the present invention are not limited to such a scale. Note that the drawings are schematic views showing ideal examples, and embodiments of the present invention are not limited to shapes or values shown in the drawings.

Note that in this specification, ordinal numbers such as "first," "second," and "third" are used in order to avoid confusion among components, and the terms do not limit the components numerically.

Note that in this specification, terms for describing arrangement, such as "over", "above", "under", and "below", are used for convenience in describing a positional relation between components with reference to drawings. Furthermore, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100° and accordingly also includes the case where the angle is greater than or equal to 85° and less than or equal to 95°.

In this specification and the like, the terms "film" and "layer" can be interchanged with each other. For example, the term "conductive layer" can be changed into the term "conductive film" in some cases. Furthermore, the term "insulating film" can be changed into the term "insulating layer" in some cases.

Unless otherwise specified, the off-state current in this specification and the like refers to a drain current of a transistor in the off state (also referred to as non-conduction state and cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. For this reason, when there is Vgs at which the off-state current of a transistor is lower than or equal to I, it may be said that the off-state current of the transistor is lower than or equal to I. The off-state current of a transistor may refer to off-state current at given Vgs, off-state current at Vgs in a given range, or off-state current at Vgs at which sufficiently low off-state current is obtained.

As an example, the assumption is made of an n-channel transistor where the threshold voltage Vth is 0.5 V and the drain current is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The drain current of the transistor is $1\times10^{-19}$ A or lower at Vgs of −0.5 V or at Vgs in the range of −0.8 V to −0.5 V; therefore, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

In this specification and the like, the off-state current of a transistor with a channel width W is sometimes represented by a current value in relation to the channel width W or by a current value per given channel width (e.g., 1 μm). In the latter case, the unit of off-state current may be represented by current per length (e.g., A/μm).

The off-state current of a transistor depends on temperature in some cases. Unless otherwise specified, the off-state current in this specification may be off-state current at room temperature, 60° C., 85° C., 95° C., or 125° C. Alternatively, the off-state current may be off-state current at a temperature at which the reliability of a semiconductor device or the like including the transistor is ensured or a temperature at which the semiconductor device or the like including the transistor is used (e.g., temperature in the range of 5° C. to 35° C.). When there is Vgs at which the off-state current of a transistor at room temperature, 60° C., 85° C., 95° C., 125° C., a temperature at which the reliability of a semiconductor device or the like including the transistor is ensured, or a temperature at which the semiconductor device or the like including the transistor is used (e.g., temperature in the range of 5° C. to 35° C.) is lower than or equal to I, it may be said that the off-state current of the transistor is lower than or equal to I.

The off-state current of a transistor depends on voltage Vds between its drain and source in some cases. Unless otherwise specified, the off-state current in this specification may be off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current may be off-state current at Vds at which the reliability of a semiconductor device or the like including the transistor is ensured or Vds used in the semiconductor device or the like including the transistor. When there is Vgs at which the off-state current of a transistor at Vds of 0.1 V, 0.8 V, 1 V, 1.2 V, 1.8 V, 2.5 V, 3 V, 3.3 V, 10 V, 12 V, 16 V, or 20 V, at Vds at which the reliability of a semiconductor device or the like including the transistor is ensured, or at Vds at which the semiconductor device or the like including the transistor is used is lower than or equal to I, it may be said that the off-state current of the transistor is lower than or equal to I.

In the above description of off-state current, a drain may be replaced with a source. That is, the off-state current sometimes refers to current that flows through a source of a transistor in the off state.

In this specification and the like, the term "leakage current" sometimes expresses the same meaning as off-state current. In this specification and the like, the off-state current sometimes refers to current that flows between a source and a drain when a transistor is off, for example.

Embodiment 1

In this embodiment, examples of a semiconductor device including a transistor and a method for manufacturing the semiconductor device are described with reference to FIGS. 1A to 1C, FIGS. 2A to 2C, FIGS. 3A to 3C, FIGS. 4A to 4C, FIGS. 5A to 5C, FIGS. 6A to 6C, FIGS. 7A and 7B, FIGS. 8A and 8B, FIGS. 9A and 9B, FIGS. 10A and 10B, FIGS. 11A and 11B, FIGS. 12A and 12B, FIGS. 13A to 13D, FIGS. 14A to 14D, FIGS. 15A to 15C, FIGS. 16A to 16D, FIGS. 17A to 17D, FIGS. 18A to 18D, and FIGS. 19A and 19B.

1-1. STRUCTURE EXAMPLE 1 OF SEMICONDUCTOR DEVICE

Figure 1B:
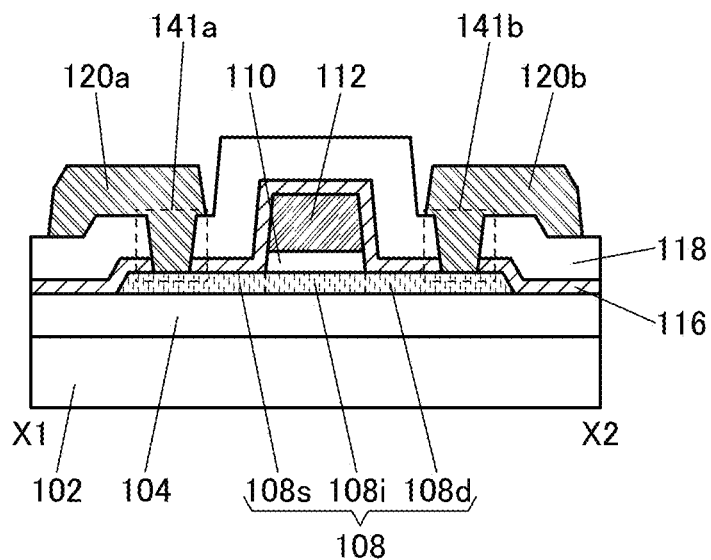
Figure 1C:
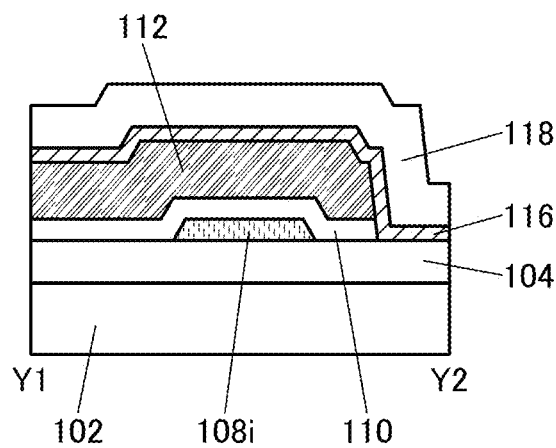

FIGS. 1A to 1C illustrate an example of a semiconductor device including a transistor. Note that the transistor illustrated in FIGS. 1A to 1C has a top-gate structure.

FIG. 1A is a top view of a transistor 100. FIG. 1B is a cross-sectional view taken along the dashed-dotted line X1-X2 in FIG. 1A. FIG. 1C is a cross-sectional view taken along the dashed-dotted line Y1-Y2 in FIG. 1A. Note that in FIG. 1A, components such as an insulating film 110 are omitted for clarity. In a manner similar to that of FIG. 1A, some components are not illustrated in some cases in top views of transistors described below. Furthermore, the direction of the dashed-dotted line X1-X2 may be called a channel length (L) direction, and the direction of the dashed-dotted line Y1-Y2 may be called a channel width (W) direction.

The transistor 100 illustrated in FIGS. 1A to 1C includes an insulating film 104 formed over a substrate 102, an oxide semiconductor film 108 over the insulating film 104, the insulating film 110 over the oxide semiconductor film 108, an oxide semiconductor film 112 over the insulating film 110, and an insulating film 116 over the insulating film 104 and the oxide semiconductor films 108 and 112. Furthermore, the oxide semiconductor film 108 has a channel region 108i overlapping with the oxide semiconductor film 112 and in contact with the insulating film 110, a source region 108s in contact with the insulating film 116, and a drain region 108d in contact with the insulating film 116.

The transistor 100 may include an insulating film 118 over the insulating film 116, a conductive film 120a electrically connected to the source region 108s through an opening 141a provided in the insulating films 116 and 118, and a conductive film 120b electrically connected to the drain region 108d through an opening 141b provided in the insulating films 116 and 118.

In this specification and the like, the insulating film 104 is referred to as a first insulating film, the insulating film 116 is referred to as a second insulating film, and the insulating film 118 is referred to as a third insulating film in some cases. The insulating film 110 functions as a gate insulating film, and the oxide semiconductor film 112 functions as a gate electrode. The conductive film 120a and the conductive film 120b function as a source electrode and a drain electrode, respectively.

The insulating film 116 contains one or both of nitrogen and hydrogen. From the insulating film 116 containing one or both of nitrogen and hydrogen, one or both of nitrogen and hydrogen can be supplied to the oxide semiconductor films 108 and 112.

The oxide semiconductor film 112 has a function of supplying oxygen to the insulating film 110. The oxide semiconductor film 112 having a function of supplying oxygen to the insulating film 110 enables the insulating film 110 to contain excess oxygen. When the insulating film 110 includes an excess oxygen region, excess oxygen can be supplied to the oxide semiconductor film 108, specifically, the channel region 108i. Thus, a highly reliable semiconductor device can be obtained.

The insulating film 104, which is formed under the oxide semiconductor film 108, may contain excess oxygen to supply it to the oxide semiconductor film 108. However, in the case where the insulating film 104 contains excess oxygen, the excess oxygen contained in the insulating film 104 is also possibly supplied to the source region 108s and the drain region 108d of the oxide semiconductor film 108. If excess oxygen is supplied to the source region 108s and the drain region 108d, the resistance of the source region 108s and the drain region 108d might be increased.

In contrast, in the structure in which the insulating film 110 formed over the oxide semiconductor film 108 contains excess oxygen, excess oxygen can be selectively supplied to the channel region 108i. Alternatively, after excess oxygen is supplied to the channel region 108i, the source region 108s, and the drain region 108d, the carrier density in the source region 108s and the drain region 108d may be selectively increased.

The carrier density in the oxide semiconductor film 112 having supplied oxygen to the insulating film 110 is increased by one or both of nitrogen and hydrogen supplied from the insulating film 116. In other words, the oxide semiconductor film 112 also functions as an oxide conductor (OC). Thus, the oxide semiconductor film 112 has a higher carrier density than the oxide semiconductor film 108.

Furthermore, the oxide semiconductor film 112 and the source region 108s and the drain region 108d of the oxide semiconductor film 108 may each contain an element that forms an oxygen vacancy. Typical examples of the element that forms an oxygen vacancy include hydrogen, boron, carbon, nitrogen, fluorine, phosphorus, sulfur, chorine, and a rare gas element. Typical examples of the rare gas element include helium, neon, argon, krypton, and xenon.

When an impurity element is added to the oxide semiconductor film, a bond between a metal element and oxygen in the oxide semiconductor film is cut, whereby an oxygen vacancy is formed. Alternatively, when an impurity element is added to the oxide semiconductor film, oxygen bonded to a metal element in the oxide semiconductor film is bonded to the impurity element, and the oxygen is released from the metal element, whereby an oxygen vacancy is formed. As a result, the oxide semiconductor film has a higher carrier density and thus the conductivity thereof becomes higher.

The transistor 100 preferably has a region in which a side end portion of the insulating film 110 is aligned with a side end portion of the oxide semiconductor film 112. In other words, in the transistor 100, an upper end portion of the insulating film 110 is substantially aligned with a lower end portion of the oxide semiconductor film 112. The above structure can be obtained by processing the insulating film 110 with the use of the oxide semiconductor film 112 as a mask, for example.

Next, details of other components included in the semiconductor device illustrated in FIGS. 1A to 1C are described.

[Substrate]

As the substrate 102, any of a variety of substrates can be used without particular limitation. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of a glass substrate include a barium borosilicate glass substrate, an aluminoborosilicate glass substrate, and a soda lime glass substrate. Examples of the flexible substrate, the attachment film, and the base material film are plastics typified by polyethylene terephthalate (PET), polyethylene naphthalate (PEN), and polyether sulfone (PES), a synthetic resin of acrylic or the like, polypropylene, polyester, polyvinyl fluoride, polyvinyl chloride, polyamide, polyimide, aramid, epoxy, an inorganic vapor deposition film, paper, and the like. In particular, by forming the transistor with the use of a semiconductor substrate, a single crystal substrate, an SOT substrate, or the like, transistors with fewer variations in characteristics, sizes, shapes, or the like, with high current supply capability, and with small sizes can be formed. By forming a circuit using such a transistor, power consumption of the circuit can be reduced or the circuit can be highly integrated.

A flexible substrate may be used as the substrate 102, and the transistor may be provided directly on the flexible substrate. Alternatively, a separation layer may be provided between the substrate 102 and the transistor. The separation layer can be used when part or the whole of a semiconductor device formed over the separation layer is separated from the substrate 102 and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

Examples of a substrate to which the transistor is transferred include, in addition to the above-described substrates over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. By using such a substrate, a transistor with excellent characteristics or a transistor with low power consumption can be formed, a device with high durability can be formed, heat resistance can be provided, or a reduction in weight or thickness can be achieved.

[First Insulating Film]

The insulating film 104 can be formed by a sputtering method, a CVD method, an evaporation method, a pulsed laser deposition (PLD) method, a printing method, a coating method, or the like as appropriate. The insulating film 104 can be formed with a single layer or a stack using, for example, an oxide insulating film or a nitride insulating film. Note that an oxide insulating film is preferably used for at least a region of the insulating film 104 which is in contact with the oxide semiconductor film 108, in order to improve characteristics of the interface with the oxide semiconductor film 108. When the insulating film 104 is formed using an oxide insulating film that releases oxygen by heating, oxygen contained in the insulating film 104 can be moved to the oxide semiconductor film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. With the use of the thick insulating film 104, the amount of oxygen released from the insulating film 104 can be increased, and the interface state at the interface between the insulating film 104 and the oxide semiconductor film 108 and oxygen vacancies included in the channel region 108$i$ of the oxide semiconductor film 108 can be reduced.

The insulating film 104 can be formed with a single layer or a stack using, for example, silicon oxide, silicon oxynitride, silicon nitride oxide, silicon nitride, aluminum oxide, hafnium oxide, gallium oxide, or a Ga—Zn oxide. In this embodiment, a stacked-layer structure of a silicon nitride film and a silicon oxynitride film is used as the insulating film 104. When the insulating film 104 has a stacked-layer structure of the silicon nitride film as a lower layer and the silicon oxynitride film as an upper layer, oxygen can be efficiently introduced into the oxide semiconductor film 108.

[Oxide Semiconductor Film]

One or both of the oxide semiconductor films 108 and 112 are formed using a metal oxide such as an In—M—Zn oxide (M is Al, Ga, Y, or Sn). Alternatively, an In—Ga oxide or an In—Zn oxide may be used for the oxide semiconductor films 108 and 112. It is particularly preferable that the oxide semiconductor films 108 and 112 be formed using metal oxides containing the same constituent elements because manufacturing cost can be reduced.

Note that in the case where an In—M—Zn oxide is used as the oxide semiconductor films 108 and 112, when the summation of In and M is assumed to be 100 atomic %, the proportions of In and M are as follows: the proportions of In and M are preferably set to be greater than 25 atomic % and less than 75 atomic %, respectively, or greater than 34 atomic % and less than 66 atomic %, respectively.

It is preferable that energy gaps of the oxide semiconductor films 108 and 112 be each 2 eV or more, 2.5 eV or more, or 3 eV or more.

The thickness of the oxide semiconductor film 108 is greater than or equal to 3 nm and less than or equal to 200 nm, preferably greater than or equal to 3 nm and less than or equal to 100 nm and further preferably greater than or equal to 3 nm and less than or equal to 60 nm. The thickness of the oxide semiconductor film 112 is greater than or equal to 5 nm and less than or equal to 500 nm, preferably greater than or equal to 10 nm and less than or equal to 300 nm and further preferably greater than or equal to 20 nm and less than or equal to 100 nm.

In the case where the oxide semiconductor films 108 and 112 are each an In—M—Zn oxide, it is preferable that the atomic ratio of metal elements of a sputtering target used to form a film of the In—M—Zn oxide satisfy In and Zn M. As the atomic ratio of metal elements of such a sputtering target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, In:M:Zn=5:1:7, or the like is preferable. Note that the atomic ratios of metal elements in the formed oxide semiconductor films 108 and 112 may vary from the above atomic ratio of metal elements of the sputtering target within a range of approximately ±40%. For example, in the case where a sputtering target with an atomic ratio of In:Ga:Zn=4:2:4.1 is used, atomic ratios of In:Ga:Zn in the formed oxide semiconductor films 108 and 112 each may be 4:2:3 and its vicinity.

When contained in the oxide semiconductor film 108, silicon or carbon, which are elements belonging to Group 14, may cause oxygen vacancies to be increased and the oxide semiconductor film to have n-type conductivity. To prevent this, the concentration of silicon or carbon (measured by secondary ion mass spectrometry) in the oxide semiconductor film 108, particularly in the channel region 108$i$, is preferably lower than or equal to $2\times10^{18}$ atoms/cm$^3$ or lower than or equal to $2\times10^{17}$ atoms/cm$^3$. As a result, the transistor has a positive threshold voltage (normally-off characteristics).

Furthermore, the concentration of alkali metal or alkaline earth metal in the channel region 108$i$, which is measured by secondary ion mass spectrometry, can be lower than or equal to $1\times10^{18}$ atoms/cm$^3$, or lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the channel region 108$i$. As a result, the transistor has positive threshold voltage (normally-off characteristics).

Furthermore, when nitrogen is contained in the channel region 108$i$, electrons serving as carriers are generated, the carrier density is increased, and the region becomes an n-type in some cases. Thus, a transistor including an oxide semiconductor film which contains nitrogen is likely to have normally-on characteristics. For this reason, nitrogen in the channel region 108$i$ is preferably reduced as much as possible. The nitrogen concentration, which is measured by secondary ion mass spectrometry, may be, for example, lower than or equal to $5\times10^{18}$ atoms/cm$^3$.

When the impurity element in the channel region is reduced, the carrier density of the oxide semiconductor film can be lowered. Therefore, the channel region 108$i$ can have a carrier density less than or equal to $1\times10^{17}$/cm$^3$, less than or equal to $1\times10^{15}$/cm$^3$, less than or equal to $1\times10^{13}$/cm$^3$, or less than or equal to $1\times10^{11}$/cm$^3$.

Note that an oxide semiconductor film with low impurity concentration and low density of defect states can be used for the channel region 108$i$, in which case the transistor can have more excellent electrical characteristics. Here, the state in which the impurity concentration is low and the density of defect states is low (the amount of oxygen vacancies is small) is referred to as a "highly purified intrinsic", "substantially highly purified intrinsic", "intrinsic", or "substantially intrinsic". A highly purified intrinsic or substantially highly purified intrinsic oxide semiconductor has few carrier generation sources, and thus has a low carrier density in some cases. Thus, a transistor whose channel region is formed in the oxide semiconductor film is likely to have positive threshold voltage (normally-off characteristics). The highly purified intrinsic or substantially highly purified intrinsic oxide semiconductor film has low density of defect states and accordingly has low density of trap states in some cases. Furthermore, the highly purified intrinsic or substantially highly purified intrinsic oxide semiconductor film has extremely low off-state current. Thus, the transistor whose channel region is formed in the oxide semiconductor film has little variation in electrical characteristics and high reliability in some cases.

Meanwhile, the source region 108$s$, the drain region 108$d$, and the oxide semiconductor film 112 are in contact with the insulating film 116. One or both of hydrogen and nitrogen are added from the insulating film 116 to the source region 108$s$, the drain region 108$d$, and the oxide semiconductor film 112 in contact with the insulating film 116, so that the carrier densities in the source region 108s, the drain region 108d, and the oxide semiconductor film 112 are increased.

Furthermore, one or both of the oxide semiconductor films 108 and 112 may have a non-single-crystal structure. The non-single-crystal structure includes a c-axis aligned crystalline oxide semiconductor (CAAC-OS) which is described later, a polycrystalline structure, a microcrystalline structure described later, or an amorphous structure, for example. Among the non-single-crystal structure, the amorphous structure has the highest density of defect states, whereas CAAC-OS has the lowest density of defect states.

Note that the oxide semiconductor film 108 may be a single film or a stacked films each including two or more of the following: a region having an amorphous structure, a region having a microcrystalline structure, a region having a polycrystalline structure, a CAAC-OS region, and a region having a single-crystal structure. Note that the oxide semiconductor film 112 may be a single film or a stacked films each including two or more of the following: a region having an amorphous structure, a region having a microcrystalline structure, a region having a polycrystalline structure, a CAAC-OS region, and a region having a single-crystal structure.

Note that in the oxide semiconductor film 108, the crystallinity of the channel region 108i is different from the crystallinity of each of the source region 108s and the drain region 108d in some cases. Specifically, in the oxide semiconductor film 108, the crystallinity of each of the source region 108s and the drain region 108d is lower than the crystallinity of the channel region 108i in some cases. This is because, when the impurity element is added to the source region 108s and the drain region 108d, the source region 108s and the drain region 108d are damaged and thus have lower crystallinity.

[Insulating Film Functioning as Gate Insulating Film]

The insulating film 110 can be formed with a single layer or a stack using an oxide insulating film or a nitride insulating film. Note that an oxide insulating film is preferably used for at least a region of the insulating film 110 which is in contact with the oxide semiconductor film 108, in order to improve characteristics of the interface with the oxide semiconductor film 108. The insulating film 110 can be formed with a single layer or a stack using, for example, silicon oxide, silicon oxynitride, silicon nitride oxide, silicon nitride, aluminum oxide, hafnium oxide, gallium oxide, or a Ga—Zn oxide.

Furthermore, it is possible to prevent outward diffusion of oxygen from the oxide semiconductor film 108 and entry of hydrogen, water, and the like into the oxide semiconductor film 108 from the outside by providing an insulating film having a blocking effect against oxygen, hydrogen, water, and the like as the insulating film 110. As the insulating film which has an effect of blocking oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, or the like can be used.

The insulating film 110 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

When the insulating film 110 is formed using an oxide insulating film that releases oxygen by heating, oxygen contained in the insulating film 110 can be moved to the oxide semiconductor film 108 by heat treatment.

The thickness of the insulating film 110 can be greater than or equal to 5 nm and less than or equal to 400 nm, greater than or equal to 5 nm and less than or equal to 300 nm, or greater than or equal to 10 nm and less than or equal to 250 nm.

[Second Insulating Film]

The insulating film 116 contains one or both of nitrogen and hydrogen. The insulating film 116 is a nitride insulating film, for example. The nitride insulating film can be formed using silicon nitride, silicon nitride oxide, aluminum nitride, aluminum nitride oxide, or the like. The hydrogen concentration in the insulating film 116 is preferably higher than or equal to $1\times10^{22}$ atoms/cm$^3$. Furthermore, the insulating film 116 is in contact with the source region 108s and the drain region 108d of the oxide semiconductor film 108. The insulating film 116 is also in contact with the oxide semiconductor film 112. Therefore, the hydrogen concentrations in the source region 108s, the drain region 108d, and the oxide semiconductor film 112 in contact with the insulating film 116 are increased; thus, the carrier densities in the source region 108s, the drain region 108d, and the oxide semiconductor film 112 can be increased. Since the source region 108s, the drain region 108d, and the oxide semiconductor film 112 are in contact with the insulating film 116, they have regions with the same hydrogen concentration in some cases.

[Third Insulating Film]

The insulating film 118 can be formed with a single layer or a stack using an oxide insulating film or a nitride insulating film. The insulating film 118 can be formed with a single layer or a stack using, for example, silicon oxide, silicon oxynitride, silicon nitride oxide, silicon nitride, aluminum oxide, hafnium oxide, gallium oxide, or a Ga—Zn oxide.

The insulating film 118 is preferably a film functioning as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

[Conductive Film]

The conductive films 120a and 120b can be formed by a sputtering method, a vacuum evaporation method, a pulsed laser deposition (PLD) method, a thermal CVD method, or the like. The conductive films 120a and 120b can be formed using, for example, a metal element selected from aluminum, chromium, copper, tantalum, titanium, molybdenum, nickel, iron, cobalt, and tungsten; an alloy containing any of these metal elements as a component; an alloy containing these metal elements in combination; or the like. Furthermore, one or more metal elements selected from manganese and zirconium may be used. The conductive films 120a and 120b may each have a single-layer structure or a stacked-layer structure of two or more layers. For example, any of the following can be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a two-layer structure in which a copper film is stacked over a titanium film; a three-layer structure in which a titanium film, an aluminum film, and a titanium film are stacked in this order; and a three-layer structure in which a copper film containing manganese, a copper film, and a copper film containing manganese are stacked in this order. Alternatively, an alloy film or a nitride film in which aluminum and one or more elements selected from titanium, tantalum, tungsten, molybdenum, chromium, neodymium, and scandium are combined may be used.

The conductive films 120a and 120b can also be formed using a light-transmitting conductive material such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide containing silicon (also referred to as In—Sn—Si oxide or ITSO). It is also possible to have a stacked-layer structure of the above light-transmitting conductive material and the above metal element.

The thicknesses of the conductive films 120a and 120b each can be greater than or equal to 30 nm and less than or equal to 500 nm, or greater than or equal to 100 nm and less than or equal to 400 nm.

1-2. STRUCTURE EXAMPLE 2 OF SEMICONDUCTOR DEVICE

A structure of a semiconductor device, which is different from that of the semiconductor device illustrated in FIGS. 1A to 1C, is described with reference to FIGS. 2A to 2C.

Figure 2A:
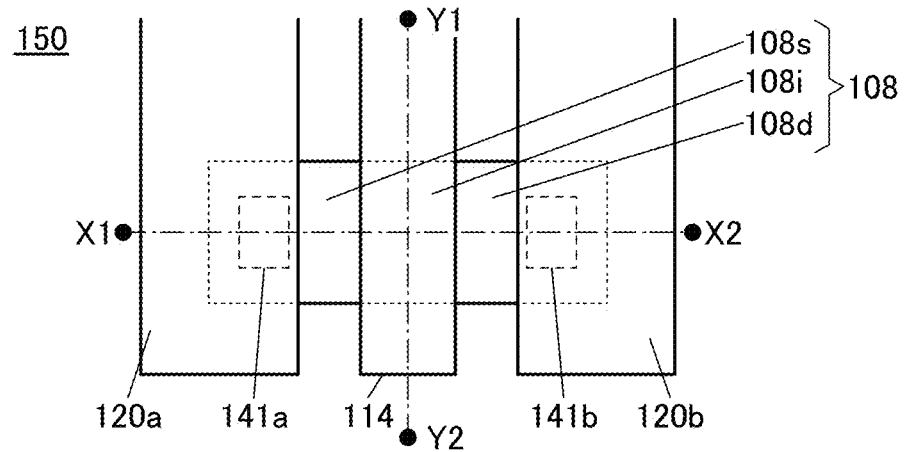
FIGS. 2A to 2C are a top view and cross-sectional views of a semiconductor device.

FIG. 2A is a top view of a transistor 150. FIG. 2B is a cross-sectional view taken along the dashed-dotted line X1-X2 in FIG. 2A. FIG. 2C is a cross-sectional view taken along the dashed-dotted line Y1-Y2 in FIG. 2A.

Figure 2B:
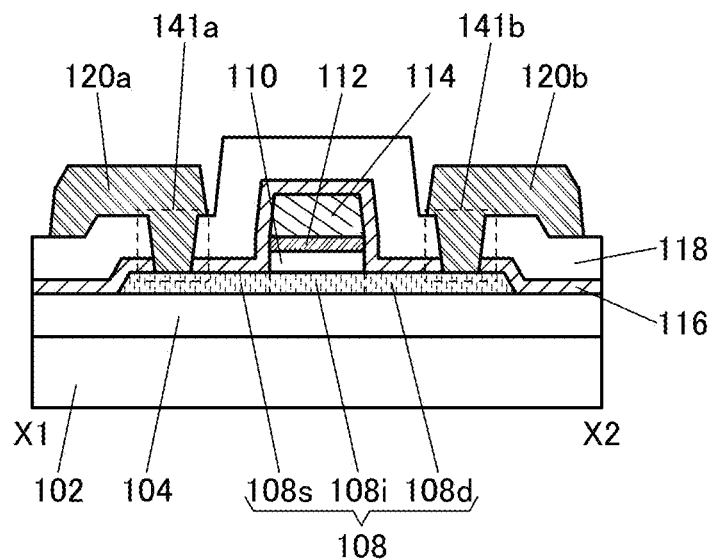
Figure 2C:
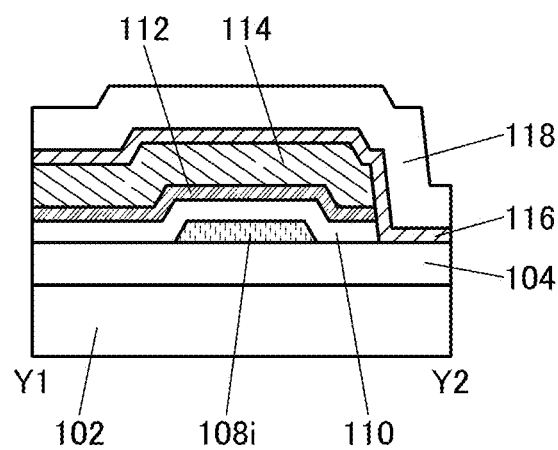

The transistor 150 illustrated in FIGS. 2A to 2C includes the insulating film 104 formed over the substrate 102, the oxide semiconductor film 108 over the insulating film 104, the insulating film 110 over the oxide semiconductor film 108, the oxide semiconductor film 112 over the insulating film 110, a conductive film 114 over the oxide semiconductor film 112, and the insulating film 116 over the insulating film 104, the oxide semiconductor films 108, and the conductive film 114. Furthermore, the oxide semiconductor film 108 has the channel region 108i overlapping with the oxide semiconductor film 112 and in contact with the insulating film 110, the source region 108s in contact with the insulating film 116, and the drain region 108d in contact with the insulating film 116.

The transistor 150 may include the insulating film 118 over the insulating film 116, the conductive film 120a electrically connected to the source region 108s through the opening 141a provided in the insulating films 116 and 118, and the conductive film 120b electrically connected to the drain region 108d through the opening 141b provided in the insulating films 116 and 118.

Note that in the transistor 150, the oxide semiconductor film 112 and the conductive film 114 function as a gate electrode. In addition, the conductive film 114 has a function of changing the oxide semiconductor film 112 into an n-type semiconductor film, whereby the oxide semiconductor film 112 functions as part of the gate electrode.

The insulating film 116 contains one or both of nitrogen and hydrogen. From the insulating film 116 containing one or both of nitrogen and hydrogen, one or both of nitrogen and hydrogen can be supplied to the source region 108s and the drain region 108d.

The oxide semiconductor film 112 has a function of supplying oxygen to the insulating film 110. The oxide semiconductor film 112 having a function of supplying oxygen to the insulating film 110 enables the insulating film 110 to contain excess oxygen. When the insulating film 110 includes an excess oxygen region, excess oxygen can be supplied to the channel region 108i. Thus, a highly reliable semiconductor device can be obtained.

The carrier density of the oxide semiconductor film 112 having supplied oxygen to the insulating film 110 is increased. In addition, the contact of the oxide semiconductor film 112 with the conductive film 114 allows the diffusion of the component of the conductive film 114 to the oxide semiconductor film 112; accordingly, the carrier density of the oxide semiconductor film 112 might be increased. In other words, the oxide semiconductor film 112 also functions as an oxide conductor (OC). Thus, there is no need to increase the number of manufacturing steps and the oxide semiconductor film 112 can function as part of the gate electrode.

The conductive film 114 is formed using a method and a material similar to those of the conductive films 120a and 120b described above. It is particularly preferable to form the conductive film 114 by a sputtering method using titanium, copper, or tungsten. With the use of titanium, copper, or tungsten for the conductive film 114, the conductivity of the oxide semiconductor film 112 in contact with the conductive film 114 can be improved. Note that the conductive film 114 may have a stacked-layer structure. For example, a stacked-layer structure in which a copper film is provided over a copper film containing manganese or a stacked-layer structure in which an aluminum film is provided over a tungsten film may be employed.

1-3. STRUCTURE EXAMPLE 3 OF SEMICONDUCTOR DEVICE

A structure of a semiconductor device, which is different from that of the semiconductor device illustrated in FIGS. 1A to 1C, is described with reference to FIGS. 3A to 3C.

Figure 3A:
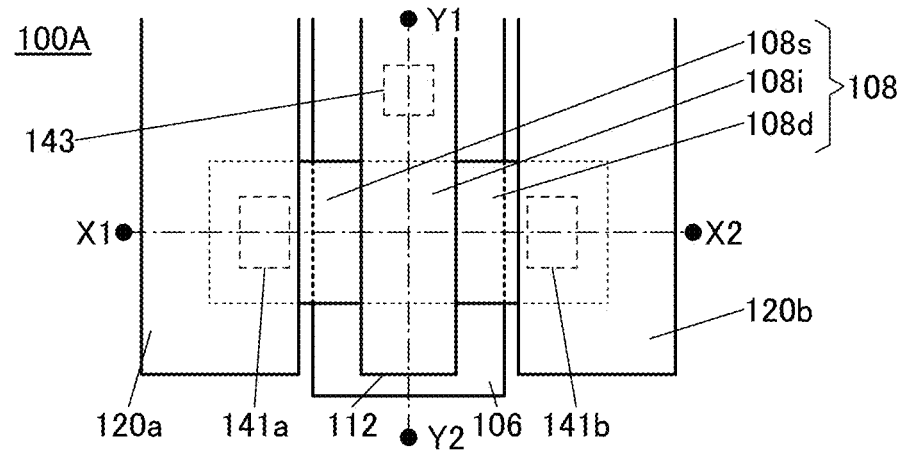
FIGS. 3A to 3C are a top view and cross-sectional views of a semiconductor device.

FIG. 3A is a top view of a transistor 100A. FIG. 3B is a cross-sectional view taken along the dashed-dotted line X1-X2 in FIG. 3A. FIG. 3C is a cross-sectional view taken along the dashed-dotted line Y1-Y2 in FIG. 3A.

Figure 3B:
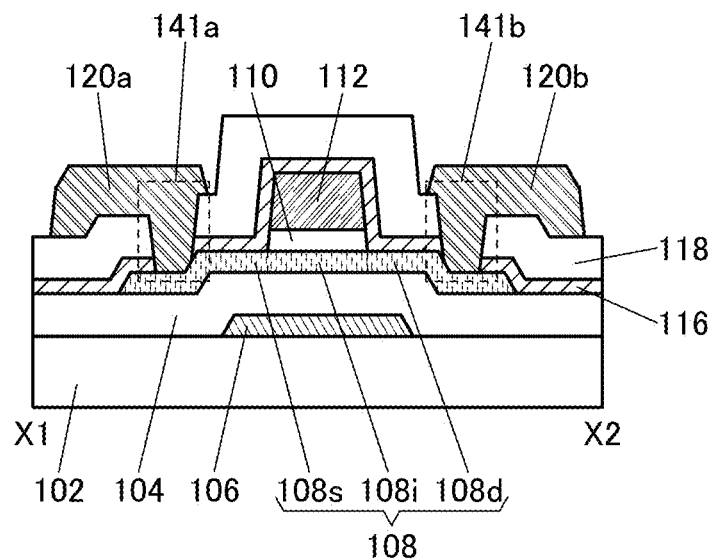
Figure 3C:
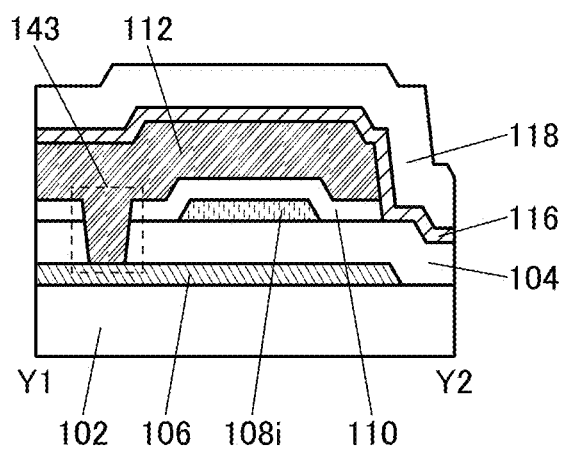

The transistor 100A illustrated in FIGS. 3A to 3C includes a conductive film 106 formed over the substrate 102, the insulating film 104 formed over the conductive film 106, the oxide semiconductor film 108 over the insulating film 104, the insulating film 110 over the oxide semiconductor film 108, the oxide semiconductor film 112 over the insulating film 110, and the insulating film 116 over the insulating film 104 and the oxide semiconductor films 108 and 112. Furthermore, the oxide semiconductor film 108 has the channel region 108i in contact with the insulating film 110, the source region 108s in contact with the insulating film 116, and the drain region 108d in contact with the insulating film 116.

The transistor 100A includes the conductive film 106 and an opening 143 in addition to the components of the transistor 100 described above.

Note that the opening 143 is provided in the insulating films 104 and 110. The conductive film 106 is electrically connected to the oxide semiconductor film 112 through the opening 143. Therefore, the same potential is applied to the conductive film 106 and the oxide semiconductor film 112. Note that the opening 143 is not necessarily provided, so that different potentials are supplied to the conductive film 106 and the oxide semiconductor film 112.

The conductive film 106 functions as a first gate electrode (also referred to as a bottom gate electrode), and the oxide semiconductor film 112 functions as a second gate electrode (also referred to as a top gate electrode). The insulating film 104 functions as a first gate insulating film, and the insulating film 110 functions as a second gate insulating film.

In this manner, the transistor 100A illustrated in FIGS. 3A to 3C is different from the transistor 100 described above and has a structure in which the conductive film and the oxide semiconductor film functioning as the gate electrodes are provided over and under the oxide semiconductor film 108. As in the transistor 100A, two or more gate electrodes may be provided in the semiconductor device of one embodiment of the present invention.

Furthermore, as illustrated in FIG. 3C, the oxide semiconductor film 108 faces the conductive film 106 functioning as the first gate electrode and the oxide semiconductor film 112 functioning as the second gate electrode, and is positioned between the conductive film and the oxide semiconductor film which function as gate electrodes.

The length in the channel width direction of the oxide semiconductor film 112 is longer than the length in the channel width direction of the oxide semiconductor film 108. In the channel width direction, the whole oxide semiconductor film 108 is covered with the oxide semiconductor film 112 with the insulating film 110 provided therebetween. Since the oxide semiconductor film 112 is connected to the conductive film 106 through the opening 143 provided in the insulating films 104 and 110, a side surface of the oxide semiconductor film 108 in the channel width direction faces the oxide semiconductor film 112.

In other words, in the channel width direction of the transistor 100A, the conductive film 106 and the oxide semiconductor film 112 are connected to each other through the opening 143 provided in the insulating films 104 and 110, and the conductive film 106 and the oxide semiconductor film 112 surround the oxide semiconductor film 108 with the insulating films 104 and 110 provided therebetween.

Such a structure enables electric fields of the conductive film 106 functioning as the first gate electrode and the oxide semiconductor film 112 functioning as the second gate electrode to electrically surround the oxide semiconductor film 108 included in the transistor 100A. A device structure of a transistor, like that of the transistor 100A, in which electric fields of the first gate electrode and the second gate electrode electrically surround the oxide semiconductor film 108 in which a channel region is formed can be referred to as a surrounded channel (s-channel) structure.

Since the transistor 100A has the s-channel structure, an electric field for inducing a channel can be effectively applied to the oxide semiconductor film 108 by the conductive film 106 or the oxide semiconductor film 112; therefore, the current drive capability of the transistor 100A can be improved and high on-state current characteristics can be obtained. Since the on-state current can be increased, it is possible to reduce the size of the transistor 100A. In addition, since the oxide semiconductor film 108 is surrounded by the conductive film 106 and the oxide semiconductor film 112, the mechanical strength of the oxide semiconductor film 108 can be increased.

Note that in the channel width direction of the transistor 100A, an opening which is different from the opening 143 may be formed on the side of the oxide semiconductor film 108 where the opening 143 is not formed.

When a transistor has a pair of gate electrodes between which a semiconductor film is interposed as in the case of the transistor 100A, a signal A may be applied to one gate electrode and a fixed potential Vb may be applied to the other gate electrode. Alternatively, the signal A may be applied to one gate electrode and a signal B may be applied to the other gate electrode. Further alternatively, a fixed potential Va may be applied to one gate electrode and a fixed potential Vb may be applied to the other gate electrode.

The signal A is, for example, a signal for controlling a conduction state and a non-conduction state. The signal A may be a digital signal having two kinds of potentials, a potential V1 and a potential V2 (where V1>V2). For example, the potential V1 can be a high power supply potential and the potential V2 can be a low power supply potential. The signal A may be an analog signal.

The fixed potential Vb is, for example, a potential for controlling threshold voltage VthA of the transistor. The fixed potential Vb may be the potential V1 or the potential V2. The fixed potential Vb may be a potential different from the potential V1 or the potential V2. In some cases, the threshold voltage VthA can be high by setting the fixed potential Vb low. As a result, drain current generated when gate-source voltage Vgs is 0 V can be reduced and leakage current in the circuit including the transistor can be reduced in some cases. For example, the fixed potential Vb may be set to be lower than the low power supply potential. On the other hand, in some cases, the threshold voltage VthA can be low by setting the fixed potential Vb high. As a result, drain current generated when the gate-source voltage Vgs is VDD can be increased and the operating speed of the circuit including the transistor can be improved in some cases. For example, the fixed potential Vb may be set to be higher than the low power supply potential.

The signal B is, for example, a signal for controlling a conduction state and a non-conduction state. The signal B may be a digital signal having two kinds of potentials, a potential V3 and a potential V4 (where V3>V4). For example, the potential V3 can be a high power supply potential and the potential V4 can be a low power supply potential. The signal B may be an analog signal.

When both the signal A and the signal B are digital signals, the signal B may be a signal having the same digital value as the signal A. In that case, the on-state current of the transistor and the operating speed of the circuit including the transistor can be sometimes increased. At that time, the potentials V1 and V2 of the signal A may be different from the potentials V3 and V4 of the signal B. For example, when the gate insulating film for the gate to which the signal B is input is thicker than the gate insulating film for the gate to which the signal A is input, the potential amplitude (V3−V4) of the signal B may be higher than that (V1−V2) of the signal A. In that case, sometimes the signal A and the signal B can equally affect a conduction state and a non-conduction state of the transistor.

When both the signal A and the signal B are digital signals, the signal B may be a signal having a digital value different from that of the signal A. In that case, sometimes the transistor can be controlled differently with the signal A and the signal B and thus, the transistor can have high functionality. For example, sometimes a NAND circuit, a NOR circuit, or the like can be formed using one transistor in the case where the transistor is an n-channel transistor and the transistor is brought into conduction only when the signal A has the potential V1 and the signal B has the potential V3 or the transistor is brought out of conduction only when the signal A has the potential V2 and the signal B has the potential V4. The signal B may be a signal for controlling the threshold voltage VthA. For example, the signal B may be a signal whose potential is different between a period when the circuit including the transistor operates and a period when the circuit does not operate. The signal B may be a signal whose potential is different between operation modes of the circuit. In that case, sometimes the potential of the signal B is not changed as often as the potential of the signal A.

When both the signal A and the signal B are analog signals, the signal B may be an analog signal having the same potential as the signal A; an analog signal whose potential is a constant times the potential of the signal A; an analog signal whose potential is the sum of the potential of the signal A and a constant potential; or an analog signal whose potential is the remainder of subtracting a constant potential from the potential of the signal A. In that case, the on-state current of the transistor and the operating speed of the circuit including the transistor can be sometimes increased. The signal B may be an analog signal that is different from the signal A. In that case, sometimes the transistor can be controlled differently with the signal A and the signal B and thus, the transistor can have high functionality.

The signal A may be a digital signal and the signal B may be an analog signal. Alternatively, the signal A may be an analog signal and the signal B may be a digital signal.

When fixed potentials are applied to the gate electrodes of the transistor, the transistor can function as an element equivalent to a resistor in some cases. For example, when the transistor is an n-channel transistor, the effective resistance of the transistor can be sometimes low (high) by making the fixed potential Va or the fixed potential Vb high (low). When both the fixed potential Va and the fixed potential Vb are high (low), the effective resistance can be lower (higher) than that of a transistor with only one gate in some cases.

Note that the other components of the transistor 100A are similar to those of the transistor 100 described above, and an effect similar to that of the transistor 100 can be obtained.

Figure 4A:
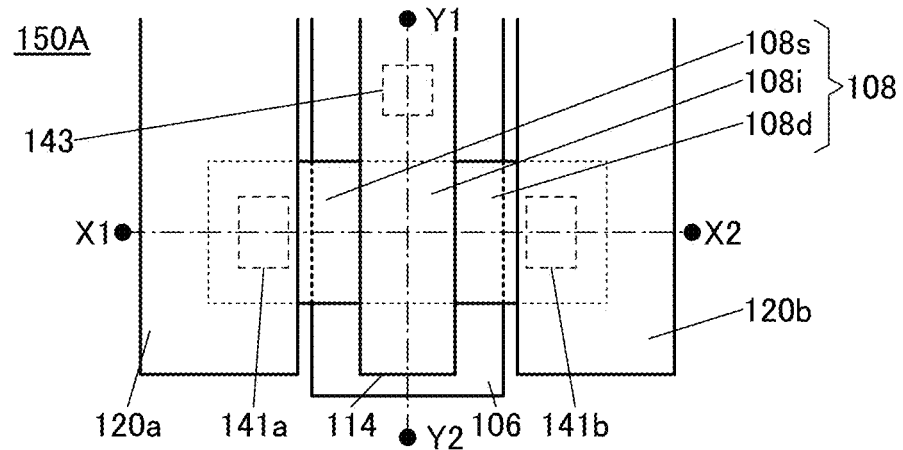
FIGS. 4A to 4C are a top view and cross-sectional views of a semiconductor device.
Figure 4B:
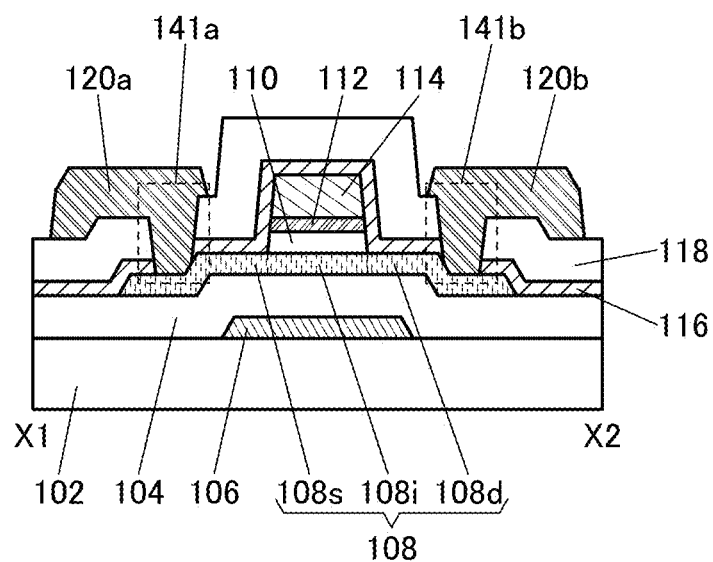
Figure 4C:
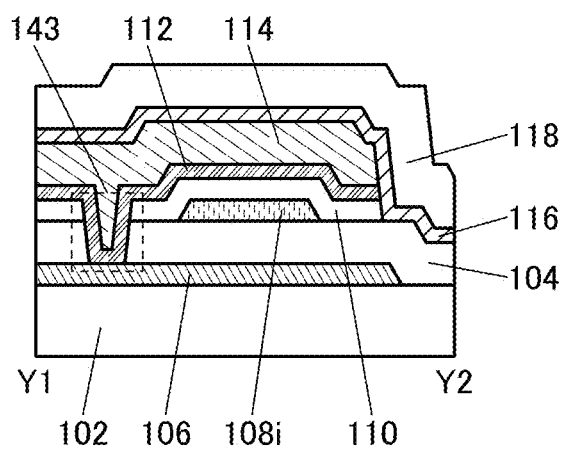

As in the transistor 100A, the conductive film 106 and the opening 143 may be provided in the transistor 150 described above. FIGS. 4A to 4C illustrate an example in this case. FIG. 4A is a top view of a transistor 150A. FIG. 4B is a cross-sectional view taken along the dashed-dotted line X1-X2 in FIG. 4A. FIG. 4C is a cross-sectional view taken along the dashed-dotted line Y1-Y2 in FIG. 4A.

In this manner, the structure of the transistor of one embodiment of the present invention can be combined with that of the above-described transistor as appropriate.

1-4. STRUCTURE EXAMPLE 4 OF SEMICONDUCTOR DEVICE

A structure of a semiconductor device, which is different from that of the semiconductor device illustrated in FIGS. 1A to 1C, is described with reference to FIGS. 5A to 5C.

Figure 5A:
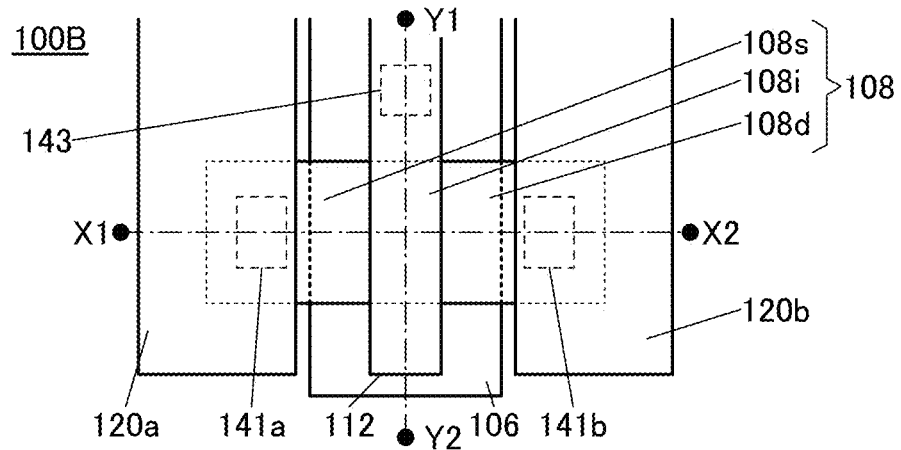
FIGS. 5A to 5C are a top view and cross-sectional views of a semiconductor device.

FIG. 5A is a top view of a transistor 100B. FIG. 5B is a cross-sectional view taken along the dashed-dotted line X1-X2 in FIG. 5A. FIG. 5C is a cross-sectional view taken along the dashed-dotted line Y1-Y2 in FIG. 5A.

Figure 5B:
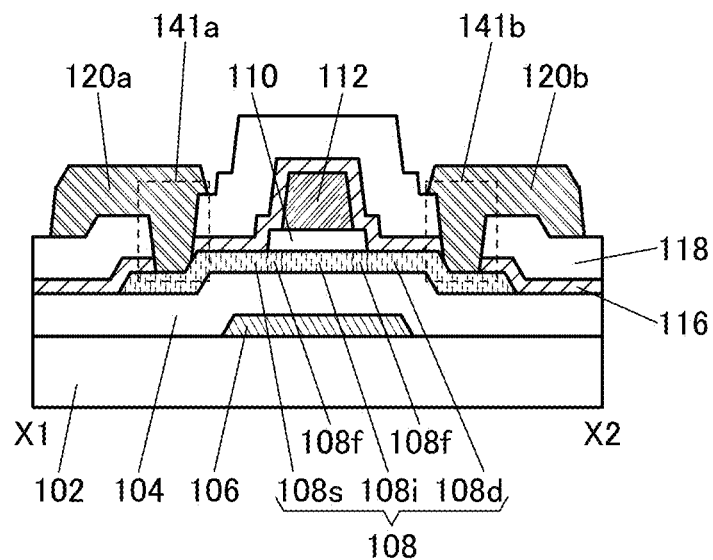
Figure 5C:
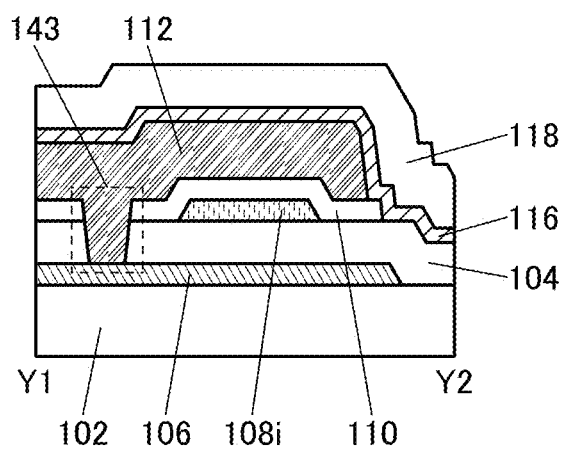

The transistor 100B in FIGS. 5A to 5C is different from the transistor 100A described above in the shape of the oxide semiconductor film 112. Specifically, lower end portions of the oxide semiconductor film 112 of the transistor 100B are positioned further inward than upper end portions of the insulating film 110. In other words, side end portions of the insulating film 110 are positioned further outward than side end portions of the oxide semiconductor film 112.

For example, the above structure can be obtained in the following manner: after being processed using the same mask, the oxide semiconductor film 112 and the insulating film 110 are processed by a wet etching method and a dry etching method, respectively.

When the oxide semiconductor film 112 has the above structure, regions 108f are formed in the oxide semiconductor film 108 in some cases. The regions 108f are formed between the channel region 108i and the source region 108s and between the channel region 108i and the drain region 108d.

The regions 108f function as high-resistance regions or low-resistance regions. The high-resistance regions have the same level of resistance as the channel region 108i and do not overlap with the oxide semiconductor film 112 functioning as a gate electrode. In the case where the regions 108f are high-resistance regions, the regions 108f function as offset regions. To suppress a decrease in the on-state current of the transistor 100B, the regions 108f functioning as offset regions may each have a length of 1 µm or less in the channel length (L) direction.

The low-resistance regions have a resistance that is lower than that of the channel region 108i and higher than that of the source region 108s and the drain region 108d. In the case where the regions 108f are low-resistance regions, the regions 108f function as lightly doped drain (LDD) regions. The regions 108f functioning as LDD regions can relieve an electric field in a drain region, thereby reducing a change in the threshold voltage of the transistor due to the electric field in the drain region.

The regions 108f serving as low-resistance regions are formed by the following method. For example, one or both of hydrogen and nitrogen are supplied from the insulating film 116 to the regions 108f. Alternatively, an impurity element is added from above the oxide semiconductor film 112 with the use of the insulating film 110 and the oxide semiconductor film 112 as masks, so that the impurity is added to the oxide semiconductor film 108 through the insulating film 110.

Figure 6A:
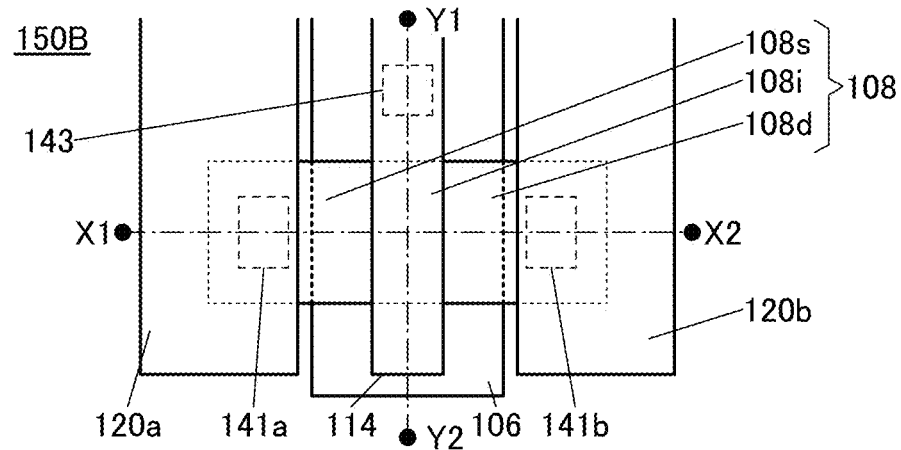
FIGS. 6A to 6C are a top view and cross-sectional views of a semiconductor device.
Figure 6B:
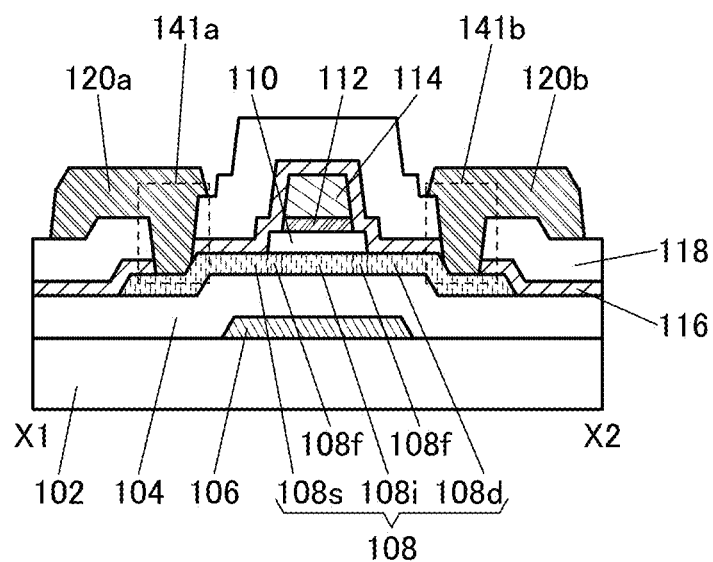
Figure 6C:
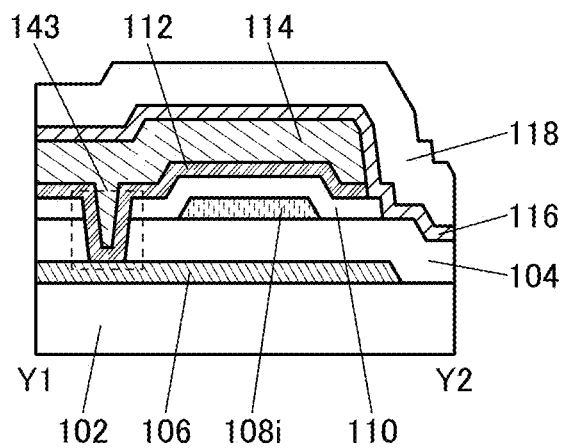

By changing the shape of the oxide semiconductor film 112 functioning as a second gate electrode, the transistor 150 described above can have a structure similar to that of the transistor 100B. FIGS. 6A and 6B illustrate an example in this case. FIG. 6A is a top view of a transistor 150B. FIG. 6B is a cross-sectional view taken along the dashed-dotted line X1-X2 in FIG. 6A. FIG. 6C is a cross-sectional view taken along the dashed-dotted line Y1-Y2 in FIG. 6A.

1-5. MODIFICATION EXAMPLE 1 OF SEMICONDUCTOR DEVICE

Next, a modification example of the semiconductor device in FIGS. 3A to 3C is described with reference to FIGS. 7A and 7B.

Figure 7A:
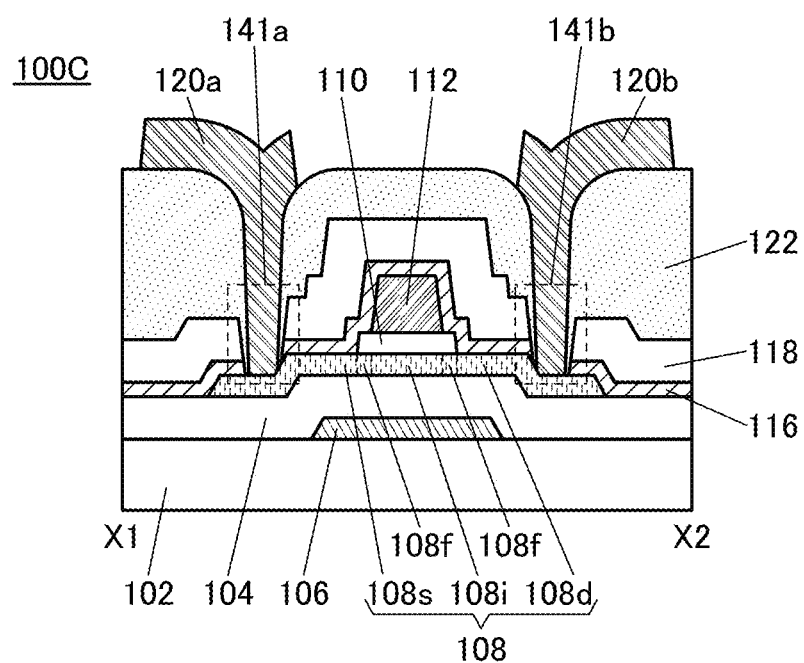
FIGS. 7A and 7B are cross-sectional views of a semiconductor device.
Figure 7B:
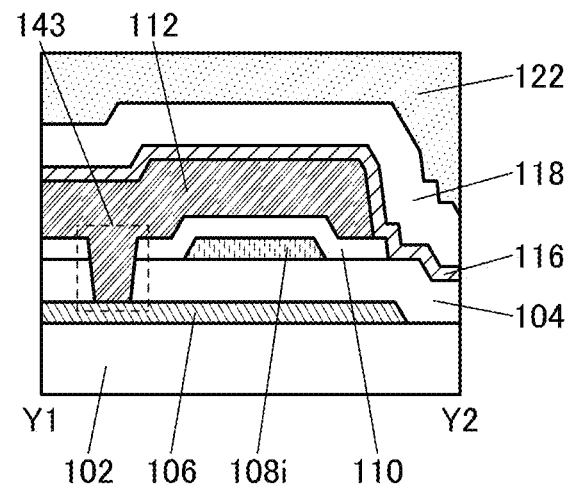

FIGS. 7A and 7B are cross-sectional views of a transistor 100C. A top view of the transistor 100C is similar to that of the transistor 100B in FIG. 5A and will be described with reference to FIG. 5A. FIG. 7A is a cross-sectional view taken along the dashed-dotted line X1-X2 in FIG. 5A, and FIG. 7B is a cross-sectional view taken along the dashed-dotted line Y1-Y2 in FIG. 5A.

The transistor 100C is different from the transistor 100B described above in that an insulating film 122 functioning as a planarization insulating film is provided. Note that the other components of the transistor 100C are similar to those of the transistor 100B described above, and an effect similar to that of the transistor 100B can be obtained.

The insulating film 122 has a function of planarizing unevenness and the like due to the transistor and the like. The insulating film 122 has an insulating property and is formed using an inorganic or organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

Note that the size of each opening in the insulating film 122 is not limited to that in FIGS. 7A and 7B, in which the openings are smaller than the openings 141a and 141b, and may be larger than or equal to the size of each of the openings 141a and 141b, for example.

In addition, the structure is not limited to the example in FIGS. 7A and 7B, in which the conductive films 120a and 120b are provided over the insulating film 122; for example, the insulating film 122 may be provided over the conductive films 120a and 120b formed over the insulating film 118.

1-6. MODIFICATION EXAMPLE 2 OF SEMICONDUCTOR DEVICE

Next, modification examples of the semiconductor device in FIGS. 1A to 1C are described with reference to FIGS. 8A and 8B and FIGS. 9A and 9B.

Figure 8A:
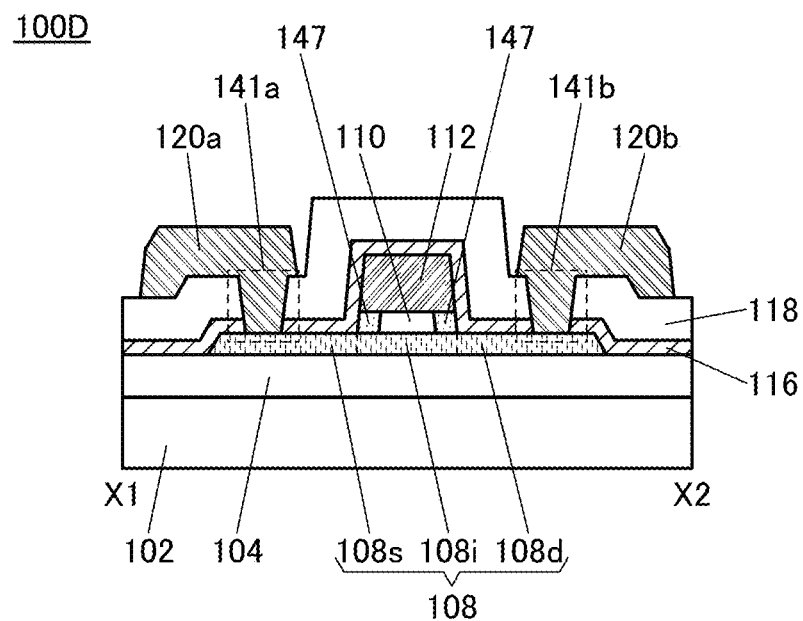
FIGS. 8A and 8B are cross-sectional views of a semiconductor device.
Figure 8B:
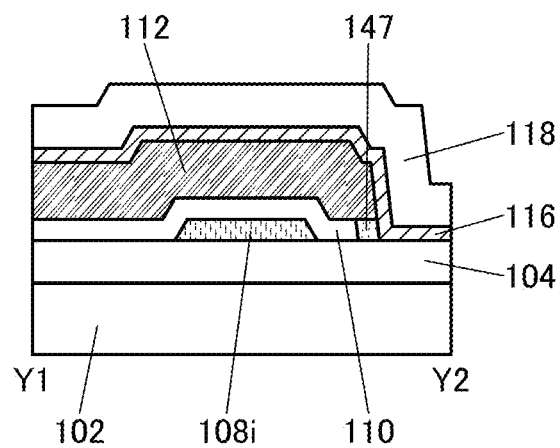

FIGS. 8A and 8B are cross-sectional views of a transistor 100D. A top view of the transistor 100D is similar to that of the transistor 100 in FIG. 1A and will be described with reference to FIG. 1A. FIG. 8A is a cross-sectional view taken along the dashed-dotted line X1-X2 in FIG. 1A, and FIG. 8B is a cross-sectional view taken along the dashed-dotted line Y1-Y2 in FIG. 1A.

The transistor 100D is different from the transistor 100 described above in the shape of the insulating film 110. Note that the other components of the transistor 100D are similar to those of the transistor 100 described above, and an effect similar to that of the transistor 100 can be obtained.

The insulating film 110 included in the transistor 100D is positioned further inward than the oxide semiconductor film 112. In other words, side surfaces of the insulating film 110 are positioned further inward than lower end portions of the oxide semiconductor film 112. For example, the structure in FIGS. 8A and 8B can be obtained by side etching of the insulating film 110 with an etchant or the like after processing of the oxide semiconductor film 112. When the insulating film 110 has the above structure, hollow regions 147 are formed under the oxide semiconductor film 112

The hollow regions 147 contain air and function as part of a gate insulating film. Note that the dielectric constant of the hollow regions 147 is substantially equal to that of the air, that is, approximately 1. Accordingly, in the case where a voltage is applied to the oxide semiconductor film 112 functioning as a gate electrode in the structure of the transistor 100D, the voltage applied to the oxide semiconductor film 108 under the hollow regions 147 is lower than the voltage applied to the oxide semiconductor film 108 (the channel region 108i) under the insulating film 110. Thus, the oxide semiconductor film 108 under the hollow regions 147 effectively functions as overlap regions (also referred to as Lov regions). The Lov regions in the oxide semiconductor film 108 can relieve electric field concentration at the source and drain edges. Note that the Lov regions overlap with the oxide semiconductor film 112 functioning as a gate electrode and have lower resistance than the channel region 108i.

Figure 9A:
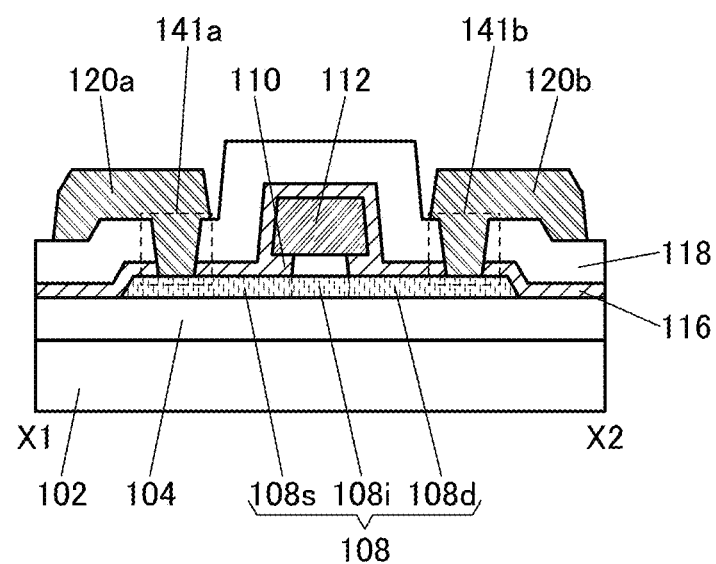
FIGS. 9A and 9B are cross-sectional views of a semiconductor device.
Figure 9B:
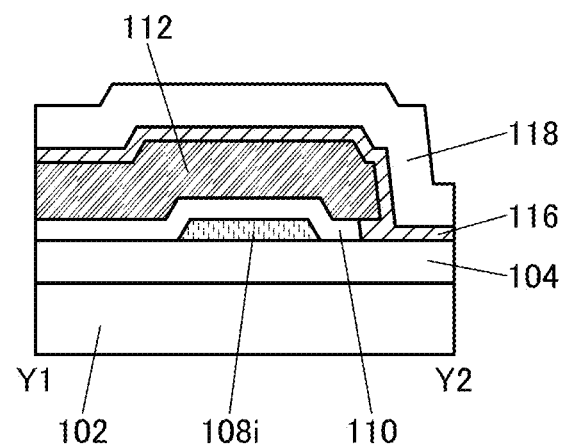

FIGS. 9A and 9B are cross-sectional views of a transistor 100E. A top view of the transistor 100E is similar to that of the transistor 100 in FIG. 1A and will be described with reference to FIG. 1A. FIG. 9A is a cross-sectional view taken along the dashed-dotted line X1-X2 in FIG. 1A, and FIG. 9B is a cross-sectional view taken along the dashed-dotted line Y1-Y2 in FIG. 1A.

The transistor 100E is different from the transistor 100 described above in the shapes of the insulating films 110 and 116. Note that the other components of the transistor 100E are similar to those of the transistor 100 described above, and an effect similar to that of the transistor 100 can be obtained.

The insulating film 110 included in the transistor 100E is positioned further inward than the oxide semiconductor film 112. In other words, side surfaces of the insulating film 110 are positioned further inward than lower end portions of the oxide semiconductor film 112. For example, the structure in FIGS. 9A and 9B can be obtained by side etching of the insulating film 110 with an etchant or the like after processing of the oxide semiconductor film 112. Furthermore, when the insulating film 116 is formed after the formation of the insulating film 110 having the above structure, the insulating film 116 is also formed under the oxide semiconductor film 112 and is in contact with the oxide semiconductor film 108 under the oxide semiconductor film 112.

In the above structure, inner end portions of the source region 108s and the drain region 108d are positioned further inward than the lower end portions of the oxide semiconductor film 112. Thus, the transistor 100E includes Lov regions.

In the transistor with the structure including the Lov regions like the transistors 100D and 100E, no high-resistance region is formed between the channel region 108i and the source region 108s or between the channel region 108i and the drain region 108d; accordingly, the on-state current of the transistor can be increased.

1-7. MODIFICATION EXAMPLE 3 OF SEMICONDUCTOR DEVICE

Next, modification examples of the semiconductor device in FIGS. 3A to 3C are described with reference to FIGS. 10A and 10B, FIGS. 11A and 11B, and FIGS. 12A and 12B.

Figure 10A:
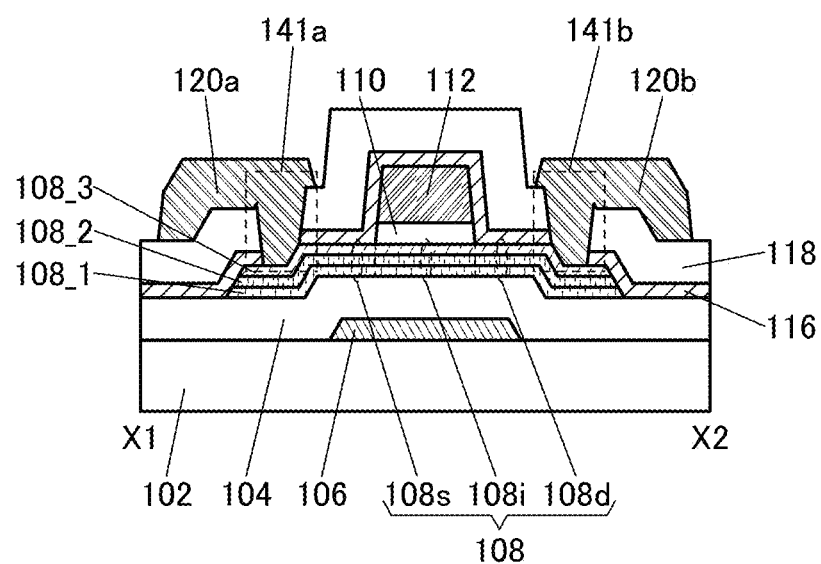
FIGS. 10A and 10B are cross-sectional views of a semiconductor device.
Figure 10B:
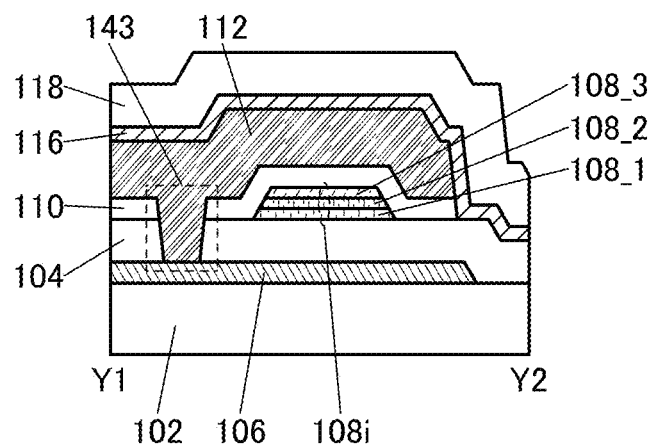

FIGS. 10A and 10B are cross-sectional views of a transistor 100F. A top view of the transistor 100F is similar to that of the transistor 100A in FIG. 3A and will be described with reference to FIG. 3A. FIG. 10A is a cross-sectional view taken along the dashed-dotted line X1-X2 in FIG. 3A, and FIG. 10B is a cross-sectional view taken along the dashed-dotted line Y1-Y2 in FIG. 3A.

The transistor 100F is different from the transistor 100B described above in the shape of the oxide semiconductor film 108. Note that the other components of the transistor 100F are similar to those of the transistor 100B described above, and an effect similar to that of the transistor 100B can be obtained.

The oxide semiconductor film 108 of the transistor 100F includes an oxide semiconductor film 108_1 over the insulating film 116, an oxide semiconductor film 108_2 over the oxide semiconductor film 108_1, and an oxide semiconductor film 1083 over the oxide semiconductor film 1082.

The channel region 108i, the source region 108s, and the drain region 108d each have a three-layer structure of the oxide semiconductor films 108_1, 108_2, and 108_3.

Figure 11A:
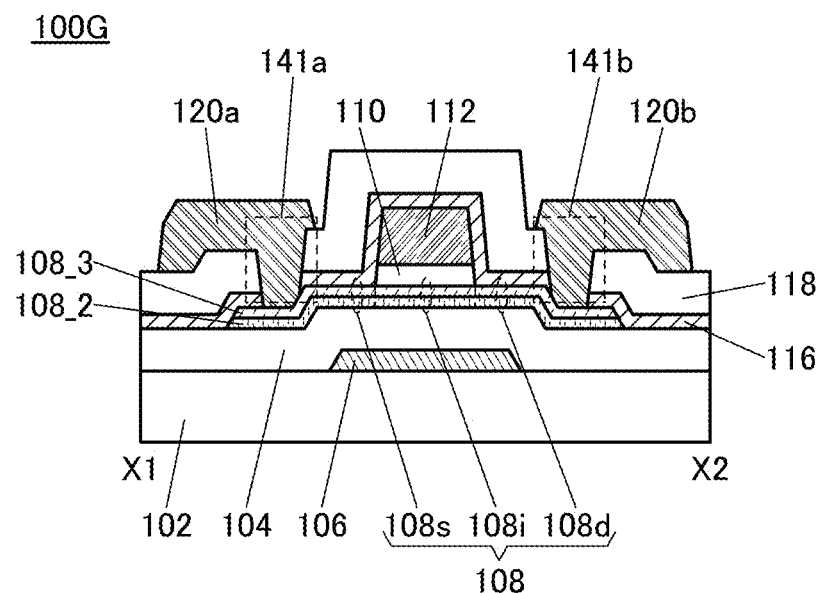
FIGS. 11A and 11B are cross-sectional views of a semiconductor device.
Figure 11B:
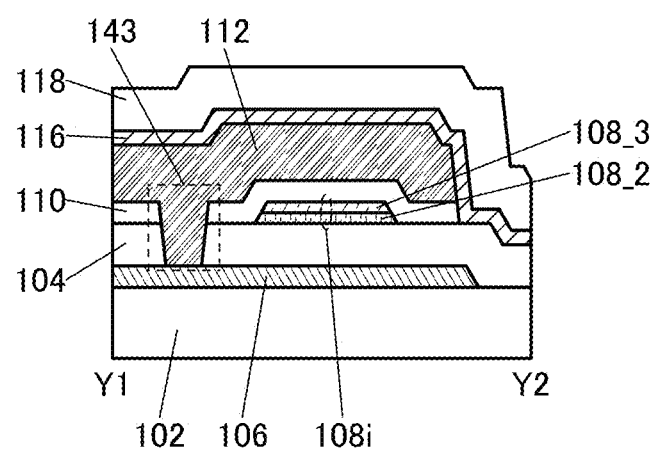

FIGS. 11A and 11B are cross-sectional views of a transistor 100G. A top view of the transistor 100G is similar to that of the transistor 100A in FIG. 3A and will be described with reference to FIG. 3A. FIG. 11A is a cross-sectional view taken along the dashed-dotted line X1-X2 in FIG. 3A, and FIG. 11B is a cross-sectional view taken along the dashed-dotted line Y1-Y2 in FIG. 3A.

The transistor 100G is different from the transistor 100A described above in the shape of the oxide semiconductor film 108. Note that the other components of the transistor 100G are similar to those of the transistor 100A described above, and an effect similar to that of the transistor 100A can be obtained.

The oxide semiconductor film 108 of the transistor 100G includes the oxide semiconductor film 108_2 over the insulating film 116 and the oxide semiconductor film 108_3 over the oxide semiconductor film 1082.

The channel region 108*i*, the source region 108*s*, and the drain region 108*d* each have a two-layer structure of the oxide semiconductor films 108_2 and 108_3.

1-8. BAND STRUCTURE

Here, a band structure of the insulating film 104, the oxide semiconductor films 108_1, 108_2, and 108_3, and the insulating film 110, and a band structure of the insulating film 104, the oxide semiconductor films 108_2 and 108_3, and the insulating film 110 are described with reference to FIGS. 12A and 12B.

Figure 12A:
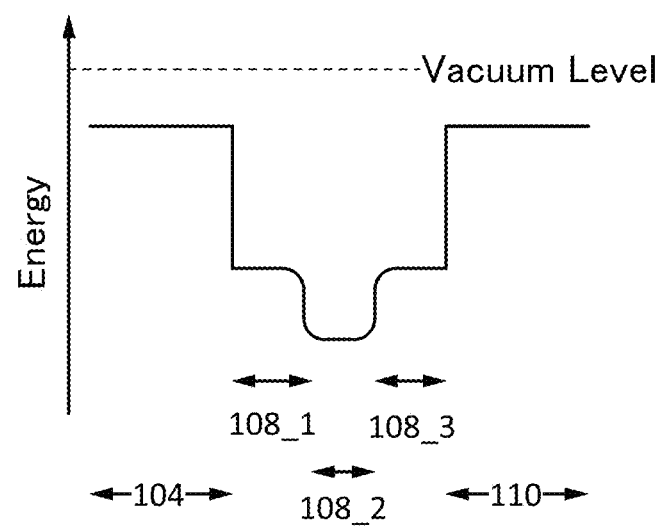
FIGS. 12A and 12B are diagrams each showing a band structure of a transistor.

FIG. 12A shows an example of a band structure in the thickness direction of a stack including the insulating film 104, the oxide semiconductor films 108_1, 108_2, and 108_3, and the insulating film 110. FIG. 12B shows an example of a band structure in the thickness direction of a stack including the insulating film 104, the oxide semiconductor films 108_2 and 108_3, and the insulating film 110. For easy understanding, the band structure shows energy level of the conduction band minimum (Ec) of each of the insulating film 104, the oxide semiconductor films 108_1, 108_2, and 108_3, and the insulating film 110.

In the band structure of FIG. 12A, a silicon oxide film is used as each of the insulating films 104 and 110, an oxide semiconductor film formed using a metal oxide target having an atomic ratio of metal elements of In:Ga:Zn=1:3:2 is used as the oxide semiconductor film 108_1, an oxide semiconductor film formed using a metal oxide target having an atomic ratio of metal elements of In:Ga:Zn=4:2:4.1 is used as the oxide semiconductor film 1082, and an oxide semiconductor film formed using a metal oxide target having an atomic ratio of metal elements of In:Ga:Zn=1:3:2 is used as the oxide semiconductor film 1083.

Figure 12B:
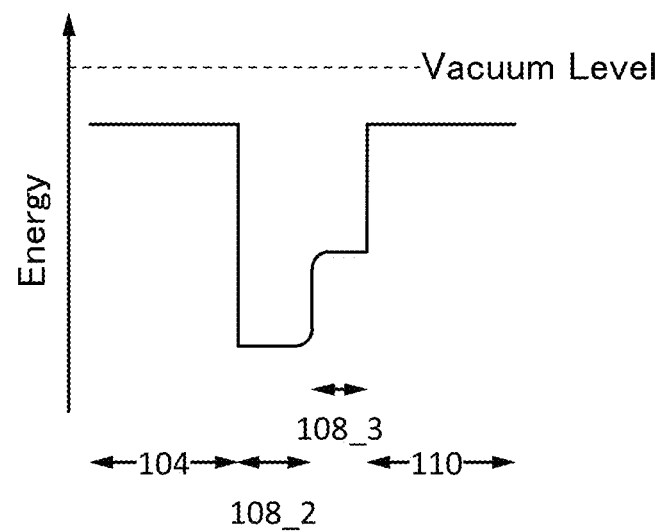

In the band structure of FIG. 12B, a silicon oxide film is used as each of the insulating films 104 and 110, the oxide semiconductor film formed using a metal oxide target having an atomic ratio of metal elements of In:Ga:Zn=4:2:4.1 is used as the oxide semiconductor film 108_2, and the oxide semiconductor film formed using a metal oxide target having an atomic ratio of metal elements of In:Ga:Zn=1:3:2 is used as the oxide semiconductor film 1083.

As illustrated in FIG. 12A, the energy level of the conduction band minimum gradually varies between the oxide semiconductor films 1081, 1082, and 1083. As illustrated in FIG. 12B, the energy level of the conduction band minimum gradually varies between the oxide semiconductor films 108_2 and 108_3. In other words, the energy level of the conduction band minimum is continuously varied or continuously connected. To obtain such a band structure, there exists no impurity, which forms a defect state such as a trap center or a recombination center, at the interface between the oxide semiconductor films 108_1 and 1082 and the interface between the oxide semiconductor films 1082 and 1083.

To form a continuous junction between the oxide semiconductor films 108_1, 108_2, and 108_3, it is necessary to form the films successively without exposure to the air by using a multi-chamber deposition apparatus (sputtering apparatus) provided with a load lock chamber.

In each band structure of FIGS. 12A and 12B, the oxide semiconductor film 1082 serves as a well, and a channel region of the transistor with the stacked-layer structure is formed in the oxide semiconductor film 1082.

By providing the oxide semiconductor films 108_1 and 108_3, the oxide semiconductor film 108_2 can be distanced away from trap states.

In addition, the trap states might be more distant from the vacuum level than the energy level of the conduction band minimum (Ec) of the oxide semiconductor film 108_2 functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the energy level of the trap states be closer to the vacuum level than the energy level of the conduction band minimum (Ec) of the oxide semiconductor film 108_2. Such a structure inhibits accumulation of electrons in the trap states. As a result, the on-state current and the field-effect mobility of the transistor can be increased.

The energy level of the conduction band minimum of each of the oxide semiconductor films 108_1 and 1083 is closer to the vacuum level than that of the oxide semiconductor film 108_2. Typically, a difference in energy level between the conduction band minimum of the oxide semiconductor film 1082 and the conduction band minimum of each of the oxide semiconductor films 108_1 and 1083 is 0.15 eV or more or 0.5 eV or more and 2 eV or less or 1 eV or less. That is, the difference between the electron affinity of each of the oxide semiconductor films 108_1 and 108_3 and the electron affinity of the oxide semiconductor film 1082 is 0.15 eV or more or 0.5 eV or more and 2 eV or less or 1 eV or less.

In such a structure, the oxide semiconductor film 108_2 serves as a main current path. In other words, the oxide semiconductor film 108 2 functions as a channel region, and the oxide semiconductor films 108_1 and 108_3 function as oxide insulating films. The oxide semiconductor films 108_1 and 108_3 are each preferably formed using an oxide semiconductor film containing one or more metal elements constituting the oxide semiconductor film 108_2 in which a channel region is formed. In such a structure, interface scattering hardly occurs at the interface between the oxide semiconductor films 108_1 and 1082 and the interface between the oxide semiconductor films 108_2 and 108_3. Thus, the transistor can have high field-effect mobility because the movement of carriers is not hindered at the interface.

To prevent each of the oxide semiconductor films 108_1 and 108_3 from functioning as part of a channel region, a material having sufficiently low conductivity is used for the oxide semiconductor films 108_1 and 1083. Thus, each of the oxide semiconductor films 108_1 and 108_3 can also be referred to as "oxide insulating film" owing to its physical property and/or function. Alternatively, a material which has a smaller electron affinity (a difference in energy level between the vacuum level and the conduction band minimum) than the oxide semiconductor film 108_2 and has a difference in energy level in the conduction band minimum from the oxide semiconductor film 108_2 (band offset) is used for the oxide semiconductor films 108_1 and 108_3. Furthermore, to inhibit generation of a difference between threshold voltages due to the value of the drain voltage, it is preferable to form the oxide semiconductor films 108_1 and 108_3 using a material whose energy level of the conduction band minimum is closer to the vacuum level than that of the oxide semiconductor film 108_2. For example, a difference between the energy level of the conduction band minimum of the oxide semiconductor film 108_2 and the energy level of the conduction band minimum of each of the oxide semiconductor films 108_1 and 108_3 is preferably 0.2 eV or more and further preferably 0.5 eV or more.

It is preferable that the oxide semiconductor films 108_1 and 108_3 not have a spinel crystal structure. This is because if the oxide semiconductor films 108_1 and 108_3 have a spinel crystal structure, constituent elements of the conductive films 120a and 120b might be diffused to the oxide semiconductor film 108_2 at the interface between the spinel crystal structure and another region. Note that each of the oxide semiconductor films 108_1 and 108_3 is preferably a CAAC-OS film, in which case a higher blocking property against constituent elements of the conductive films 120a and 120b, for example, copper elements can be obtained.

One embodiment of the present invention is not limited to the example described in this embodiment, in which an oxide semiconductor film formed using a metal oxide target having an atomic ratio of metal elements of In:Ga:Zn=1:3:2 is used as each of the oxide semiconductor films 108_1 and 108_3; for example, an oxide semiconductor film formed using a metal oxide target having an atomic ratio of In:Ga:Zn=1:1:1, In:Ga:Zn=1:1:1.2, In:Ga:Zn=1:3:4, or In:Ga:Zn=1:3:6 may be used as each of the oxide semiconductor films 108_1 and 108_3.

When the oxide semiconductor films 108_1 and 108_3 are formed using a metal oxide target having an atomic ratio of In:Ga:Zn=1:1:1, the oxide semiconductor films 108_1 and 108_3 have an atomic ratio of In:Ga:Zn=1:$\beta$1 (0<$\beta$1≤2):$\beta$2 (0<$\beta$2≤2) in some cases. When the oxide semiconductor films 108_1 and 108_3 are formed using a metal oxide target having an atomic ratio of In:Ga:Zn=1:3:4, the oxide semiconductor films 108_1 and 108_3 have an atomic ratio of In:Ga:Zn=1:$\beta$3 (1≤$\beta$3≤5):$\beta$4 (2≤$\beta$4≤6) in some cases. When the oxide semiconductor films 108_1 and 108_3 are formed using a metal oxide target having an atomic ratio of In:Ga:Zn=1:3:6, the oxide semiconductor films 108_1 and 108_3 have an atomic ratio of In:Ga:Zn=1:$\beta$5 (1≤$\beta$5≤5):$\beta$6 (4≤$\beta$6≤8) in some cases.

1-9. METHOD 1 FOR MANUFACTURING SEMICONDUCTOR DEVICE

Next, an example of a method for manufacturing the transistor 100 illustrated in FIGS. 1A to 1C is described with reference to FIGS. 13A to 13D, FIGS. 14A to 14D, and FIGS. 15A to 15C. Note that FIGS. 13A to 13D, FIGS. 14A to 14D, and FIGS. 15A to 15C are cross-sectional views in the channel length (L) direction and the channel width direction (W) illustrating a method for manufacturing the transistor 100.

First, the insulating film 104 is formed over the substrate 102, and then an oxide semiconductor film is formed over the insulating film 104. Then, the oxide semiconductor film is processed into an island shape, whereby an oxide semiconductor film 107 is formed (see FIG. 13A).

The insulating film 104 can be formed by a sputtering method, a CVD method, an evaporation method, a pulsed laser deposition (PLD) method, a printing method, a coating method, or the like as appropriate. In this embodiment, as the insulating film 104, a 400-nm-thick silicon nitride film and a 50-nm-thick silicon oxynitride film are formed with a PECVD apparatus.

After the insulating film 104 is formed, oxygen may be added to the insulating film 104. Examples of oxygen added to the insulating film 104 include an oxygen radical, an oxygen atom, an oxygen atomic ion, and an oxygen molecular ion. As a method for adding the oxygen, an ion doping method, an ion implantation method, plasma treatment, or the like can be given. Alternatively, after a film that suppresses release of oxygen is formed over the insulating film, oxygen may be added to the insulating film 104 through the film.

The film that suppresses release of oxygen can be formed using any of the following conductive materials: a metal element selected from indium, zinc, gallium, tin, aluminum, chromium, tantalum, titanium, molybdenum, nickel, iron, cobalt, and tungsten; an alloy containing the above-described metal element as a component; an alloy containing any of the above-described metal elements in combination; a metal nitride containing the above-described metal element; a metal oxide containing the above-described metal element; a metal nitride oxide containing the above-described metal element; and the like.

In the case where oxygen is added by plasma treatment, by making oxygen excited by a microwave to generate high-density oxygen plasma, the amount of oxygen added to the insulating film 104 can be increased.

The oxide semiconductor film 107 can be formed by a sputtering method, a coating method, a pulsed laser deposition method, a laser ablation method, a thermal CVD method, or the like. Note that processing into the oxide semiconductor film 107 can be performed in the following manner: a mask is formed over the oxide semiconductor film by a lithography process, and then, the oxide semiconductor film is partly etched using the mask. Alternatively, the island-shaped oxide semiconductor film 107 may be directly formed by a printing method.

As a power supply device for generating plasma in the case of forming the oxide semiconductor film by a sputtering method, an RF power supply device, an AC power supply device, a DC power supply device, or the like can be used as appropriate. In the case where the oxide semiconductor film is formed by a sputtering method, as a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased.

For example, in the case where the oxide semiconductor film is formed by a sputtering method, the substrate temperature is preferably higher than or equal to 150° C. and lower than or equal to 750° C., higher than or equal to 150° C. and lower than or equal to 450° C., or higher than or equal to 200° C. and lower than or equal to 350° C., which enables crystallinity to be improved.

Note that in this embodiment, the oxide semiconductor film 107 is formed as follows. A 40-nm-thick oxide semiconductor film is deposited with a sputtering apparatus with the use of an In—Ga—Zn metal oxide (In:Ga:Zn=1:1:1.2 [atomic ratio]) as a sputtering target.

After the oxide semiconductor film 107 is formed, heat treatment may be performed so that the oxide semiconductor film 107 is subjected to dehydrogenation or dehydration. The heat treatment is performed typically at a temperature higher than or equal to 150° C. and lower than the strain point of the substrate, higher than or equal to 250° C. and lower than or equal to 450° C., or higher than or equal to 300° C. and lower than or equal to 450° C.

The heat treatment can be performed under an inert gas atmosphere containing nitrogen or a rare gas such as helium, neon, argon, xenon, or krypton. Furthermore, the heat treatment may be performed under an inert gas atmosphere first, and then under an oxygen atmosphere. It is preferable that the above inert gas atmosphere and the above oxygen atmosphere do not contain hydrogen, water, or the like. The treatment time can be from 3 minutes to 24 hours.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

By forming the oxide semiconductor film while it is heated or performing heat treatment after the formation of the oxide semiconductor film, the hydrogen concentration in the oxide semiconductor film, which is measured by secondary ion mass spectrometry, can be $5\times10^{19}$ atoms/cm$^3$ or lower, $1\times10^{19}$ atoms/cm$^3$ or lower, $5\times10^{18}$ atoms/cm$^3$ or lower, $1\times10^{18}$ atoms/cm$^3$ or lower, $5\times10^{17}$ atoms/cm$^3$ or lower, or $1\times10^{16}$ atoms/cm$^3$ or lower.

Figure 13A:
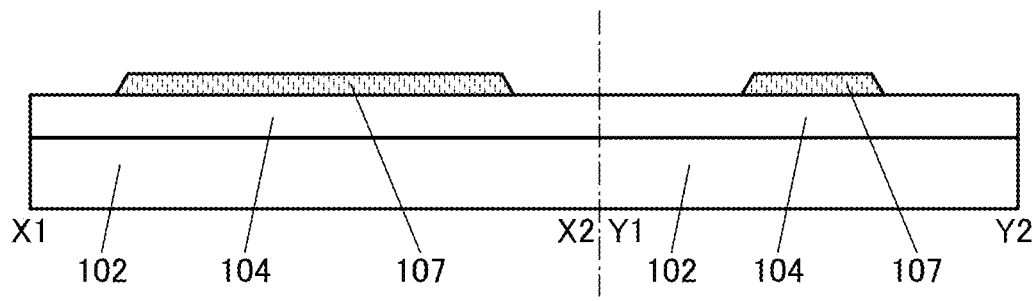
FIGS. 13A to 13D are cross-sectional views illustrating a method for manufacturing a semiconductor device.
Figure 13B:
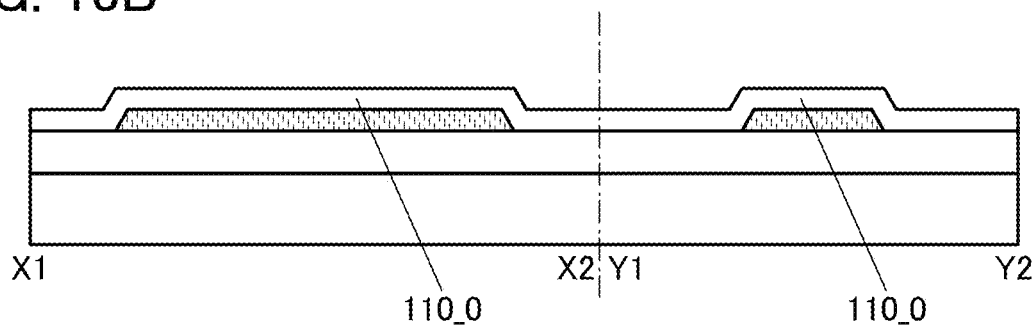

Next, an insulating film 110_0 is formed over the insulating film 104 and the oxide semiconductor film 107 (see FIG. 13B).

As the insulating film 110_0, a silicon oxide film or a silicon oxynitride film can be formed by a PECVD method. In this case, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples.

The silicon oxynitride film having a small amount of defects can be formed as the insulating film 110_0 by a PECVD method under the conditions where the flow rate of an oxidizing gas to that of a deposition gas is higher than 20 times and lower than 100 times or higher than or equal to 40 times and lower than or equal to 80 times and the pressure in a treatment chamber is lower than 100 Pa or lower than or equal to 50 Pa.

As the insulating film 110_0, a silicon oxide film or a silicon oxynitride film which is dense can be formed under the following conditions: the substrate placed in a treatment chamber of a PECVD apparatus that is vacuum-evacuated is held at a temperature of higher than or equal to 280° C. and lower than or equal to 400° C., the pressure is greater than or equal to 20 Pa and less than or equal to 250 Pa, preferably greater than or equal to 100 Pa and less than or equal to 250 Pa, with introduction of a source gas into the treatment chamber, and a high-frequency power is supplied to an electrode provided in the treatment chamber.

The insulating film 110_0 may also be formed by a PECVD method using a microwave. A microwave refers to a wave in the frequency range of 300 MHz to 300 GHz. In a microwave, electron temperature and electron energy are low. Furthermore, in the power supplied in a PECVD apparatus using a microwave, the proportion of power used for plasma generation, that is, power used for ionization of molecules is high, whereas the proportion of power used for electron acceleration is low. Thus, plasma with high density (high-density plasma) can be generated. This method causes little plasma damage to the deposition surface or a deposit, so that the insulating film 110_0 having few defects can be formed.

Alternatively, the insulating film 110_0 can be formed by a CVD method using an organosilane gas. As the organosilane gas, any of the following silicon-containing compounds can be used: tetraethyl orthosilicate (TEOS) (chemical formula: Si(OC$_2$H$_5$)$_4$); tetramethylsilane (TMS) (chemical formula: Si(CH$_3$)$_4$); tetramethylcyclotetrasiloxane (TMCTS); octamethylcyclotetrasiloxane (OMCTS); hexamethyldisilazane (HMDS); triethoxysilane (SiH(OC$_2$H$_5$)$_3$); trisdimethylaminosilane (SiH(N(CH$_3$)$_2$)$_3$); and the like. By a CVD method using the organosilane gas, the insulating film 110_0 having high coverage can be formed.

In this embodiment, a 100-nm-thick silicon oxynitride film is formed with a PECVD apparatus as the insulating film 110_0.

Next, an oxide semiconductor film 112_0 is formed over the insulating film 110_0. In the formation of the oxide semiconductor film 112_0, oxygen is added from the oxide semiconductor film 112_0 to the insulating film 110_0 (see FIG. 13C).

The oxide semiconductor film 112_0 is preferably formed by a sputtering method in an atmosphere containing an oxygen gas. Since the atmosphere in which the oxide semiconductor film 112_0 is formed contains an oxygen gas, oxygen can be favorably added to the insulating film 110 0.

Figure 13C:
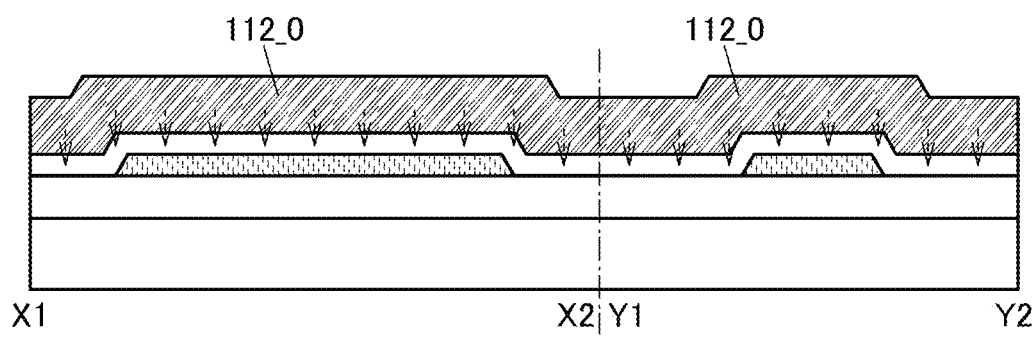

In FIG. 13C, oxygen added to the insulating film 110_0 is schematically shown by arrows. For the oxide semiconductor film 1120, a material similar to that of the oxide semiconductor film 107 described above can be used.

In this embodiment, the oxide semiconductor film 1120 is formed as follows. A 100-nm-thick oxide semiconductor film is deposited with a sputtering apparatus with the use of an In—Ga—Zn metal oxide (In:Ga:Zn=4:2:4.1 [atomic ratio]) as a sputtering target.

Figure 13D:
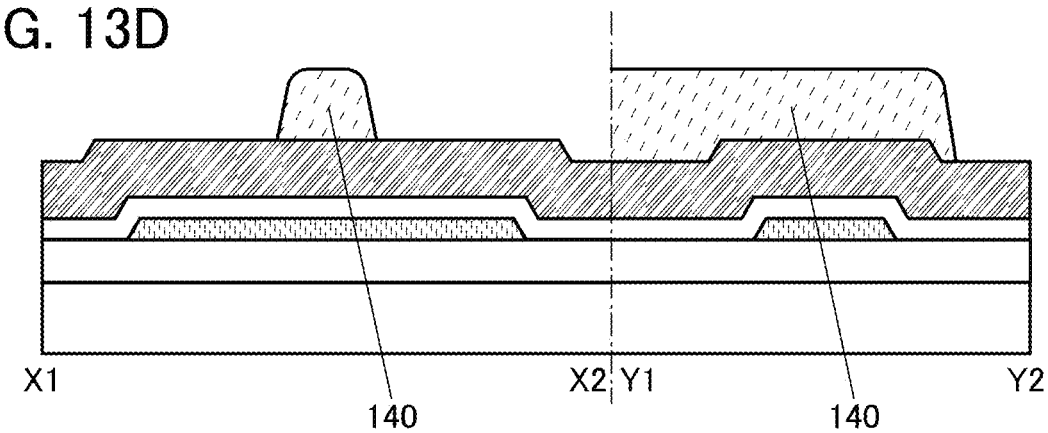

Next, a mask 140 is formed in a desired position over the oxide semiconductor film 112_0 by a lithography process (see FIG. 13D).

Figure 14A:
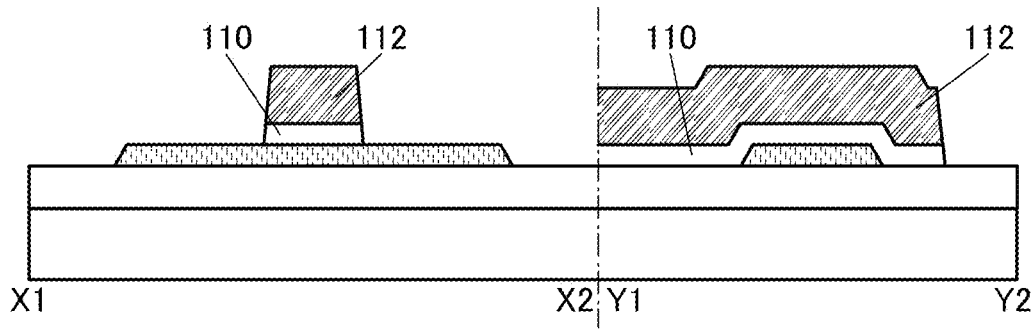
FIGS. 14A to 14D are cross-sectional views illustrating a method for manufacturing a semiconductor device.

Next, the oxide semiconductor film 112_0 and the insulating film 110_0 are processed by etching from above the mask 140, and then, the mask 140 is removed, so that the island-shaped oxide semiconductor film 112 and the island-shaped insulating film 110 are formed (see FIG. 14A).

In this embodiment, the oxide semiconductor film 112_0 and the insulating film 110_0 are processed by a dry etching method.

In the processing into the oxide semiconductor film 112 and the insulating film 110, the thickness of the oxide semiconductor film 107 in a region not overlapping with the oxide semiconductor film 112 is decreased in some cases. In other cases, in the processing into the oxide semiconductor film 112 and the insulating film 110, the thickness of the insulating film 104 in a region not overlapping with the oxide semiconductor film 107 is decreased.

Figure 14B:
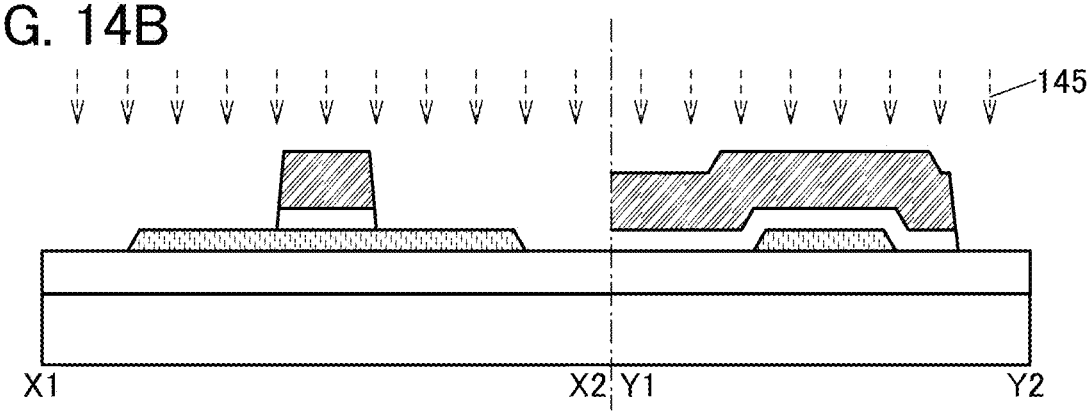
Figure 14C:
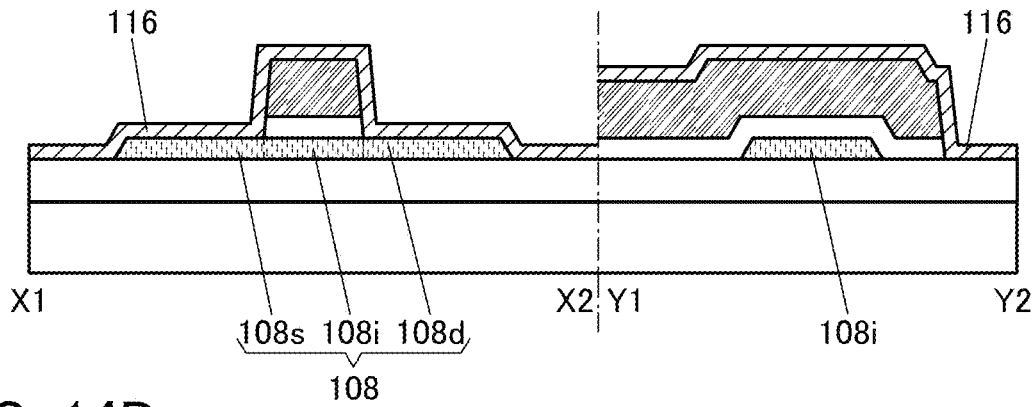

Next, an impurity element 145 is added from above the insulating film 104 and the oxide semiconductor films 107 and 112 (see FIG. 14B).

As a method for adding the impurity element 145, an ion doping method, an ion implantation method, plasma treatment, or the like can be given. In the case of plasma treatment, plasma is generated in a gas atmosphere containing an impurity element to be added and plasma treatment is performed, whereby the impurity element can be added. A dry etching apparatus, an ashing apparatus, a PECVD apparatus, a high-density PECVD apparatus, or the like can be used to generate the plasma.

Note that as a source gas of the impurity element 145, one or more of $B_2H_6$, $PH_3$, $CH_4$, $N_2$, $NH_3$, $AlH_3$, $AlCl_3$, $SiH_4$, $Si_2H_6$, $F_2$, HF, $H_2$, and a rare gas (e.g., argon) can be used. Alternatively, one or more of $B_2H_6$, $PH_3$, $N_2$, $NH_3$, $AlH_3$, $AlCl_3$, $F_2$, HF, and $H_2$ which are diluted with a rare gas can be used. One or more of $B_2H_6$, $PH_3$, $N_2$, $NH_3$, $AlH_3$, $AlCl_3$, $F_2$, HF, and $H_2$ which are diluted with a rare gas is used to add the impurity element 145 to the oxide semiconductor films 107 and 112, whereby one or more of the rare gas, hydrogen, boron, carbon, nitrogen, fluorine, phosphorus, sulfur, and chlorine can be added to the oxide semiconductor films 107 and 112.

Alternatively, after being added to the oxide semiconductor films 107 and 112 with the use of a rare gas as a source gas, the impurity element 145 may be added thereto with the use of one or more of $B_2H_6$, $PH_3$, $CH_4$, $N_2$, $NH_3$, $AlH_3$, $AlCl_3$, $SiH_4$, $Si_2H_6$, $F_2$, HF, and $H_2$ as a source gas.

Alternatively, after being added to the oxide semiconductor films 107 and 112 with the use of one or more of $B_2H_6$, $PH_3$, $CH_4$, $N_2$, $NH_3$, $AlH_3$, $AlCl_3$, $SiH_4$, $Si_2H_6$, $F_2$, HF, and $H_2$ as a source gas, the impurity element 145 may be added thereto with the use of a rare gas as a source gas.

The addition of the impurity element 145 is controlled by appropriately setting the implantation conditions such as the acceleration voltage and the dose. For example, in the case where argon is added by an ion implantation method, the acceleration voltage may be set to be higher than or equal to 10 kV and lower than or equal to 100 kV and the dose may be set to be greater than or equal to $1\times10^{13}$ ions/cm$^2$ and less than or equal to $1\times10^{16}$ ions/cm$^2$, for example, $1\times10^{14}$ ions/cm$^2$. In the case where a phosphorus ion is added by an ion implantation method, the acceleration voltage is set to 30 kV and the dose is set to be greater than or equal to $1\times10^{13}$ ions/cm$^2$ and less than or equal to $5\times10^{16}$ ions/cm$^2$, for example, $1\times10^{15}$ ions/cm$^2$.

One embodiment of the present invention is not limited to the example described in this embodiment, in which the impurity element 145 is added after the mask 140 is removed; for example, the impurity element 145 may be added with the mask 140 left.

In this embodiment, argon is added to the oxide semiconductor films 107 and 112 as the impurity element 145 with a doping apparatus. Note that one embodiment of the present invention is not limited to the example described in this embodiment, in which the impurity element 145 is added; for example, the step of adding the impurity element 145 is not necessarily performed.

Next, the insulating film 116 is formed over the insulating film 104 and the oxide semiconductor films 107 and 112. Note that the oxide semiconductor film 107 is in contact with the insulating film 116 by formation of the insulating film 116 and serves as the source region 108s and the drain region 108d. The oxide semiconductor film 107 which is not in contact with the insulating film 116, i.e., the oxide semiconductor film 107 in contact with the insulating film 110 serves as the channel region 108i. Accordingly, the oxide semiconductor film 108 including the channel region 108i, the source region 108s, and the drain region 108d is formed (see FIG. 14C).

The insulating film 116 can be formed using a material selected from the above-described materials. In this embodiment, a 100-nm-thick silicon nitride film is formed with a PECVD apparatus as the insulating film 116.

With the silicon nitride film used as the insulating film 116, hydrogen in the silicon nitride film enters the oxide semiconductor film 112, the source region 108s, and the drain region 108d in contact with the insulating film 116; consequently, the carrier densities in the oxide semiconductor film 112, the source region 108s, and the drain region 108d can be increased.

Figure 14D:
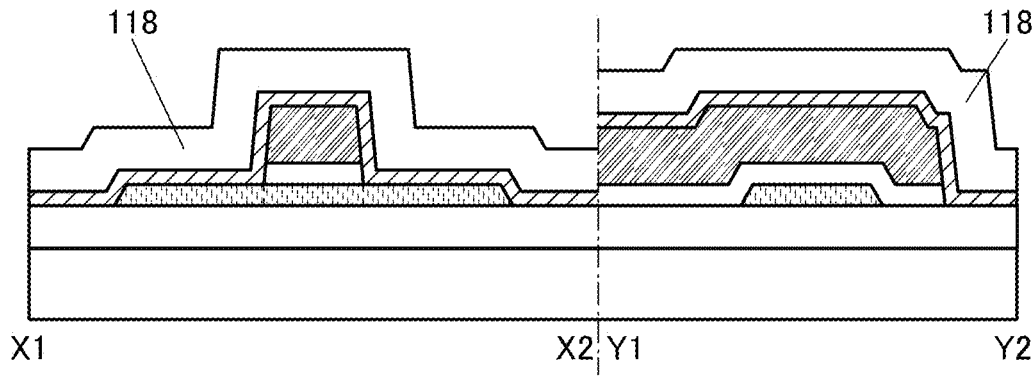

Next, the insulating film 118 is formed over the insulating film 116 (see FIG. 14D).

The insulating film 118 can be formed using a material selected from the above-described materials. In this embodiment, a 300-nm-thick silicon oxynitride film is formed with a PECVD apparatus as the insulating film 118.

Figure 15A:
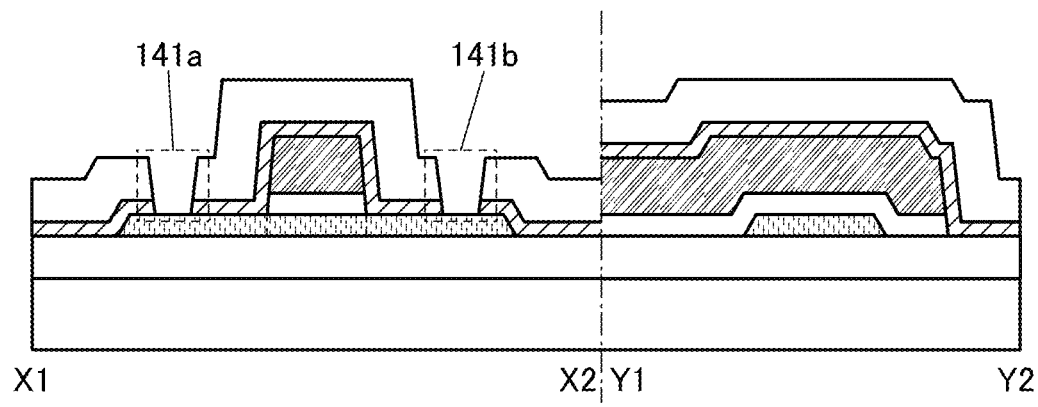
FIGS. 15A to 15C are cross-sectional views illustrating a method for manufacturing a semiconductor device.

Next, a mask is formed in a desired position over the insulating film 118 by a lithography process, and then the insulating films 118 and 116 are partly etched, whereby the opening 141a and the opening 141b that reach the source region 108s and the drain region 108d, respectively, are formed (see FIG. 15A).

As a method for etching the insulating films 118 and 116, a wet etching method and/or a dry etching method can be used as appropriate. In this embodiment, processing into the insulating films 118 and 116 is performed by a dry etching method.

Figure 15B:
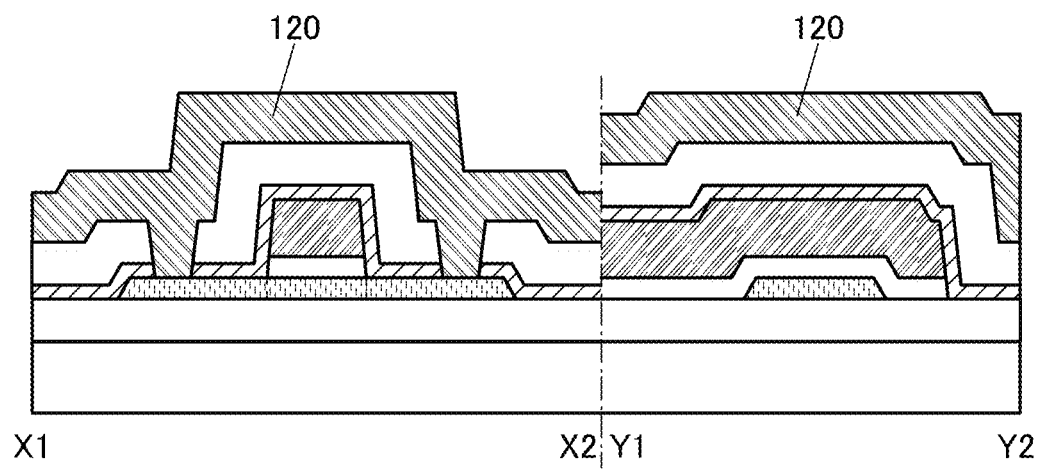

Then, a conductive film 120 is formed over the insulating film 118 to cover the openings 141a and 141b (see FIG. 15B).

The conductive film 120 can be formed using the material that can be used for the conductive films 120a and 120b. In this embodiment, a stacked-layer film including a 50-nm-thick titanium film, a 400-nm-thick aluminum film, and a 100-nm-thick titanium film is formed with a sputtering apparatus as the conductive film 120.

Figure 15C:
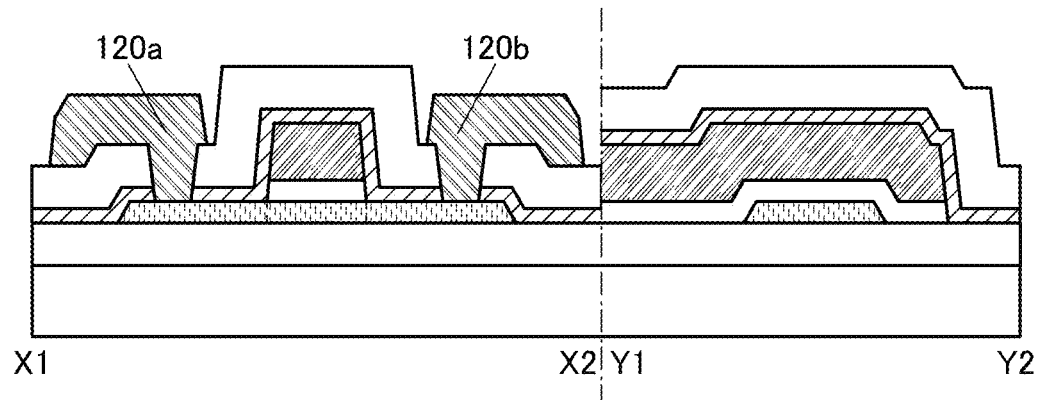

Next, a mask is formed in a desired position over the conductive film 120 by a lithography process, and then the conductive film 120 is partly etched, whereby the conductive films 120a and 120b are formed (see FIG. 15C).

As a method for processing the conductive film 120, a wet etching method and/or a dry etching method can be used as appropriate. In this embodiment, the conductive film 120 is processed by a dry etching method to form the conductive films 120a and 120b.

Through the above-described steps, the transistor 100 illustrated in FIGS. 1A to 1C can be manufactured.

Note that the films included in the transistor 100 (i.e., the insulating film, the oxide semiconductor film, the conductive film, and the like) can be formed by any of a sputtering method, a chemical vapor deposition (CVD) method, a vacuum evaporation method, a pulsed laser deposition (PLD) method, and an atomic layer deposition (ALD) method. Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method may be used, for example.

Deposition by the thermal CVD method is performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by an ALD method is performed in the following manner: a source gas for reaction is introduced into a chamber in which the pressure is set to an atmospheric pressure or a reduced pressure, and a reaction is caused; then, this sequence is repeated. An inert gas (e.g., argon or nitrogen) may be introduced as a carrier gas with the source gases. For example, two or more kinds of source gases may be sequentially supplied to the chamber. In this case, an inert gas is introduced between reaction of a first source gas and introduction of a second source gas to prevent the source gases from being mixed. Alternatively, the first source gas may be exhausted by vacuum evacuation instead of the introduction of the inert gas, and then the second source gas may be introduced. The first source gas is adsorbed on the surface of the substrate and a reaction is caused to form a first layer, and then, the second source gas is introduced and adsorbed and a reaction is caused to form a second layer over the first layer; in this manner, a thin film is formed. The sequence of the gas introduction is repeated plural times until a desired thickness is obtained, whereby a thin film with excellent step coverage can be formed. The thickness of the thin film can be precisely adjusted by the number of times the gas introduction is repeated; therefore, an ALD method is suitable for manufacturing a minute FET.

The films such as the conductive films, the insulating films, and the oxide semiconductor films which are described above can be formed by a thermal CVD method such as an MOCVD method. For example, in the case where an In—Ga—Zn—O film is formed, trimethylindium (In(CH$_3$)$_3$), trimethylgallium (Ga(CH$_3$)$_3$), and dimethylzinc (Zn(CH$_3$)$_2$) are used. Without limitation to the above combination, triethylgallium (Ga(C$_2$H$_5$)$_3$) can be used instead of trimethylgallium, and diethylzinc (Zn(C$_2$H$_5$)$_2$) can be used instead of dimethylzinc.

For example, in the case where a hafnium oxide film is formed by a deposition apparatus using an ALD method, two kinds of gases, i.e., ozone (O$_3$) as an oxidizer and a source gas which is obtained by vaporizing liquid containing a solvent and a hafnium precursor (e.g., a hafnium alkoxide or a hafnium amide such as tetrakis(dimethylamide)hafnium (TDMAH, Hf[N(CH$_3$)$_2$]$_4$) and tetrakis(ethylmethylamide) hafnium) are used.

For example, in the case where an aluminum oxide film is formed by a deposition apparatus using an ALD method, two kinds of gases, i.e., H$_2$O as an oxidizer and a source gas which is obtained by vaporizing liquid containing a solvent and an aluminum precursor (e.g., trimethylaluminum (TMA, Al(CH$_3$)$_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, and radicals of an oxidizing gas (e.g., 0$_2$ or dinitrogen monoxide) are supplied to react with the adsorbate.

For example, in the case where a tungsten film is formed with a deposition apparatus using an ALD method, a WF$_6$ gas and a B$_2$H$_6$ gas are sequentially introduced to form an initial tungsten film, and then a tungsten film is formed using a WF$_6$ gas and an H$_2$ gas. Note that an SiH$_4$ gas may be used instead of a B$_2$H$_6$ gas.

For example, in the case where an oxide semiconductor film, for example, an In—Ga—Zn—O film is formed with a deposition apparatus using an ALD method, an In(CH$_3$)$_3$ gas and an O$_3$ gas are used to form an In—O layer, a Ga—O layer is formed using a Ga(CH$_3$)$_3$ gas and an O$_3$ gas, and then a Zn—O layer is formed using a Zn(CH$_3$)$_2$ gas and an O$_3$ gas. Note that the order of these layers is not limited to this example. A mixed compound layer such as an In—Ga—O layer, an In—Zn—O layer, or a Ga—Zn—O layer may be formed by using these gases. Note that although an H$_2$O gas which is obtained by bubbling water with an inert gas such as Ar may be used instead of an O$_3$ gas, it is preferable to use an O$_3$ gas, which does not contain H.

1-10. METHOD 2 FOR MANUFACTURING SEMICONDUCTOR DEVICE

Next, an example of a method for manufacturing the transistor 100C illustrated in FIGS. 7A and 7B is described with reference to FIGS. 16A to 16D, FIGS. 17A to 17D, FIGS. 18A to 18D, and FIGS. 19A and 19B. Note that FIGS. 16A to 16D, FIGS. 17A to 17D, FIGS. 18A to 18D, and FIGS. 19A and 19B are cross-sectional views in the channel length (L) direction and the channel width direction (W) illustrating a method for manufacturing the transistor 100C.

First, the conductive film 106 is formed over the substrate 102. Then, the insulating film 104 is formed over the substrate 102 and the conductive film 106, and then an oxide semiconductor film is formed over the insulating film 104. After that, the oxide semiconductor film is processed into an island shape, whereby the oxide semiconductor film 107 is formed (see FIG. 16A).

The conductive film 106 can be formed using a material and a method which are similar to those of the oxide semiconductor film 112 or the conductive films 120a and 120b. In this embodiment, a 100-nm-thick tungsten film is formed by a sputtering method as the conductive film 106.

Figure 16A:
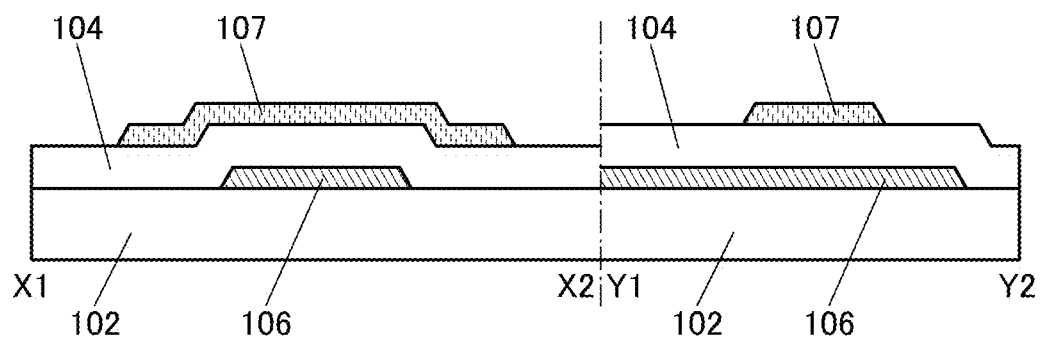
FIGS. 16A to 16D are cross-sectional views illustrating a method for manufacturing a semiconductor device.
Figure 16B:
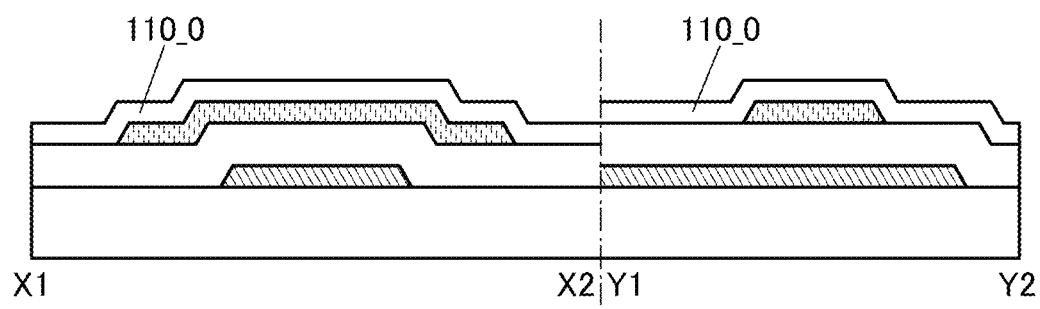

Next, the insulating film 110_0 is formed over the insulating film 104 and the oxide semiconductor film 107 (see FIG. 16B).

Figure 16C:
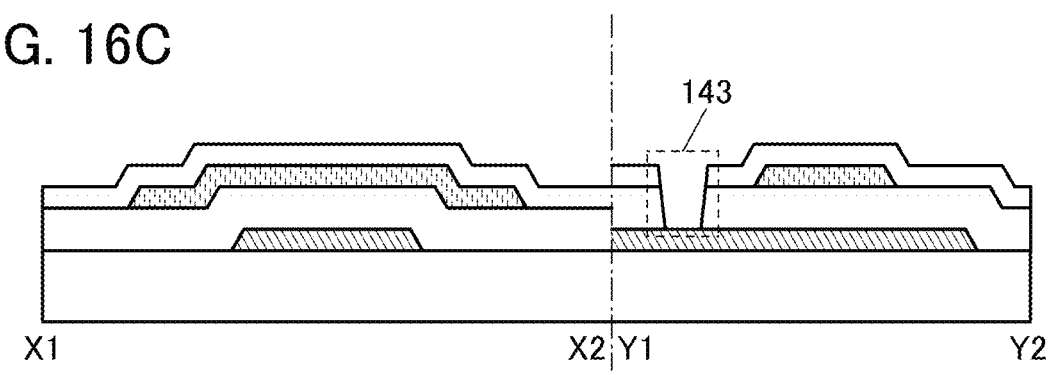

Next, a mask is formed in a desired position over the insulating film 110_0 by a lithography process, and then the insulating films 110_0 and 104 are partly etched, whereby the opening 143 that reaches the conductive film 106 is formed (see FIG. 16C).

As a method for forming the opening 143, a wet etching method and/or a dry etching method can be used as appropriate. In this embodiment, the opening 143 is formed by a dry etching method.

Next, the oxide semiconductor film 112_0 is formed over the insulating film 110_0 to cover the opening 143. In the formation of the oxide semiconductor film 112_0, oxygen in the oxide semiconductor film 112_0 is added to the insulating film 110_0 (see FIG. 16D).

Figure 16D:
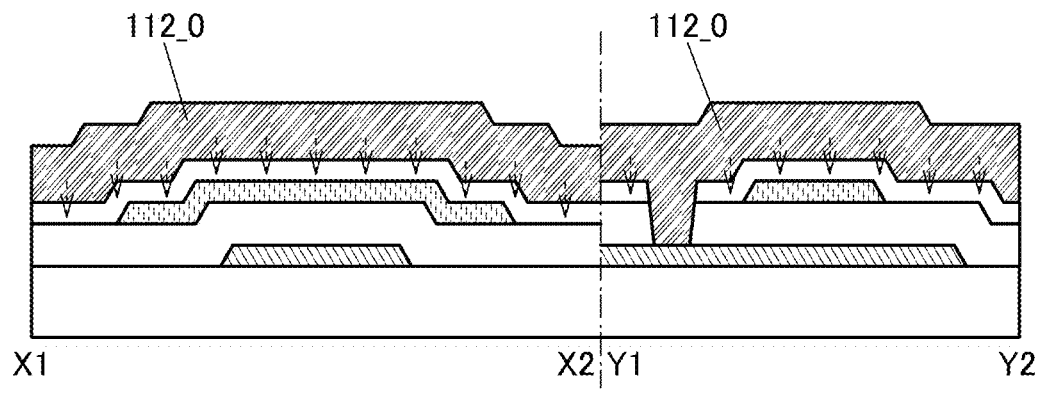

In FIG. 16D, oxygen added to the insulating film 110_0 is schematically shown by arrows. Furthermore, the oxide semiconductor film 112_0 formed to cover the opening 143 is electrically connected to the conductive film 106.

Figure 17A:
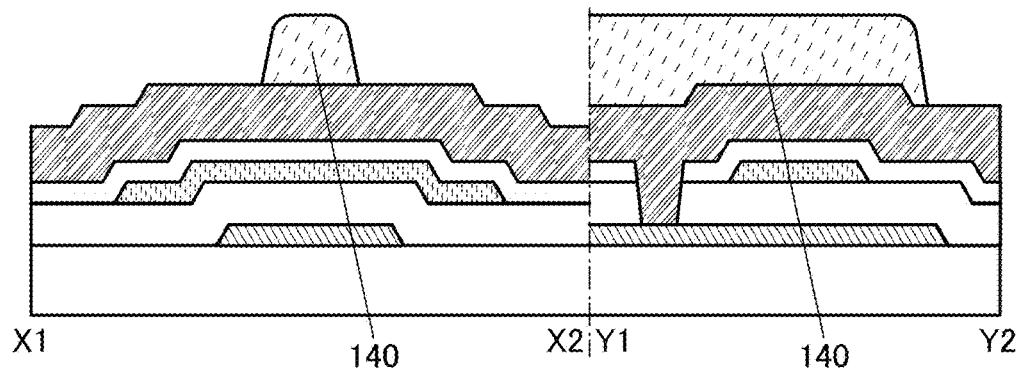
FIGS. 17A to 17D are cross-sectional views illustrating a method for manufacturing a semiconductor device.

Next, the mask 140 is formed in a desired position over the oxide semiconductor film 112_0 by a lithography process (see FIG. 17A).

Figure 17B:
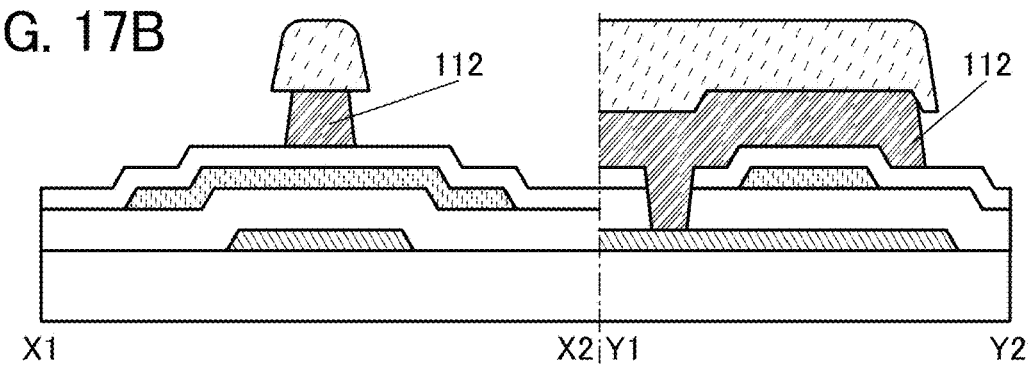

Then, the oxide semiconductor film 112_0 is processed into the island-shaped oxide semiconductor film 112 by etching from above the mask 140 (see FIG. 17B).

In this embodiment, the oxide semiconductor film 112_0 is processed by a wet etching method.

Figure 17C:
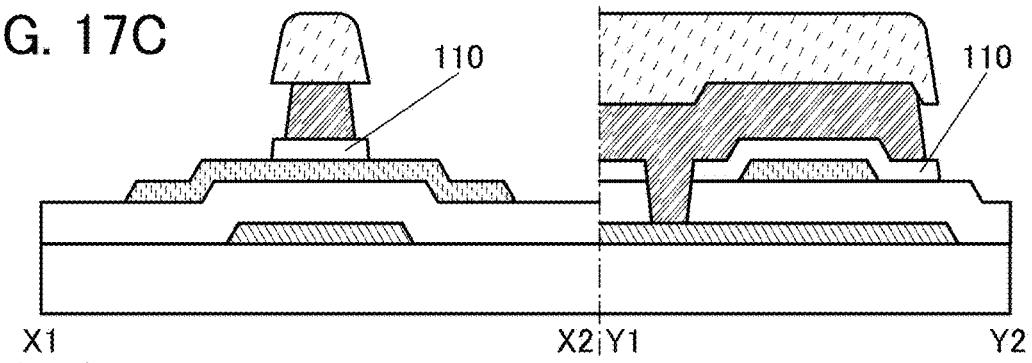

In succession to the above step, the insulating film 110_0 is processed into the island-shaped insulating film 110 by etching from above the mask 140 (see FIG. 17C).

In this embodiment, the insulating film 110_0 is processed by a dry etching method.

Figure 17D:
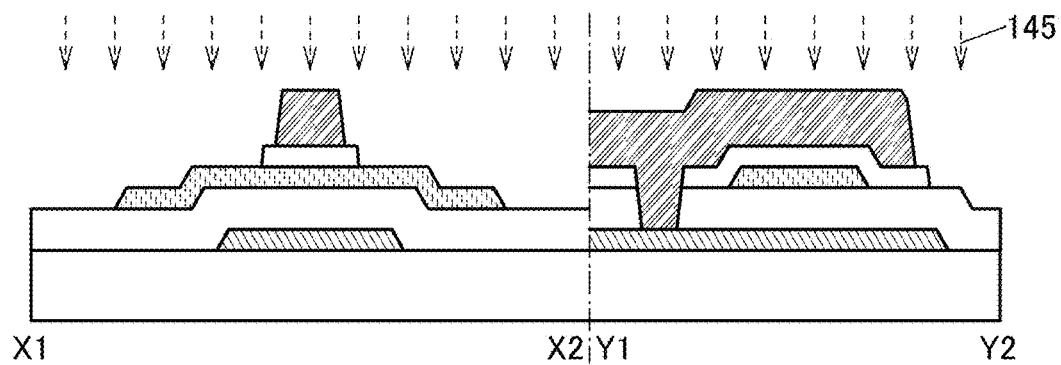

Next, the impurity element 145 is added from above the insulating film 104 and the oxide semiconductor films 107 and 112 after the mask 140 is removed (see FIG. 17D).

In the addition of the impurity element 145, a large number of impurities are added to the regions in which the surface of the oxide semiconductor film 107 is exposed (regions to be the source region 108s and the drain region 108d). In contrast, since the impurity element 145 is added to regions of the oxide semiconductor film 107 which do not overlap with the oxide semiconductor film 112 but overlap with the insulating film 110 (regions to be the regions 108b through the insulating film 110, the amount of the added impurity element 145 is smaller than that in the source region 108s and the drain region 108d.

In this embodiment, argon is added to the oxide semiconductor films 107 and 112 as the impurity element 145 with a doping apparatus.

Note that one embodiment of the present invention is not limited to the example described in this embodiment, in which argon is added as the impurity element 145; for example, the step of adding the impurity element 145 is not necessarily performed. In the case where the step of adding the impurity element 145 is not performed, the regions 108f have the same level of impurity concentration as the channel region 108i.

Next, the insulating film 116 is formed over the insulating film 104, the oxide semiconductor film 107, the insulating film 110, and the oxide semiconductor film 112. Note that the oxide semiconductor film 107 is in contact with the insulating film 116 by formation of the insulating film 116 and serves as the source region 108s and the drain region 108d. The oxide semiconductor film 107 which is not in contact with the insulating film 116, i.e., the oxide semiconductor film 107 in contact with the insulating film 110 serves as the channel region 108i.

Figure 18A:
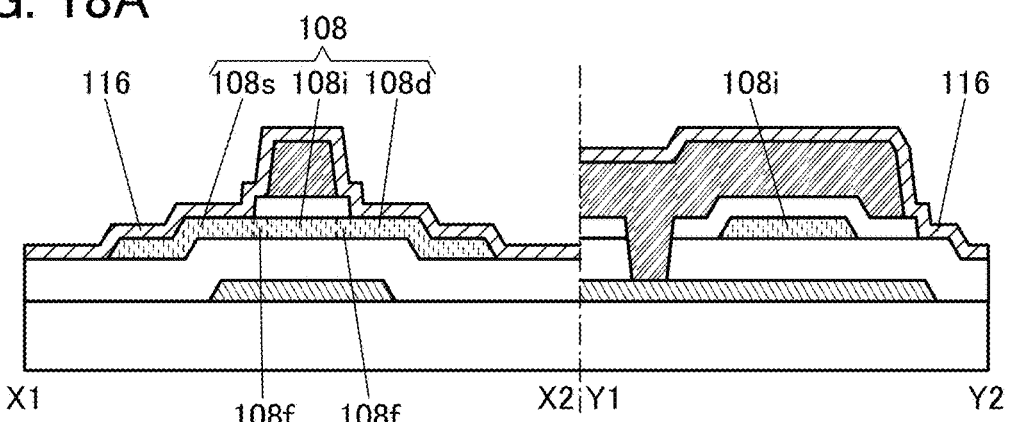
FIGS. 18A to 18D are cross-sectional views illustrating a method for manufacturing a semiconductor device.

Accordingly, the oxide semiconductor film 108 including the channel region 108i, the source region 108s, and the drain region 108d is formed (see FIG. 18A).

The regions 108f are formed between the channel region 108i and the source region 108s and between the channel region 108i and the drain region 108d.

Figure 18B:
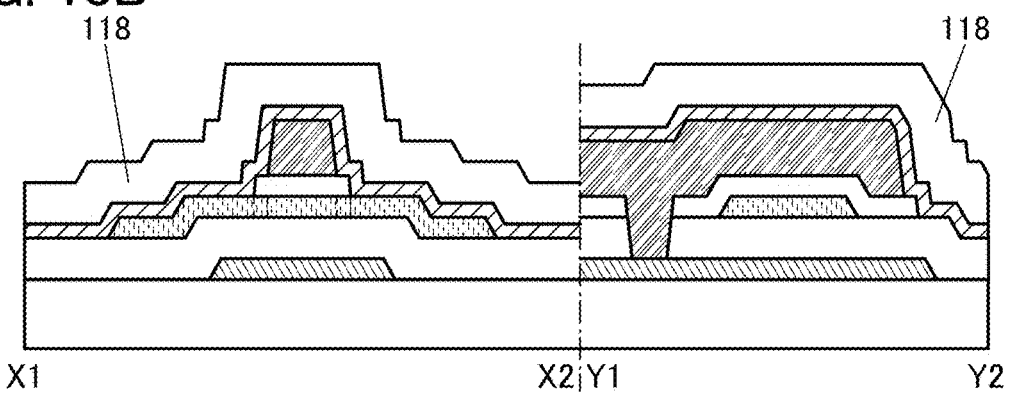

Next, the insulating film 118 is formed over the insulating film 116 (see FIG. 18B).

Figure 18C:
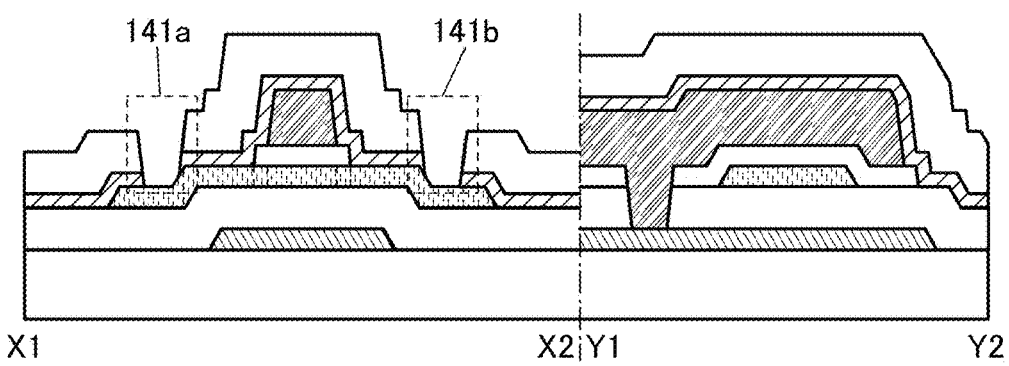

Next, a mask is formed in a desired position over the insulating film 118 by a lithography process, and then the insulating films 118 and 116 are partly etched, whereby the opening 141a and the opening 141b that reach the source region 108s and the drain region 108d, respectively, are formed (see FIG. 18C).

Figure 18D:
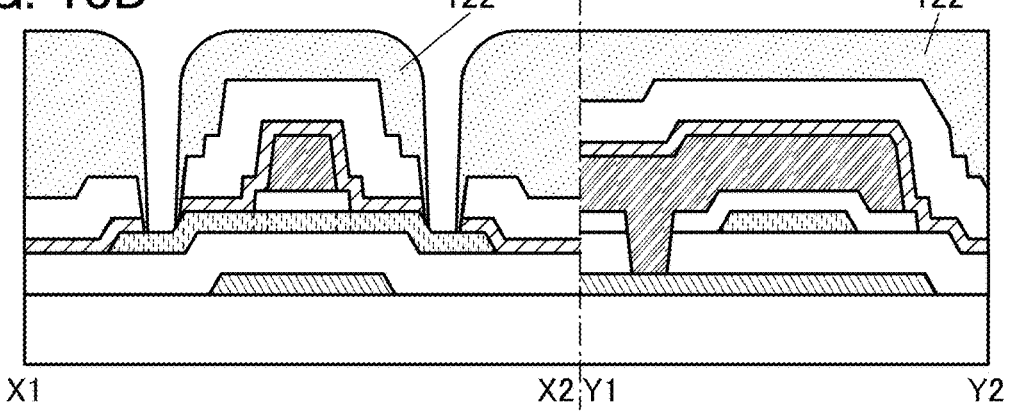

Next, the insulating film 122 is formed over the insulating film 118 (see FIG. 18D).

Note that the insulating film 122 functions as a planarization insulating film. Furthermore, the insulating film 122 has openings in positions overlapping with the opening 141a and the opening 141b.

In this embodiment, the insulating film 122 having the openings is formed in the following manner: a photosensitive acrylic-based resin is applied with a spin coater, and then, desired regions of the photosensitive acrylic-based resin are exposed to light.

Figure 19A:
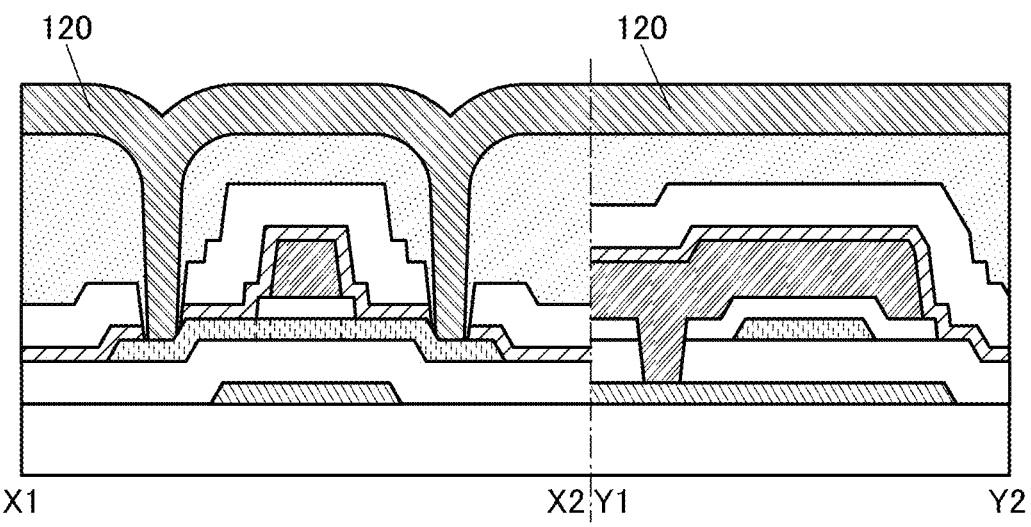
FIGS. 19A and 19B are cross-sectional views illustrating a method for manufacturing a semiconductor device.

Then, the conductive film 120 is formed over the insulating film 122 to cover the openings 141a and 141b (see FIG. 19A).

Figure 19B:
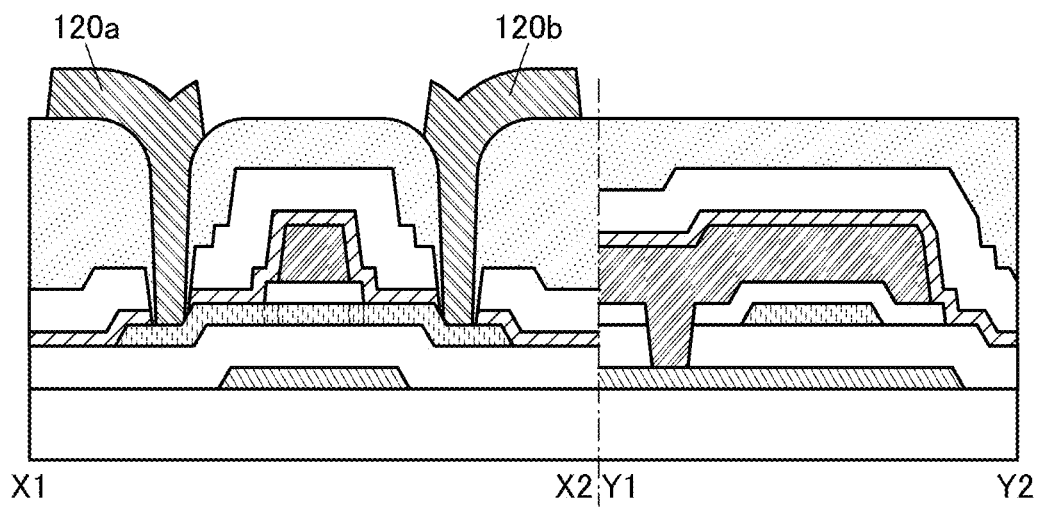

Next, a mask is formed in a desired position over the conductive film 120 by a lithography process, and then the conductive film 120 is partly etched, whereby the conductive films 120a and 120b are formed (see FIG. 19B).

In this embodiment, processing into the conductive film 120 is performed by a dry etching method. In some cases, an upper portion of the insulating film 122 is partly removed when the conductive film 120 is processed.

Through the above-described steps, the transistor 100C illustrated in FIGS. 7A and 7B can be manufactured.

In the manufacture of the transistor 100C, the description in <1-9. Method 1 for manufacturing semiconductor device> can be referred to for the insulating film 104, the oxide semiconductor film 107, the insulating film 110_0, the oxide semiconductor film 112_0, the impurity element 145, the insulating films 116 and 118, the openings 141a and 141b, and the conductive film 120.

Although an example in which the transistor includes the oxide semiconductor film is shown in this embodiment, one embodiment of the present invention is not limited thereto. In one embodiment of the present invention, the transistor does not necessarily include the oxide semiconductor film. For example, the channel region, the vicinity of the channel region, the source region, or the drain region of the transistor may be formed using a material containing Si (silicon), Ge (germanium), SiGe (silicon germanium), GaAs (gallium arsenide), or the like.

The structure and method described in this embodiment can be combined as appropriate with any of the other structures and methods described in the other embodiments and examples.

Embodiment 2

In this embodiment, a structure of an oxide semiconductor and the like are described with reference to FIGS. 20A to 20E, FIGS. 21A to 21E, FIGS. 22A to 22D, FIGS. 23A and 23B, and FIG. 24.

2-1. STRUCTURE OF OXIDE SEMICONDUCTOR

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.

2-2. CAAC-OS

First, a CAAC-OS is described.

A CAAC-OS is one of oxide semiconductors having a plurality of c-axis aligned crystal parts (also referred to as pellets).

Figure 20A:
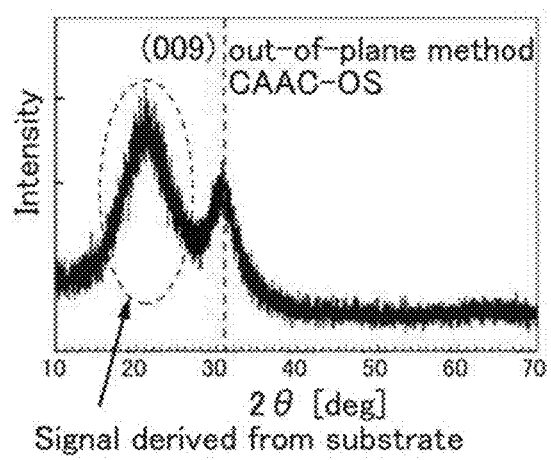
FIGS. 20A to 20E show structural analyses of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 20A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 20B:
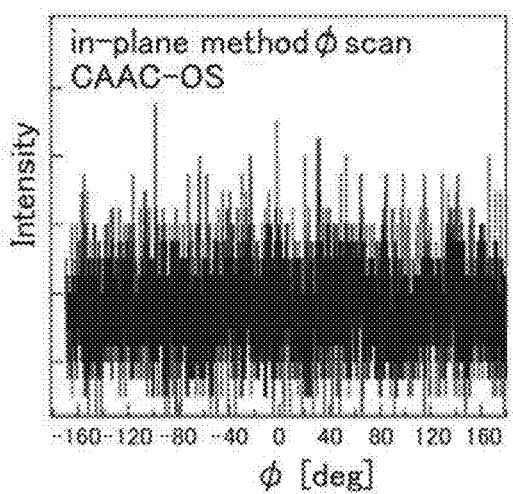
Figure 20C:
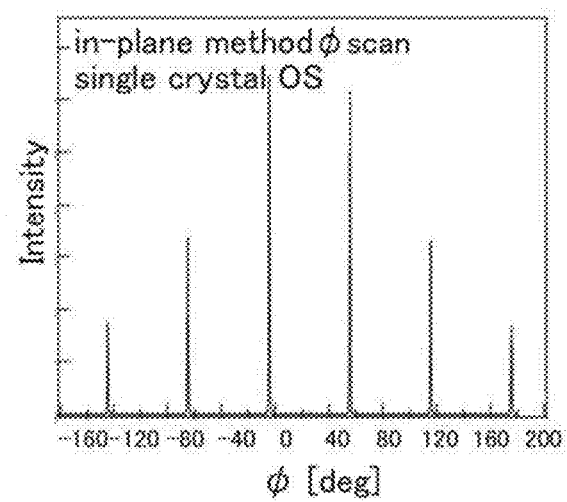
Figure 20D:
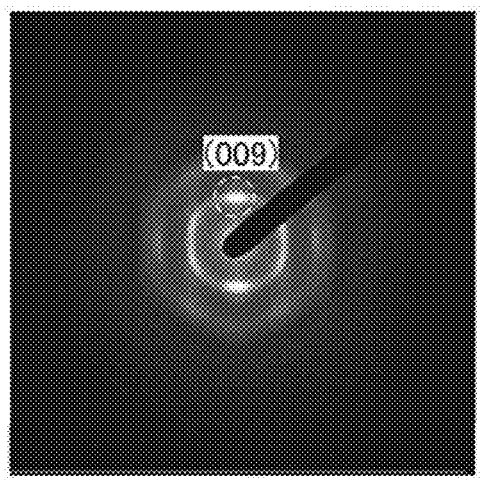

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as shown in FIG. 20B, a peak is not clearly observed. In contrast, in the case where single crystal InGaZnO$_4$ is subjected to φ scan with 2θ fixed at around 56°, as shown in FIG. 20C, six peaks which are derived from crystal planes equivalent to the (110) plane are observed. Accordingly, the structural analysis using XRD shows that the directions of a-axes and b-axes are irregularly oriented in the CAAC-OS.

Figure 20E:
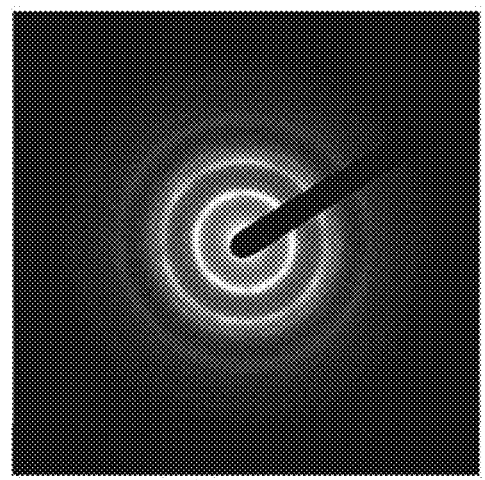

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 20D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 20E shows a diffraction pattern obtained in such a manner that an electron beam with a probe diameter of 300 nm is incident on the same sample in a direction perpendicular to the sample surface. As shown in FIG. 20E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 20E is considered to be derived from the (010) plane, the (100) plane, and the like of the InGaZnO$_4$ crystal. The second ring in FIG. 20E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 21A:
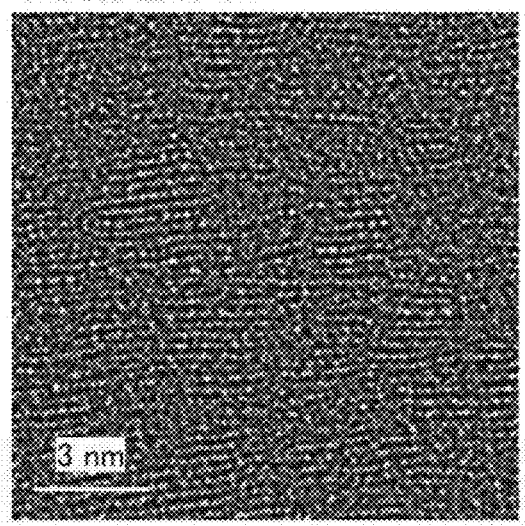
FIGS. 21A to 21E show a cross-sectional TEM image and plan-view TEM images of a CAAC-OS and images obtained through analysis thereof.

FIG. 21A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 21A shows pellets in which metal atoms are arranged in a layered manner. FIG. 21A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 21B:
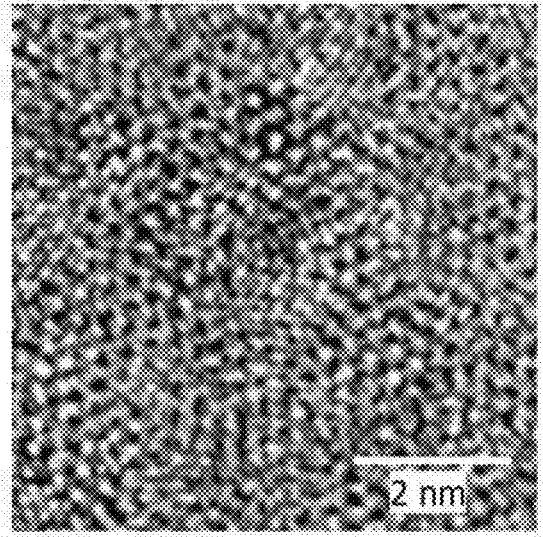
Figure 21C:
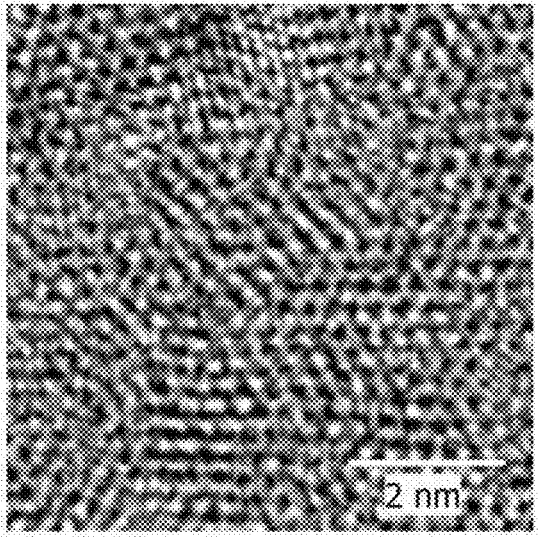
Figure 21D:
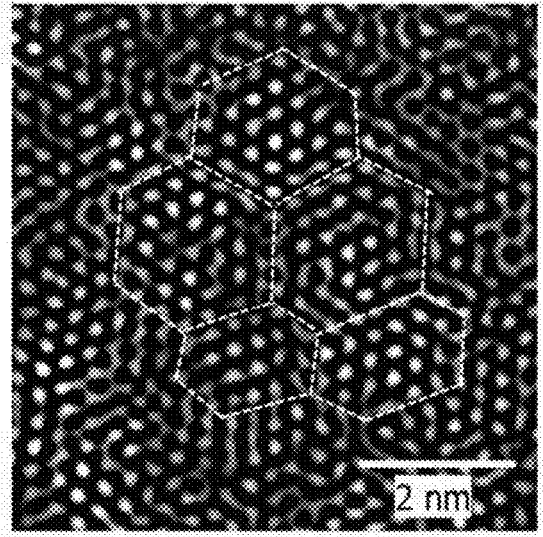
Figure 21E:
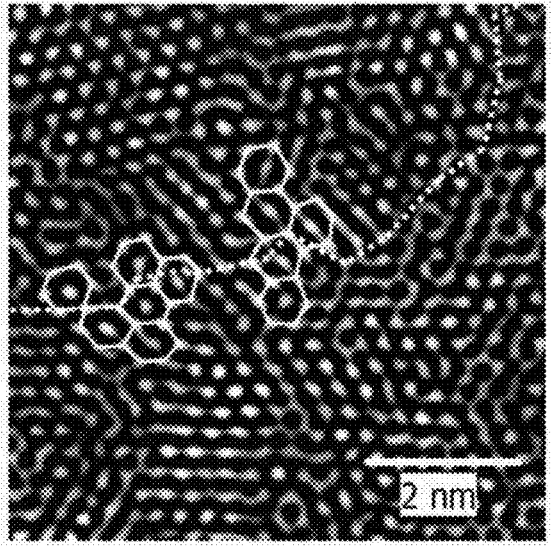

FIGS. 21B and 21C show Cs-corrected high-resolution TEM images of a plane of the CAAC-OS observed from a direction substantially perpendicular to the sample surface. FIGS. 21D and 21E are images obtained through image processing of FIGS. 21B and 21C. The method of image processing is as follows. The image in FIG. 21B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 21D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 21E, a dotted line denotes a boundary between a region with a regular lattice arrangement and another region with a regular lattice arrangement. No clear crystal grain boundary can be observed even in the vicinity of the dotted line. When lattice points around a lattice point in the vicinity of the dotted line are joined, a distorted hexagon can be formed. That is, a lattice arrangement is distorted so that formation of a crystal grain boundary is inhibited. This is probably because the following features of the CAAC-OS can allow distortion: a low density of the atomic arrangement in the a-b plane direction, an interatomic bond distance changed by substitution of a metal element, and the like.

In the above-described manner, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, an oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, and further preferably lower than $1\times10^{11}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

2-3. nc-OS

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 22A:
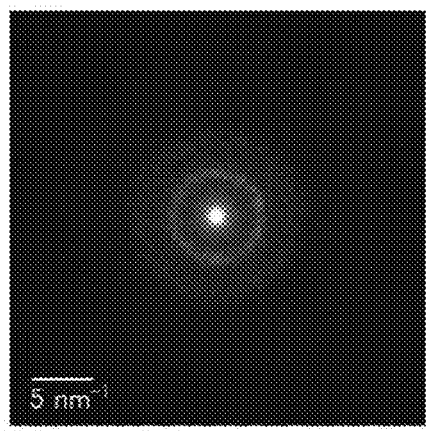
FIGS. 22A to 22D show electron diffraction patterns and a cross-sectional TEM image of an nc-OS.
Figure 22B:
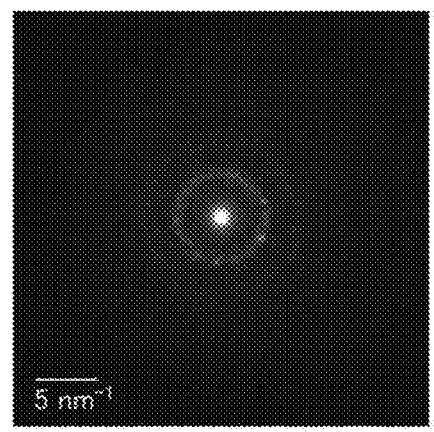

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 22A is observed. FIG. 22B shows a diffraction pattern obtained when an electron beam with a probe diameter of 1 nm is incident on the same sample. As shown in FIG. 22B, a plurality of spots are observed in a ring-like region. In other words, ordering in an nc-OS is not observed with an electron beam with a probe diameter of 50 nm but is observed with an electron beam with a probe diameter of 1 nm.

Figure 22C:
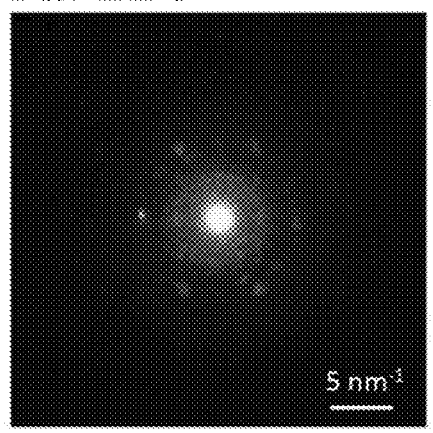

Furthermore, an electron diffraction pattern in which spots are arranged in an approximately hexagonal shape is observed in some cases as shown in FIG. 22C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 22D:
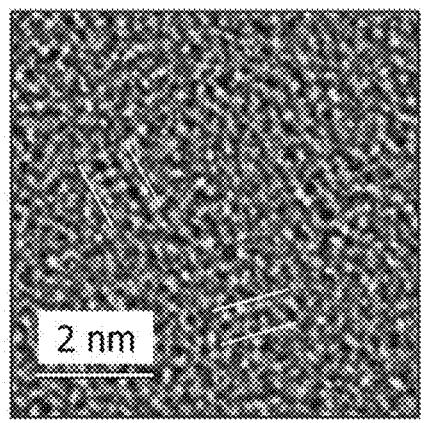

FIG. 22D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 22D, and a region in which a crystal part is not clearly observed. In most cases, the size of a crystal part included in the nc-OS is greater than or equal to 1 nm and less than or equal to 10 nm, in particular, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the above-described manner, in the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

2-4. a-like OS

An a-like OS has a structure intermediate between those of the nc-OS and the amorphous oxide semiconductor.

Figure 23A:
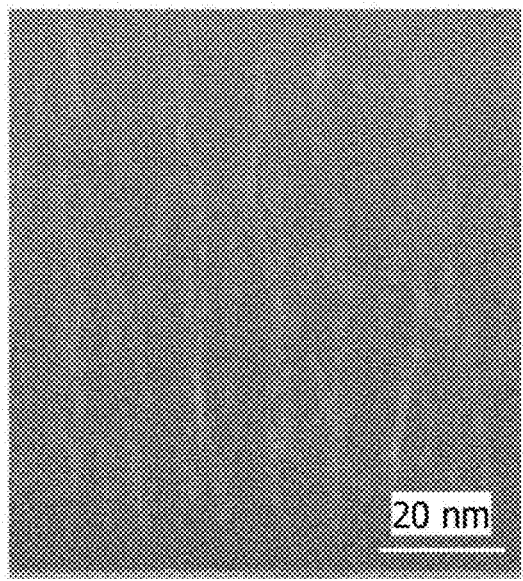
FIGS. 23A and 23B show cross-sectional TEM images of an a-like OS.
Figure 23B:
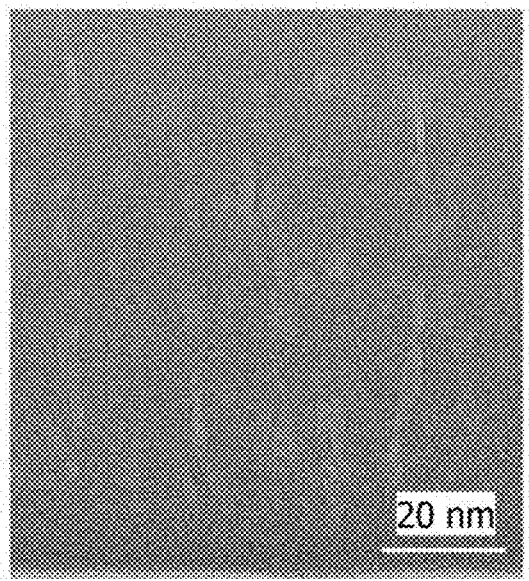

FIGS. 23A and 23B are high-resolution cross-sectional TEM images of an a-like OS. FIG. 23A is the high-resolution cross-sectional TEM image of the a-like OS at the start of the electron irradiation. FIG. 23B is the high-resolution cross-sectional TEM image of a-like OS after the electron (e) irradiation at $4.3\times10^8$ $e^-/nm^2$. FIGS. 23A and 23B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared to a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 24:
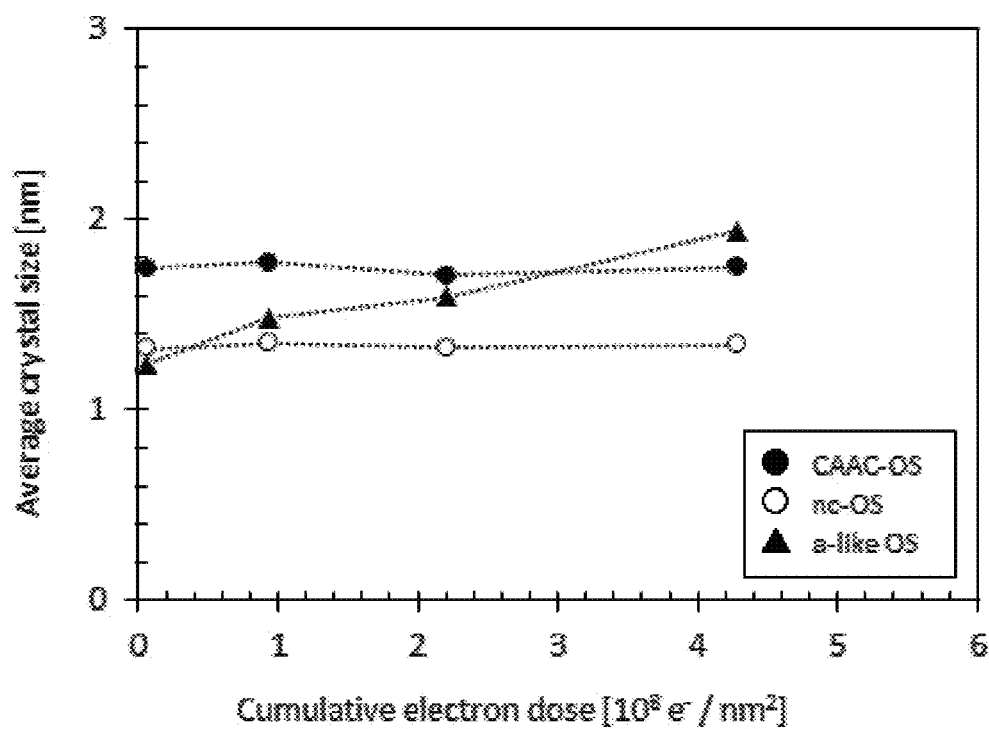
FIG. 24 shows a change in crystal part of an In—Ga—Zn oxide induced by electron irradiation.

FIG. 24 shows change in the average size of crystal parts (at 22 points to 30 points) in each sample. Note that the crystal part size corresponds to the length of a lattice fringe. FIG. 24 indicates that the crystal part size in the a-like OS increases with an increase in the cumulative electron dose in obtaining TEM images, for example. As shown in FIG. 24, a crystal part of approximately 1.2 nm (also referred to as an initial nucleus) at the start of TEM observation grows to a size of approximately 1.9 nm at a cumulative electron (e) dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e/nm$^2$. As shown in FIG. 24, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ e$^-$/(nm$^2$·$); and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared to the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

In the above-described manner, oxide semiconductors have various structures and various properties. Note that an oxide semiconductor may be a stacked-layer film including two or more films of an amorphous oxide semiconductor, an a-like OS, an nc-OS, and a CAAC-OS, for example.

The structure described in this embodiment can be combined as appropriate with any of the other structures described in the other embodiments and examples.

Embodiment 3

In this embodiment, an example of a display device that includes any of the transistors described in the above embodiment is described below with reference to FIGS. 25, 26, and 27.

Figure 25:
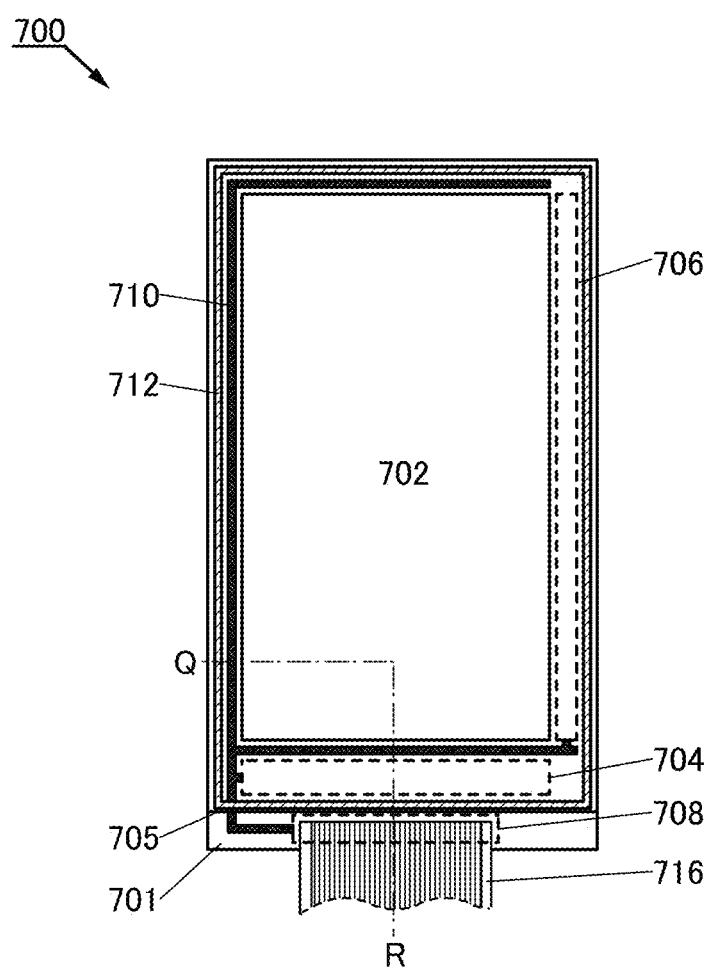
FIG. 25 is a top view illustrating one mode of a display device.

FIG. 25 is a top view of an example of a display device. A display device 700 illustrated in FIG. 25 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 25, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. Various signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver circuit substrate formed using a single crystal semiconductor film or a polycrystalline semiconductor film) may be mounted on the first substrate 701. There is no particular limitation on the connection method of a separately formed driver circuit substrate; a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are the semiconductor devices of embodiments of the present invention can be used.

The display device 700 can include any of a variety of elements. The elements includes, for example, an electroluminescent (EL) element (e.g., an EL element including organic and inorganic materials, an organic EL element, an inorganic EL element, an LED), a light-emitting transistor (a transistor which emits light by current), an electron emitter, a liquid crystal element, an electronic ink display element, an electrophoretic element, an electrowetting element, a plasma display (PDP) element, micro electro mechanical systems (MEMS) display element (e.g., a grating light valve (GLV), a digital micromirror device (DMD), a digital micro shutter (DMS) element, and an interferometric modulator display (IMOD) element), and a piezoelectric ceramic display.

Note that examples of display devices including EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink display element or electrophoretic elements is electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Note that the sizes of display regions may be different between respective dots of color elements. Embodiments of the disclosed invention are not limited to a display device for color display; the disclosed invention can also be applied to a display device for monochrome display.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W.

By using a self-luminous element, power consumption can be further reduced as compared to the case of using the coloring layer in some cases.

As a coloring method, any of the following methods may be used: the above-described color filter method in which part of white light emission is converted into red light, green light, and blue light through a color filter; a three-color method in which light emission of red, green, and blue is used; and a color conversion method or a quantum dot method in which part of blue emission is converted into red light or green light.

In this embodiment, a structure including a liquid crystal element and an EL element as display elements is described with reference to FIGS. 26 and 27. Note that FIG. 26 is a cross-sectional view taken along the dashed-dotted line Q-R shown in FIG. 25 and shows a structure including a liquid crystal element as a display element, whereas FIG. 27 is a cross-sectional view taken along the dashed-dotted line Q-R shown in FIG. 25 and shows a structure including an EL element as a display element.

Figure 26:
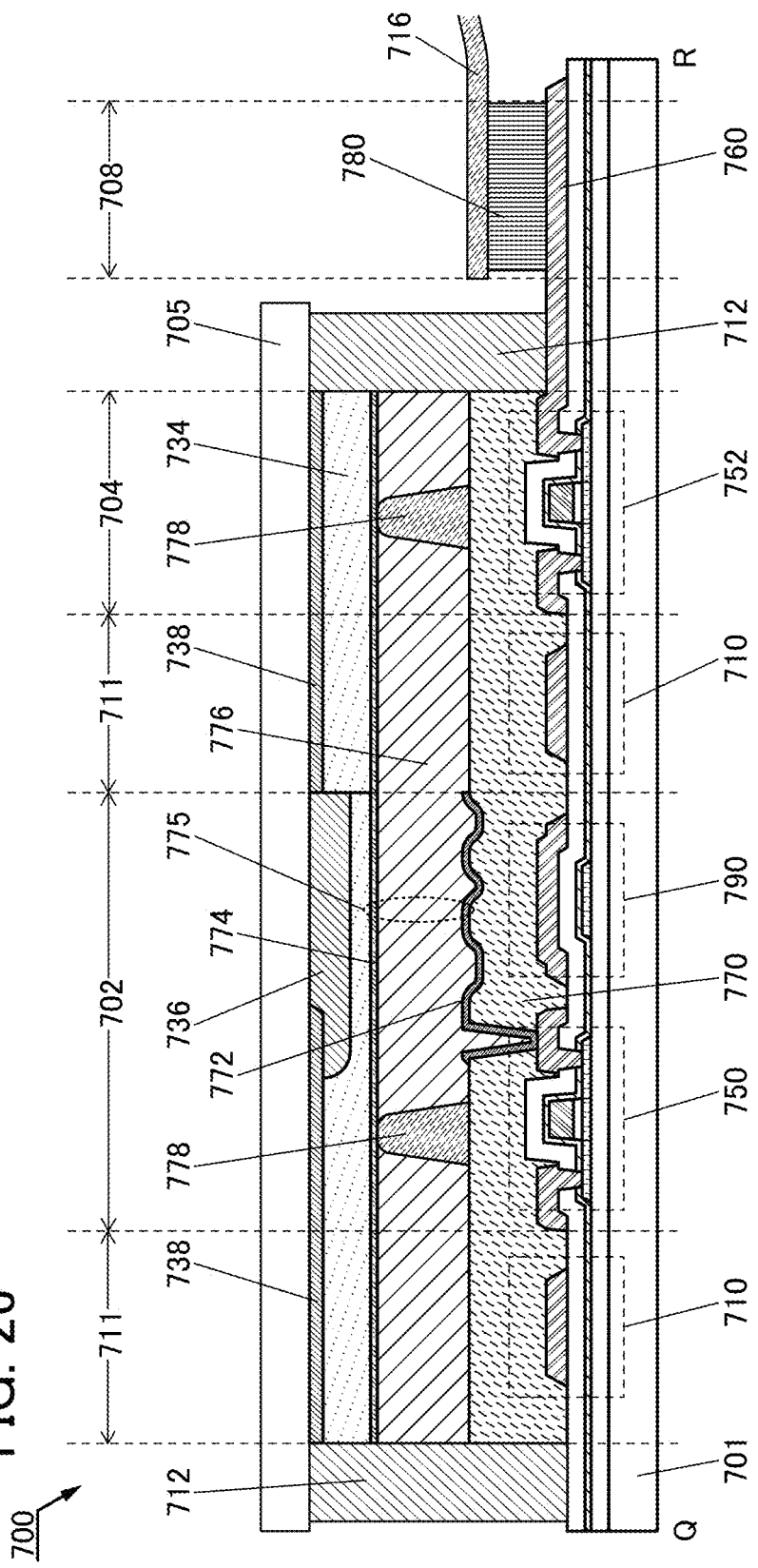
FIG. 26 is a cross-sectional view illustrating one mode of a display device.
Figure 27:
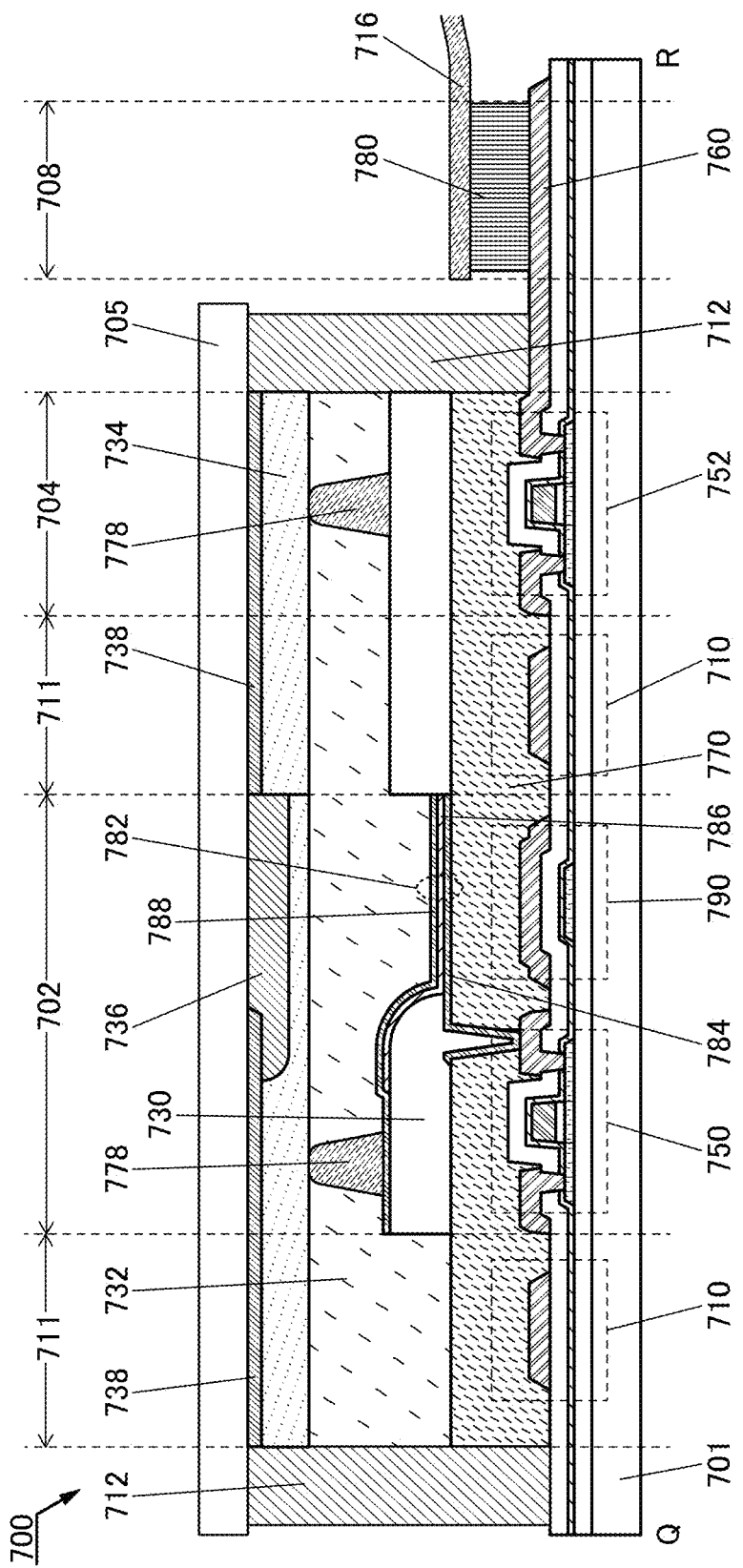
FIG. 27 is a cross-sectional view illustrating one mode of a display device.

Common portions between FIGS. 26 and 27 are described first, and then different portions are described.

3-1. COMMON PORTIONS IN DISPLAY DEVICE

The display device 700 illustrated in FIGS. 26 and 27 includes a lead wiring portion 711, the pixel portion 702, the source driver circuit portion 704, and the FPC terminal portion 708. Note that the lead wiring portion 711 includes the signal line 710. The pixel portion 702 includes a transistor 750 and a capacitor 790. The source driver circuit portion 704 includes a transistor 752.

The transistors 750 and 752 each have a structure similar to that of the transistor 100 described above. Note that the transistors 750 and 752 may each have a structure of the other transistors described in any of the above embodiments.

The transistors used in this embodiment each include an oxide semiconductor film which is highly purified and in which formation of oxygen vacancies is suppressed. In the transistor, the off-state current can be made small. Accordingly, an electrical signal such as an image signal can be held for a longer period, and a writing interval can be set longer in an on state. Accordingly, frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

The capacitor 790 includes a lower electrode and an upper electrode. The lower electrode is formed by processing an oxide semiconductor film. The oxide semiconductor film and a first oxide semiconductor film of the transistor 750 are formed through the same process.

The upper electrode is formed by processing a conductive film. The conductive film and conductive films functioning as source and drain electrodes of the transistor 750 are formed through the same process. Furthermore, insulating films functioning as a second insulating film and a third insulating film of the transistor 750 are provided between the lower electrode and the upper electrode. That is, the capacitor 790 has a stacked-layer structure in which the insulating films functioning as a dielectric are positioned between a pair of electrodes.

In FIGS. 26 and 27, a planarization insulating film 770 is provided over the transistors 750 and 752 and the capacitor 790.

The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

The signal line 710 is formed through the same process as conductive films functioning as source and drain electrodes of the transistor 750 or 752. Note that the signal line 710 may be formed using a conductive film which is formed through a different process from source and drain electrodes of the transistor 750 or 752, for example, an oxide semiconductor film formed through the same process as an oxide semiconductor film functioning as a gate electrode. In the case where the signal line 710 is formed using a material containing a copper element, for example, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as conductive films functioning as source and drain electrodes of the transistor 750 or 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure 778 is provided between the first substrate 701 and the second substrate 705. The structure 778 is a columnar spacer obtained by selective etching of an insulating film and is provided to control the thickness (cell gap) between the first substrate 701 and the second substrate 705. Alternatively, a spherical spacer may be used as the structure 778.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

3-2. STRUCTURE EXAMPLE OF DISPLAY DEVICE USING LIQUID CRYSTAL ELEMENT

The display device 700 illustrated in FIG. 26 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 26 is capable of displaying an image in such a manner that transmission or non-transmission is controlled by change in the alignment state of the liquid crystal layer 776 depending on a voltage applied to the conductive films 772 and 774.

The conductive film 772 is connected to the conductive film functioning as source and drain electrodes of the transistor 750. The conductive film 772 is formed over the planarization insulating film 770 to function as a pixel electrode, i.e., one electrode of the display element. The conductive film 772 has a function of a reflective electrode. The display device 700 in FIG. 26 is what is called a reflective color liquid crystal display device in which external light is reflected by the conductive film 772 to display an image through the coloring film 736.

A conductive film that transmits visible light or a conductive film that reflects visible light can be used for the conductive film 772. For example, a material including one kind selected from indium (In), zinc (Zn), and tin (Sn) is preferably used for the conductive film that transmits visible light. For example, a material including aluminum or silver is preferably used for the conductive film that reflects visible light. In this embodiment, the conductive film that reflects visible light is used for the conductive film 772.

Note that projections and depressions are provided in part of the planarization insulating film 770 of the pixel portion 702 in the display device 700 in FIG. 26. The projections and depressions can be formed in such a manner that the planarization insulating film 770 is formed using a resin film, and projections and depressions are formed on the surface of the resin film. The conductive film 772 functioning as a reflective electrode is formed along the projections and depressions. Therefore, when external light is incident on the conductive film 772, the light is reflected diffusely at the surface of the conductive film 772, whereby visibility can be improved.

Note that the display device 700 illustrated in FIG. 26 is a reflective color liquid crystal display device given as an example, but a display type is not limited thereto. For example, a transmissive color liquid crystal display device in which the conductive film 772 is a conductive film that transmits visible light may be used. In the case of a transmissive color liquid crystal display device, projections and depressions are not necessarily provided on the planarization insulating film 770.

Although not illustrated in FIG. 26, an alignment film may be provided on a side of the conductive film 772 in contact with the liquid crystal layer 776 and on a side of the conductive film 774 in contact with the liquid crystal layer 776. Although not illustrated in FIG. 26, an optical member (an optical substrate) and the like such as a polarizing member, a retardation member, or an anti-reflection member may be provided as appropriate. For example, circular polarization may be employed by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions. [0332]

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal showing a blue phase and a chiral material has a short response time and optical isotropy, which eliminates the need for an alignment process. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Moreover, the liquid crystal material which exhibits a blue phase has a small viewing angle dependence.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Furthermore, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

3-3. DISPLAY DEVICE USING LIGHT-EMMITTING ELEMENT

The display device 700 illustrated in FIG. 27 includes a light-emitting element 782. The light-emitting element 782 includes a conductive film 784, an EL layer 786, and a conductive film 788. The display device 700 illustrated in FIG. 27 is capable of displaying an image by light emission from the EL layer 786 included in the light-emitting element 782.

The conductive film 784 is connected to the conductive film functioning as source and drain electrodes included in the transistor 750. The conductive film 784 is formed over the planarization insulating film 770 to function as a pixel electrode, i.e., one electrode of the display element. A conductive film which transmits visible light or a conductive film which reflects visible light can be used for the conductive film 784. For example, a material including one kind selected from indium (In), zinc (Zn), and tin (Sn) is preferably used for the conductive film that transmits visible light. For example, a material including aluminum or silver is preferably used for the conductive film that reflects visible light.

In the display device 700 illustrated in FIG. 27, an insulating film 730 is provided over the planarization insulating film 770 and the conductive film 784. The insulating film 730 covers part of the conductive film 784. Note that the light-emitting element 782 has a top emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 784 side, or a dual-emission structure in which light is emitted to both the conductive film 784 side and the conductive film 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with a sealing film 732. Note that the structure is not limited to the example in which the coloring film 736 is provided in the display device 700 illustrated in FIG. 27; for example, in the case where the EL layer 786 is formed by a separate coloring method, the coloring film 736 is not necessarily provided.

The structure described in this embodiment can be combined as appropriate with any of the other structures described in the other embodiments and examples.

Embodiment 4

In this embodiment, an example of a circuit configuration of a semiconductor device, which can hold stored data even when not powered, and which does not have a limitation on the number of write cycles, is described with reference to FIG. 28.

4-1. CIRCUIT CONFIGURATION

Figure 28:
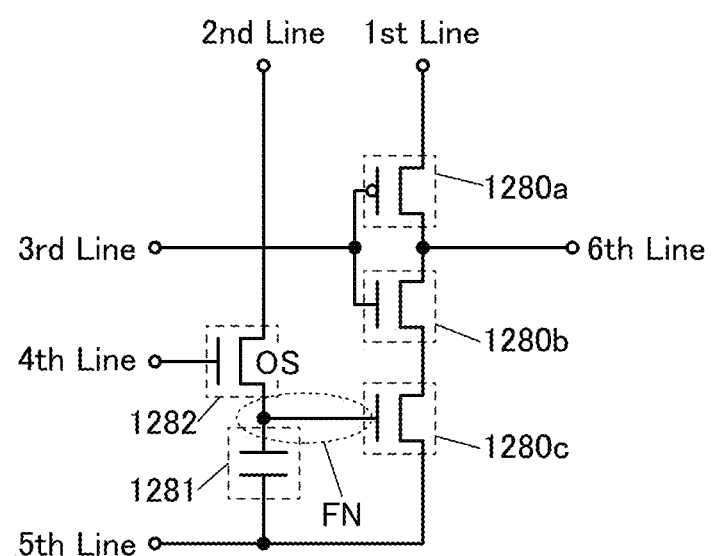
FIG. 28 illustrates a circuit configuration of a semiconductor device.

FIG. 28 shows an example of a circuit configuration of a semiconductor device. In FIG. 28, a first wiring (1st Line) is electrically connected to one of source and drain electrodes of a p-channel transistor 1280a. Further, the other of source and drain electrodes of the p-channel transistor 1280a is electrically connected to one of source and drain electrodes of an n-channel transistor 1280b. Further, the other of the source and drain electrodes of the n-channel transistor 1280b is electrically connected to one of source and drain electrodes of an n-channel transistor 1280c.

A second wiring (2nd Line) is electrically connected to one of source and drain electrodes of a transistor 1282. Further, the other of the source and drain electrodes of the transistor 1282, one electrode of a capacitor 1281, and a gate electrode of the n-channel transistor 1280c are electrically connected to each other.

A third wiring (3rd Line) and gate electrodes of the p-channel transistor 1280a and the n-channel transistor 1280b are electrically connected to each other. Further, a fourth wiring (4th Line) is electrically connected to a gate electrode of the transistor 1282. Further, a fifth wiring (5th Line), the other electrode of the capacitor 1281, and the other of the source and drain electrodes of the n-channel transistor 1280c are electrically connected to each other. Further, a sixth wiring (6th Line), the other of the source and drain electrodes of the p-channel transistor 1280a, and one of the source and drain electrodes of the n-channel transistor 1280b are electrically connected to each other.

Note that the transistor 1282 can be formed using an oxide semiconductor (OS). Therefore, in FIG. 28, "OS" is written beside the transistor 1282. Note that the transistor 1282 may be formed using a material other than an oxide semiconductor.

Further, in FIG. 28, a floating node (FN) is written at a connection portion of the other of the source and drain electrodes of the transistor 1282, the one electrode of the capacitor 1281, and the gate electrode of the n-channel transistor 1280c. When the transistor 1282 is turned off, a potential supplied to the floating node, the one electrode of the capacitor 1281, and the gate electrode of the n-channel transistor 1280c can be held.

The circuit configuration in FIG. 28 utilizes the advantage that the potential of the gate electrode of the n-channel transistor 1280c can be held, whereby writing, holding, and reading of data can be performed as described below.

4-2. WRITING AND HOLDING OF DATA

First, writing and holding of data are described. The potential of the fourth wiring is set to a potential at which the transistor 1282 is turned on, so that the transistor 1282 is turned on. Accordingly, the potential of the second wiring is supplied to the gate electrode of the n-channel transistor 1280c and the capacitor 1281. That is, predetermined charge is supplied to the gate electrode of the n-channel transistor 1280c (writing). After that, the potential of the fourth wiring is set to a potential at which the transistor 1282 is turned off, and the transistor 1282 is turned off. Accordingly, charge applied to the gate electrode of the n-channel transistor 1280c is held (holding).

Since the off-state current of the transistor 1282 is extremely low, the charge in the gate electrode of the n-channel transistor 1280c is held for a long time.

4-3. READING OF DATA

Next, reading of data is described. When the potential of the third wiring is a Low-level potential, the p-channel transistor 1280a is turned on and the n-channel transistor 1280b is turned off. At this time, the potential of the first wiring is applied to the sixth wiring. On the other hand, when the potential of the third wiring is a High-level potential, the p-channel transistor 1280a is turned off and the n-channel transistor 1280b is turned on. At this time, the potential of the sixth wiring varies in response to the amount of charge held in the floating node (FN). Therefore, the retained data can be read by measuring the potential of the sixth wiring (reading).

The transistor 1282 in which a channel formation region is formed using an oxide semiconductor has extremely low off-state current. The off-state current of the transistor 1282 using an oxide semiconductor is lower than or equal to one hundred-thousandth of that of the off-state current of a transistor formed using a silicon semiconductor or the like; thus, loss of the electrical charge accumulated in the floating node (FN) due to leakage of the transistor 1282 is as small as negligible. That is, the transistor 1282 using an oxide semiconductor makes it possible to obtain a nonvolatile memory circuit which can hold data even without being supplied with power.

By applying the semiconductor device including the above-described circuit configuration to a memory device such as a register or a cache memory, data in the memory device can be prevented from being erased owing to the stop of the supply of the power supply voltage. In addition, after the supply of the power supply voltage is resumed, the storage element can return to the state same as that before the power supply voltage is stopped in a short time. Therefore, the power supply can be stopped even for a short time when the whole memory device or one or a plurality of logic circuits included in the memory device is in a standby state. Accordingly, power consumption can be suppressed.

The structure, method, and the like described in this embodiment can be combined as appropriate with any of the other structures, methods, and the like described in the other embodiments and examples

Embodiment 5

In this embodiment, a configuration of a pixel circuit capable of being used in a semiconductor device of one embodiment of the present invention is described below with reference to FIG. 29A.

5-1. CONFIGURATION OF PIXEL CIRCUIT

Figure 29A:
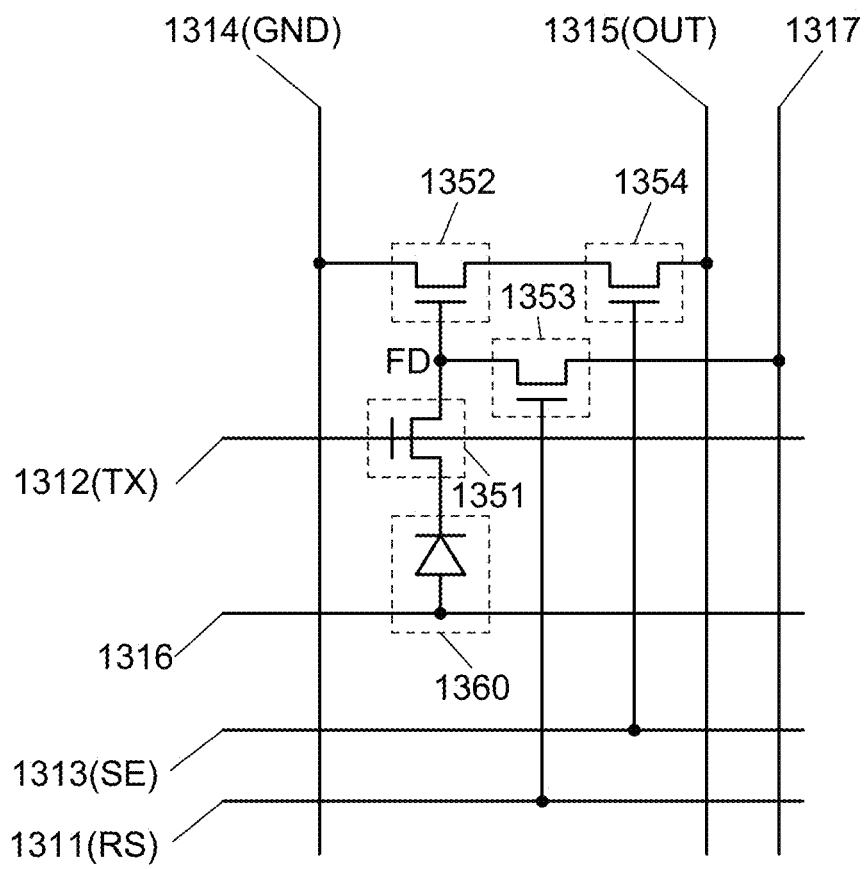
FIG. 29A is a diagram illustrating a configuration of a pixel circuit.

FIG. 29A illustrates a configuration of the pixel circuit. The circuit in FIG. 29A includes a photoelectric conversion element 1360, a transistor 1351, a transistor 1352, a transistor 1353, and a transistor 1354.

An anode of the photoelectric conversion element 1360 is connected to a wiring 1316, and a cathode of the photoelectric conversion element 1360 is connected to one of source and drain electrodes of the transistor 1351. The other of the source and drain electrodes of the transistor 1351 is connected to a charge accumulation portion (FD), and a gate electrode of the transistor 1351 is connected to a wiring 1312 (TX). One of source and drain electrodes of the transistor 1352 is connected to a wiring 1314 (GND), and the other of the source and drain electrodes of the transistor 1352 is connected to one of source and drain electrodes of the transistor 1354. A gate electrode of the transistor 1352 is connected to the charge accumulation portion (FD). One of source and drain electrodes of the transistor 1353 is connected to the charge accumulation portion (FD), and the other of the source and drain electrodes of the transistor 1353 is connected to a wiring 1317. A gate electrode of the transistor 1353 is connected to a wiring 1311 (RS). The other of the source and drain electrodes of the transistor 1354 is connected to a wiring 1315 (OUT), and a gate electrode of the transistor 1354 is connected to a wiring 1313 (SE). Note that all the connection is electrical connection.

A potential such as GND, VSS, or VDD may be applied to the wiring 1314. Here, a potential or voltage has a relative value. Therefore, the potential GND is not necessarily 0V.

The photoelectric conversion element 1360 is a light-receiving element and has a function of generating current based on the amount of light that enters the pixel circuit. The transistor 1353 has a function of controlling accumulation of charge in the charge accumulation portion (FD) by the photoelectric conversion element 1360. The transistor 1354 has a function of outputting a signal based on the potential of the charge accumulation portion (FD). The transistor 1352 has a function of resetting the potential of the charge accumulation portion (FD). The transistor 1352 has a function of controlling selection of the pixel circuit at the time of reading.

Note that the charge accumulation portion (FD) is a charge retention node and retains charge that is changed depending on the amount of light received by the photoelectric conversion element 1360.

Note that the transistors 1352 and 1354 only need to be connected in series between the wirings 1314 and 1315. Thus, the wiring 1314, the transistor 1352, the transistor 1354, and the wiring 1315 may be arranged in that order, or the wiring 1314, the transistor 1354, the transistor 1352, and the wiring 1315 may be arranged in that order.

The wiring 1311 (RS) functions as a signal line for controlling the transistor 1353. The wiring 1312 (TX) functions as a signal line for controlling the transistor 1351. The wiring 1313

(SE) functions as a signal line for controlling the transistor 1354. The wiring 1314 (GND) functions as a signal line for supplying a reference potential (e.g., GND). The wiring 1315 (OUT) functions as a signal line for reading a signal output from the transistor 1352. The wiring 1316 functions as a signal line for outputting charge from the charge accumulation portion (FD) through the photoelectric conversion element 1360 and is a low-potential line in the circuit in FIG. 29A. The wiring 1317 functions as a signal line for resetting the potential of the charge accumulation portion (FD) and is a high-potential line in the circuit in FIG. 29A.

Next, a structure of each component illustrated in FIG. 29A is described.

5-2. PHOTOELECTRIC CONVERSION ELEMENT

An element including selenium or a selenium-containing compound (hereinafter referred to as a selenium-based material) or an element including silicon (e.g., an element in which a pin junction is formed) can be used as the photoelectric conversion element 1360. The photoelectric conversion element including the selenium-based material is preferably used in combination with a transistor including an oxide semiconductor, in which case high reliability can be achieved.

5-3. TRANSISTOR

Although a silicon semiconductor such as amorphous silicon, microcrystalline silicon, polycrystalline silicon, or single crystal silicon can be used to form the transistors 1351 to 1354, the transistors 1351 to 1354 are preferably OS transistors. A transistor in which a channel formation region is formed using an oxide semiconductor has extremely low off-state current. The transistor described in Embodiment 1, for example, can be used as the transistor in which a channel formation region is formed using an oxide semiconductor.

In particular, when the transistors 1351 and 1353 connected to the charge accumulation portion (FD) has high leakage current, charge accumulated in the charge accumulation portion (FD) cannot be held for a sufficiently long time. The use of OS transistors as the transistors 1351 and 1353 can prevent unwanted output of charge from the charge accumulation portion (FD).

Unwanted output of charge also occurs in the wiring 1314 or 1315 when the transistors 1352 and 1354 have high leakage current; thus, a transistor in which a channel formation region is formed using an oxide semiconductor is preferably used as each of these transistors.

The transistor illustrated in FIG. 29A includes one gate electrode. However, the transistor is not limited thereto and may include a plurality of gate electrodes, for example. The transistor including a plurality of gate electrodes is, for example, a transistor including a first gate electrode and a second gate electrode (also referred to as a back-gate electrode) which overlap with a semiconductor film in which a channel formation region is formed. The back-gate electrode may be supplied with a potential which is the same as that supplied to the first gate electrode, a floating potential, or a potential which is different from that supplied to the first gate electrode.

5-4. TIMING CHART OF CIRCUIT OPERATION

An example of operation of the circuit illustrated in FIG. 29A is described with reference to a timing chart in FIG. 29B.

Figure 29B:
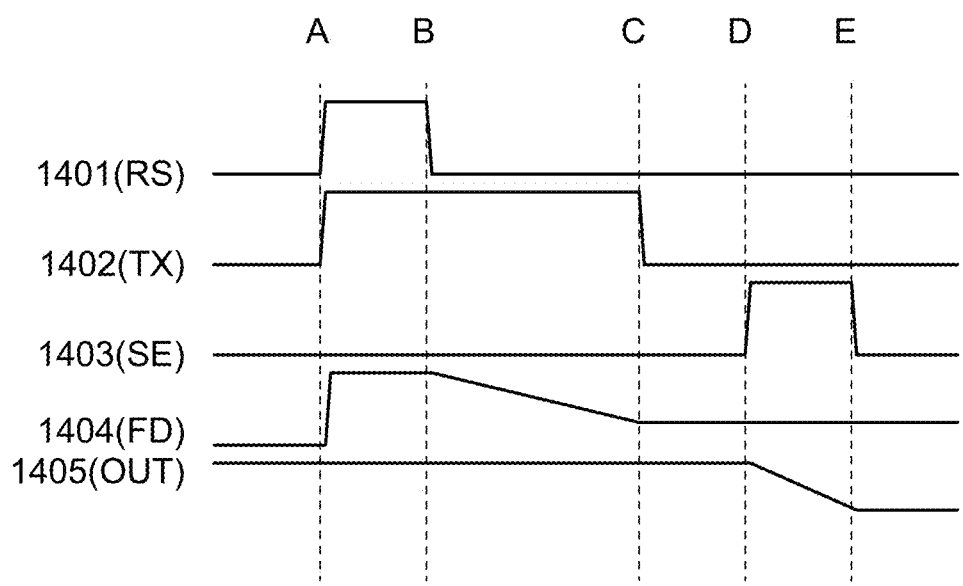
FIG. 29B is a timing chart illustrating the operation of the pixel circuit.

In FIG. 29B, the potential of each wiring is a signal that varies between two levels for simplicity. Since each potential is an analog signal, the potential can, in practice, have various levels depending on conditions without being limited to two levels. In FIG. 29B, a signal 1401 corresponds to the potential of the wiring 1311 (RS); a signal 1402 corresponds to the potential of the wiring 1312 (TX); a signal 1403 corresponds to the potential of the wiring 1313 (SE); a signal 1404 corresponds to the potential of the charge accumulation portion (FD); and a signal 1405 corresponds to the potential of the wiring 1315 (OUT). Note that the potential of the wiring 1316 is always at a low level, and the potential of the wiring 1317 is always at a high level.

At time A, the potential (signal 1401) of the wiring 1311 is at a high level and the potential (signal 1402) of the wiring 1312 is at a high level, so that the potential (signal 1404) of the charge accumulation portion (FD) is initialized to the potential (high level) of the wiring 1317, and reset operation is started. Note that the potential (signal 1405) of the wiring 1315 is precharged to a high level.

At time B, the potential (signal 1401) of the wiring 1311 is set at a low level, so that the reset operation is terminated to start accumulation operation. Here, a reverse bias is applied to the photoelectric conversion element 1360, so that the potential (signal 1404) of the charge accumulation portion (FD) starts to decrease due to reverse current. Since irradiation of the photoelectric conversion element 1360 with light increases the reverse current, the rate of decrease in the potential (signal 1404) of the charge accumulation portion (FD) changes depending on the amount of the light irradiation. In other words, channel resistance between the source and drain electrodes of the transistor 1354 changes depending on the amount of light delivered to the photoelectric conversion element 1360.

At time C, the potential (signal 1402) of the wiring 1312 is set to a low level to terminate the accumulation operation, so that the potential (signal 1404) of the charge accumulation portion (FD) becomes constant. Here, the potential is determined by the amount of charge generated by the photoelectric conversion element 1360 during the accumulation operation. That is, the potential changes depending on the amount of light delivered to the photoelectric conversion element 1360. Furthermore, since each of the transistors 1351 and 1353 is a transistor that includes a channel formation region formed using an oxide semiconductor and has extremely low off-state current, the potential of the charge accumulation portion (FD) can be kept constant until subsequent selection operation (read operation) is performed.

Note that when the potential (signal 1402) of the wiring 1312 is set at a low level, the potential of the charge accumulation portion (FD) might change owing to parasitic capacitance between the wiring 1312 and the charge accumulation portion (FD). In the case where the amount of change in the potential is large, the amount of charge generated by the photoelectric conversion element 1360 during the accumulation operation cannot be obtained accurately. Examples of effective measures to reduce the amount of change in the potential include reducing capacitance between the gate electrode and the source electrode (or between the gate electrode and the drain electrode) of the transistor 1351, increasing the gate capacitance of the transistor 1352, and providing a storage capacitor in the charge accumulation portion (FD). Note that in this embodiment, the change in the potential can be ignored by taking these measures.

At time D, the potential (signal 1403) of the wiring 1313 is set at a high level to turn on the transistor 1354, so that selection operation starts and the wirings 1314 and 1315 are electrically connected to each other through the transistors 1352 and 1354. The potential (signal 1405) of the wiring 1315 starts to decrease. Note that precharge of the wiring 1315 is terminated before the time D. Here, the rate at which the potential (signal 1405) of the wiring 1315 decreases depends on current between the source and drain electrodes of the transistor 1352. That is, the potential (signal 1405) of the wiring 1315 changes depending on the amount of light delivered to the photoelectric conversion element 1360 during the accumulation operation.

At time E, the potential (signal 1403) of the wiring 1313 is set at a low level to turn off the transistor 1354, so that the selection operation is terminated and the potential (signal 1405) of the wiring 1315 becomes a constant value. Here, the constant value changes depending on the amount of light delivered to the photoelectric conversion element 1360. Therefore, the amount of light delivered to the photoelectric conversion element 1360 during the accumulation operation can be determined by measuring the potential of the wiring 1315.

Specifically, when the photoelectric conversion element 1360 is irradiated with light with high intensity, the potential of the charge accumulation portion (FD), that is, the gate voltage of the transistor 1352 is decreased. Therefore, current flowing between the source and drain electrodes of the transistor 1352 becomes small; as a result, the potential (signal 1405) of the wiring 1315 is gradually decreased. Thus, a comparatively high potential can be read from the wiring 1315.

In contrast, when the photoelectric conversion element 1360 is irradiated with light with low intensity, the potential of the charge accumulation portion (FD), that is, the gate voltage of the transistor 1352 is increased. Therefore, the current flowing between the source and drain electrodes of the transistor 1352 becomes large; as a result, the potential (signal 1405) of the wiring 1315 is rapidly decreased. Thus, a comparatively low potential can be read from the wiring 1315.

The structure described in this embodiment can be combined as appropriate with any of the other structures described in the other embodiments and examples.

Embodiment 6

In this embodiment, a display device that includes a semiconductor device of one embodiment of the present invention is described with reference to FIGS. 30A to 30C.

6. CIRCUIT CONFIGURATION OF DISPLAY DEVICE

The display device illustrated in FIG. 30A includes a region including pixels (hereinafter the region is referred to as a pixel portion 502), a circuit portion provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed, in which case the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter such circuits are referred to as pixel circuits 501). The driver circuit portion 504 includes driver circuits such as a circuit for supplying a signal (scan signal) to select a pixel (hereinafter the circuit is referred to as a gate driver 504*a*) and a circuit for supplying a signal (data signal) to drive a display element in a pixel (hereinafter the circuit is referred to as a source driver 504*b*).

The gate driver 504*a* includes a shift register or the like. The gate driver 504*a* receives a signal for driving the shift register through the terminal portion 507 and outputs a signal. For example, the gate driver 504*a* receives a start pulse signal, a clock signal, or the like and outputs a pulse signal. The gate driver 504*a* has a function of controlling the potentials of wirings supplied with scan signals (hereinafter such wirings are referred to as scan lines GL_1 to GL_X). Note that a plurality of gate drivers 504*a* may be provided to control the scan lines GL_1 to GL_X separately. Alternatively, the gate driver 504*a* has a function of supplying an initialization signal. Without being limited thereto, the gate driver 504*a* can supply another signal.

The source driver 504*b* includes a shift register or the like. The source driver 504*b* receives a signal (image signal) from which a data signal is derived, as well as a signal for driving the shift register, through the terminal portion 507. The source driver 504*b* has a function of generating a data signal to be written to the pixel circuit 501 which is based on the image signal. In addition, the source driver 504*b* has a function of controlling output of a data signal in response to a pulse signal produced by input of a start pulse signal, a clock signal, or the like. Furthermore, the source driver 504*b* has a function of controlling the potentials of wirings supplied with data signals (hereinafter such wirings are referred to as data lines DL_1 to DL_Y). Alternatively, the source driver 504*b* has a function of supplying an initialization signal. Without being limited thereto, the source driver 504*b* can supply another signal.

The source driver 504*b* includes a plurality of analog switches or the like, for example. The source driver 504*b* can output, as the data signals, signals obtained by time-dividing the image signal by sequentially turning on the plurality of analog switches. The source driver 504*b* may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504*a*. For example, to the pixel circuit 501 in the m-th row and the n-th column (m is a natural number of less than or equal to X, and n is a natural number of less than or equal to Y), a pulse signal is input from the gate driver 504*a* through the scan line GL_m, and a data signal is input from the source driver 504*b* through the data line DL_n in accordance with the potential of the scan line GL_m.

Figure 30A:
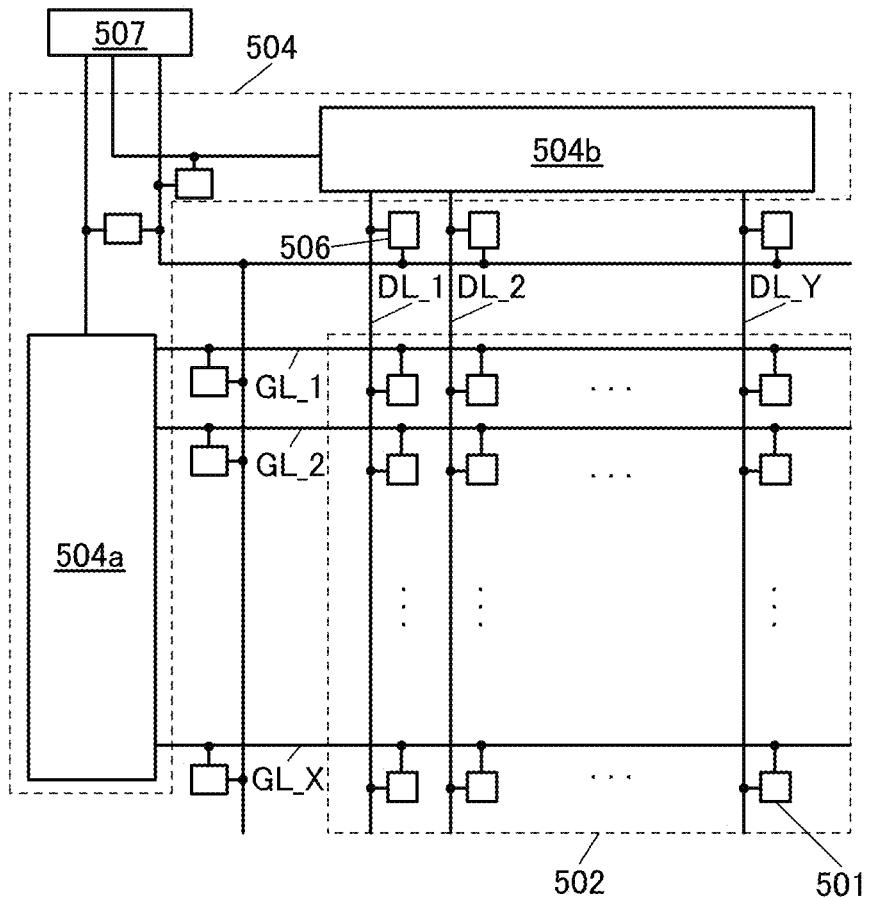
FIGS. 30A to 30C are a block diagram and circuit diagrams illustrating a display device.

The protection circuit 506 illustrated in FIG. 30A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and image signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 30A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

In FIG. 30A, an example in which the driver circuit portion 504 includes the gate driver 504a and the source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a polycrystalline semiconductor film) may be mounted.

Figure 30B:
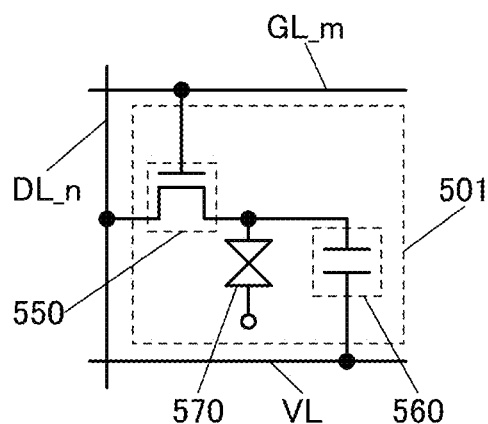

Each of the plurality of pixel circuits 501 in FIG. 30A can have the structure illustrated in FIG. 30B, for example.

The pixel circuit 501 illustrated in FIG. 30B includes a liquid crystal element 570, a transistor 550, and a capacitor 560. As the transistor 550, any of the transistors described in the above embodiments can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Furthermore, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As a driving method of the display device including the liquid crystal element 570, any of the following modes can be used, for example: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, and a transverse bend alignment (TBA) mode. Other examples of the driving method of the display device include an electrically controlled birefringence (ECB) mode, a polymer-dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 501 in the m-th row and the n-th column, one of source and drain electrodes of the transistor 550 is electrically connected to the data line DL n, and the other is electrically connected to the other of the pair of electrodes of the liquid crystal element 570. A gate electrode of the transistor 550 is electrically connected to the scan line GL m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for holding written data.

For example, in the display device including the pixel circuit 501 in FIG. 30B, the pixel circuits 501 are sequentially selected row by row by the gate driver 504a illustrated in FIG. 30A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 30C:
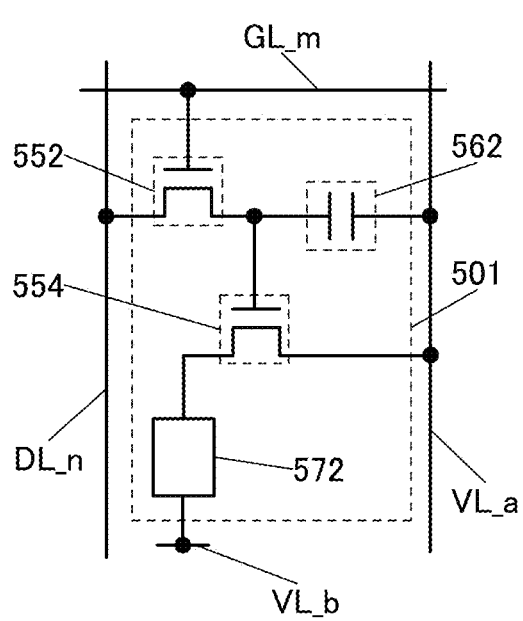

Alternatively, each of the plurality of pixel circuits 501 in FIG. 30A can have the structure illustrated in FIG. 30C, for example.

The pixel circuit 501 illustrated in FIG. 30C includes transistors 552 and 554, a capacitor 562, and a light-emitting element 572. Any of the transistors described in the above embodiments can be used as one or both of the transistors 552 and 554.

One of source and drain electrodes of the transistor 552 is electrically connected to a wiring to which a data signal is supplied (hereinafter referred to as a data line DL n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source and drain electrodes of the transistor 552.

The capacitor 562 functions as a storage capacitor for holding written data.

One of source and drain electrodes of the transistor 554 is electrically connected to the potential supply line VL_a. Furthermore, a gate electrode of the transistor 554 is electrically connected to the other of the source and drain electrodes of the transistor 552.

One of an anode and a cathode of the light-emitting element 572 is electrically connected to a potential supply line VL_b, and the other is electrically connected to the other of the source and drain electrodes of the transistor 554.

As the light-emitting element 572, an organic electroluminescent element (also referred to as an organic EL element) or the like can be used, for example. Note that the light-emitting element 572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 501 in FIG. 30C, the pixel circuits 501 are sequentially selected row by row by the gate driver 504*a* illustrated in FIG. 30A, whereby the transistors 552 are turned on and a data signal is written.

When the transistors 552 are turned off, the pixel circuits 501 in which the data has been written are brought into a holding state. Furthermore, the amount of current flowing between the source and drain electrodes of the transistor 554 is controlled in accordance with the potential of the written data signal. The light-emitting element 572 emits light with a luminance corresponding to the amount of flowing current. This operation is sequentially performed row by row; thus, an image can be displayed.

The structure described in this embodiment can be combined as appropriate with any of the other structures described in the other embodiments and examples.

Embodiment 7

In this embodiment, a display module and electronic appliances that include a semiconductor device of one embodiment of the present invention are described with reference to FIG. 31 and FIGS. 32A to 32G.

7-1. DISPLAY MODULE

Figure 31:
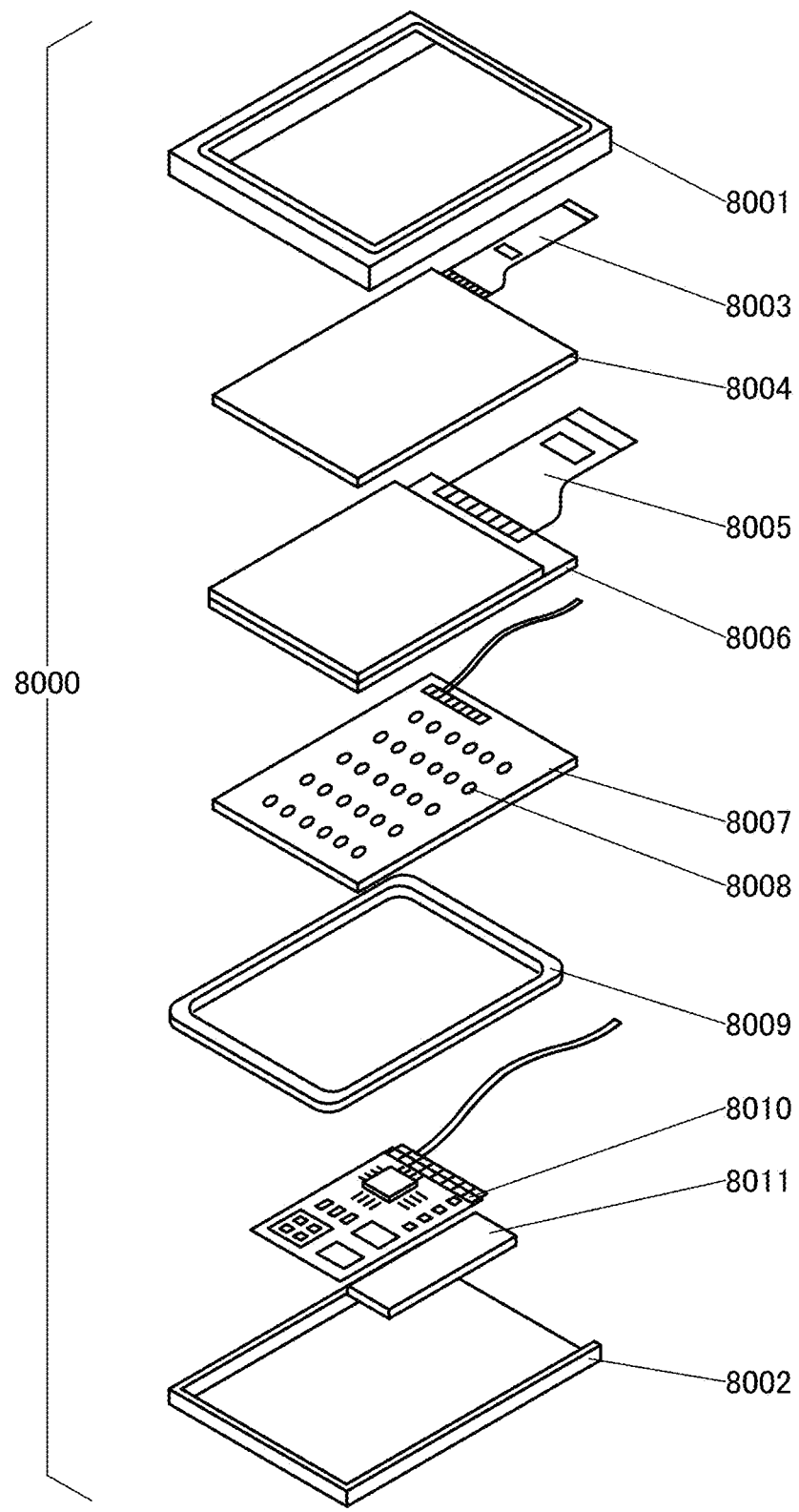
FIG. 31 illustrates a display module.

In a display module 8000 illustrated in FIG. 31, a touch panel 8004 connected to an FPC 8003, a display panel 8006 connected to an FPC 8005, a backlight 8007, a frame 8009, a printed circuit board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight 8007 includes a light source 8008. Note that the structure is not limited to the example in FIG. 31, in which the light sources 8008 are provided over the backlight 8007; for example, a structure in which the light source 8008 is provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed circuit board 8010. The frame 8009 may function as a radiator plate.

The printed circuit board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

7-2. ELECTRONIC APPLIANCE

FIGS. 32A to 32G illustrate electronic appliances. These electronic appliances can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 9008, and the like.

The electronic appliances illustrated in FIGS. 32A to 32G can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic appliances illustrated in FIGS. 32A to 32G are not limited to those described above, and the electronic appliances can have a variety of functions. Although not illustrated in FIGS. 32A to 32G, the electronic appliance may include a plurality of display portions. Furthermore, the electronic appliance may be provided with a camera and the like and have a function of shooting a still image, a function of shooting a moving image, a function of storing a shot image in a memory medium (an external memory medium or a memory medium incorporated in the camera), a function of displaying a shot image on the display portion, or the like.

The electronic appliances illustrated in FIGS. 32A to 32G are described in detail below.

Figure 32A:
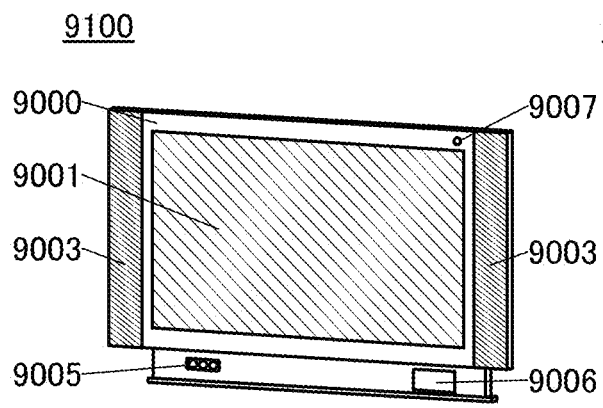
FIGS. 32A to 32G illustrate electronic appliances.

FIG. 32A is a perspective view illustrating a television device 9100. The television device 9100 can include the display portion 9001 having a large screen size of, for example, 50 inches or more, or 100 inches or more.

Figure 32B:
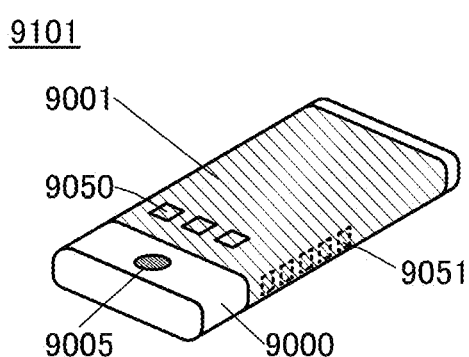

FIG. 32B is a perspective view illustrating a portable information terminal 9101. The portable information terminal 9101 function as, for example, one or more of a telephone set, a notebook, and an information browsing system. Specifically, the portable information terminal 9101 can be used as a smartphone. Note that the portable information terminal 9101 may include the speaker, the connection terminal, the sensor, and the like. The portable information terminal 9101 can display characters and image information on its plurality of surfaces. For example, three operation buttons 9050 (also referred to as operation icons or simply icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, and call; the title and sender of an email and SNS message; the date; the time; remaining battery; and the reception strength of an antenna. Alternatively, the operation buttons 9050 or the like may be displayed in place of the information 9051.

Figure 32C:
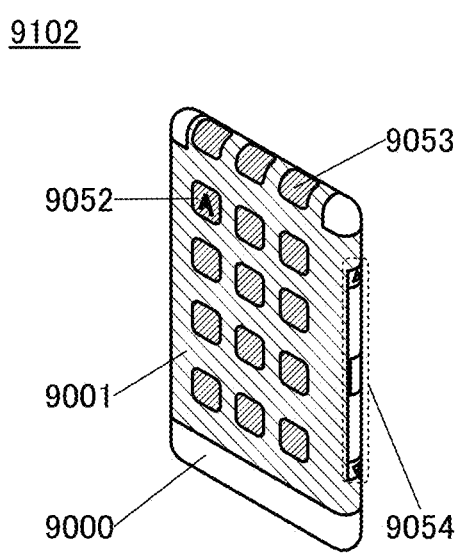

FIG. 32C is a perspective view illustrating a portable information terminal 9102. The portable information terminal 9102 has a function of displaying information, for example, on three or more sides of the display portion 9001. Here, information 9052, information 9053, and information 9054 are displayed on different sides. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

Figure 32D:
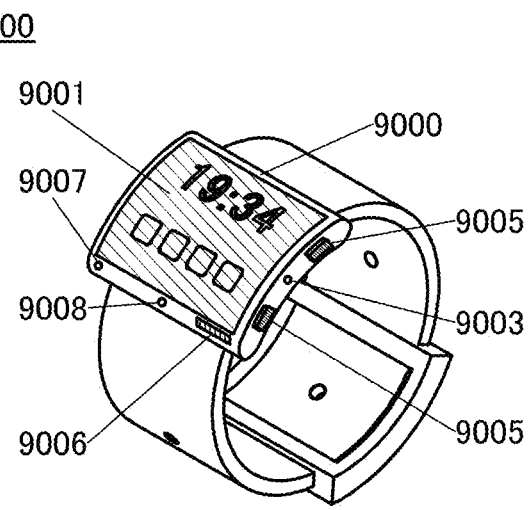

FIG. 32D is a perspective view illustrating a wrist-watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. Moreover, the portable information terminal 9200 includes the connection terminal 9006, and data can be directly transmitted to and received from another information terminal via a connector. Charging through the connection terminal 9006 is possible. Note that the charging operation may be performed by wireless power feeding without using the connection terminal 9006.

Figure 32E:
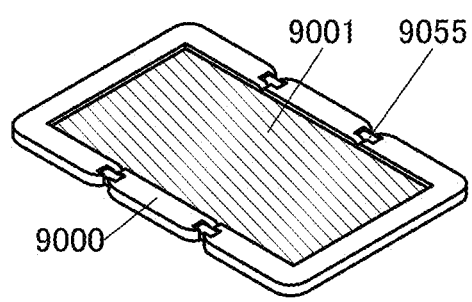
Figure 32F:
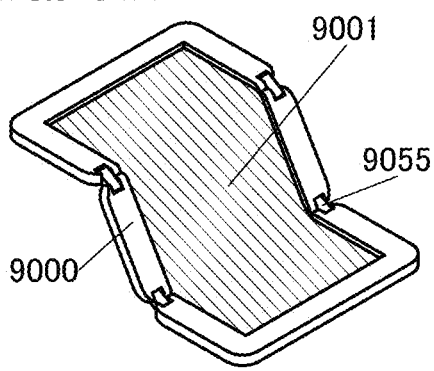
Figure 32G:
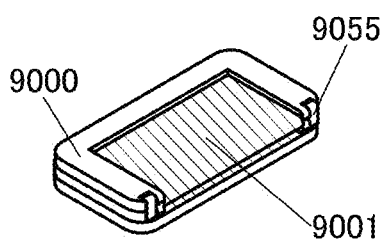

FIGS. 32E, 32F, and 32G are perspective views each illustrating a foldable portable information terminal 9201. FIG. 32E is a perspective view illustrating the portable information terminal 9201 that is opened, FIG. 32F is a perspective view illustrating the portable information terminal 9201 that is being opened or being folded, and FIG. 32G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

The electronic appliances described in this embodiment each include the display portion for displaying some sort of data. Note that the semiconductor device of one embodiment of the present invention can also be used for an electronic appliance that does not have a display portion.

The structure described in this embodiment can be combined as appropriate with any of the other structures described in the other embodiments and examples.

Example 1

In this example, transistors of one embodiment of the present invention were formed, the electrical characteristics of the transistors were measured, and the cross-sectional shapes of the transistors were observed.

Note that Sample A1 was fabricated in this example. First, a method for fabricating Sample A1 is described below. Note that Sample A1 is a sample in which transistors corresponding to the transistor 100C illustrated in FIGS. 7A and 7B are formed. In the description below, the same reference numerals are used for a structure similar to the structure of the transistor 100C illustrated in FIGS. 7A and 7B.

1-1. METHOD FOR FABRICATING SAMPLE A1

First, the substrate 102 was prepared. As the substrate 102, a glass substrate was used. Next, the conductive film 106 was formed over the substrate 102. As the conductive film 106, a 100-nm-thick tungsten film was formed with a sputtering apparatus.

Next, the insulating film 104 was formed over the substrate 102 and the conductive film 106. Note that in this example, as the insulating film 104, insulating films 104_1, 104_2, 104_3, and 104_4 (not illustrated in FIGS. 7A and 7B) were successively formed in this order with a PECVD apparatus in a vacuum. A 50-nm-thick silicon nitride film was formed as the insulating film 104_1. A 300-nm-thick silicon nitride film was formed as the insulating film 104_2. A 50-nm-thick silicon nitride film was formed as the insulating film 104_3. A 50-nm-thick silicon oxynitride film was formed as the insulating film 104_4.

Next, an oxide semiconductor film was formed over the insulating film 104 and was processed into an island shape, whereby the oxide semiconductor film 108 was formed. A 40-nm-thick oxide semiconductor film was formed as the oxide semiconductor film 108. Note that a sputtering apparatus was used to form the oxide semiconductor film 108; a metal oxide of In:Ga:Zn=1:1:1.2 [atomic ratio] was used as a sputtering target, and an AC power supply was used to supply power to the sputtering target. Note that processing into the oxide semiconductor film 108 was performed by a wet etching method.

Next, an insulating film to be the insulating film 110 was formed over the insulating film 104 and the oxide semiconductor film 108. As the insulating film, a 10-nm-thick silicon oxynitride film and a 90-nm-thick silicon oxynitride film were successively formed with a PECVD apparatus in a vacuum.

Next, heat treatment was performed. The heat treatment was performed at 350° C. in a mixed gas atmosphere of nitrogen and oxygen for one hour.

Next, an oxide semiconductor film was formed over the insulating film and was processed into an island shape, whereby the oxide semiconductor film 112 was formed. The insulating film in contact with the bottom surface of the oxide semiconductor film 112 was processed in succession to the oxide semiconductor film 112, whereby the insulating film 110 was formed.

Note that processing into the oxide semiconductor film 112 was performed by a wet etching method, and processing into the insulating film 110 was performed by a dry etching method.

Next, an impurity element was added from above the insulating film 104, the oxide semiconductor film 108, the insulating film 110, and the oxide semiconductor film 112. A doping apparatus was used for the impurity element addition treatment, in which argon was used as the impurity element.

Next, the insulating film 116 was formed over the insulating film 104, the oxide semiconductor film 108, the insulating film 110, and the oxide semiconductor film 112. As the insulating film 116, a 100-nm-thick silicon nitride film was formed with a PECVD apparatus.

Next, the insulating film 118 was formed over the insulating film 116. As the insulating film 118, a 300-nm-thick silicon oxynitride film was formed with a PECVD apparatus.

Next, a mask was formed over the insulating film 118, and the openings 141a and 141b were formed in the insulating films 116 and 118 using the mask. Processing into the openings 141a and 141b was performed with a dry etching apparatus.

Next, the insulating film 122 was formed over the insulating film 118. A 1.5-μm-thick acrylic-based photosensitive resin film was used as the insulating film 122. Note that openings were provided in regions of the insulating film 122 so as to overlap with the openings 141a and 141b.

Next, a conductive film was formed over the insulating film 122 so as to fill the openings 141a and 141b and was processed into island shapes, whereby the conductive films 120a and 120b were formed.

As the conductive films 120a and 120b, a 50-nm-thick titanium film, a 400-nm-thick aluminum film, and a 100-nm-thick titanium film were successively formed with a sputtering apparatus in a vacuum.

Through the above-described steps, the transistor corresponding to the transistor 100C illustrated in FIGS. 7A and 7B was formed.

Note that in this example, the channel width W of the transistor corresponding to the transistor 100C was 50 μm, while the channel length L was varied between 1.5 μm, 2.0 μm, and 3.0 μm. Note that as each type of transistor with a different channel length L, 20 transistors were formed over a substrate.

1-2. ELECTRICAL CHARACTERISTICS OF TRANSISTOR

Figure 33A:
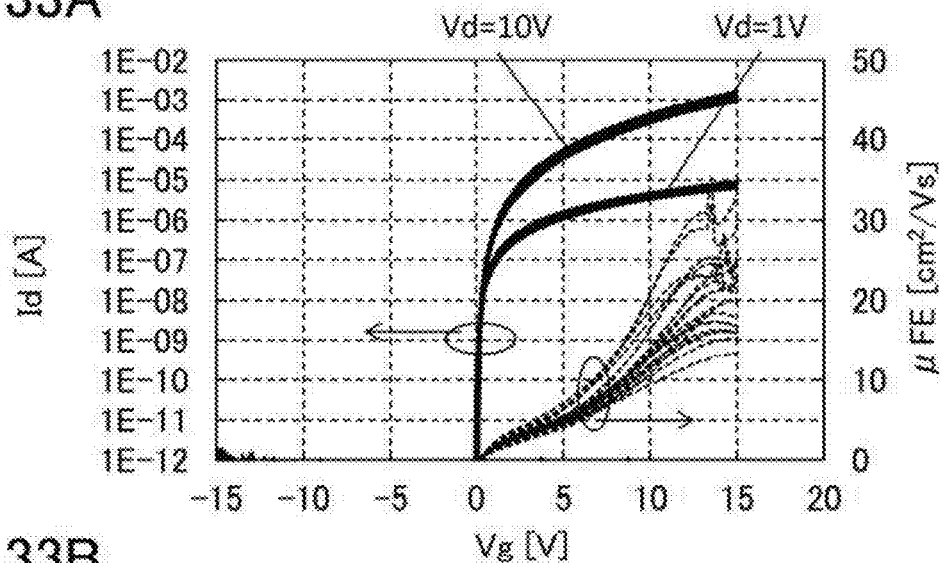
FIGS. 33A to 33C each show Id-Vg characteristics of transistors in an example.
Figure 33B:
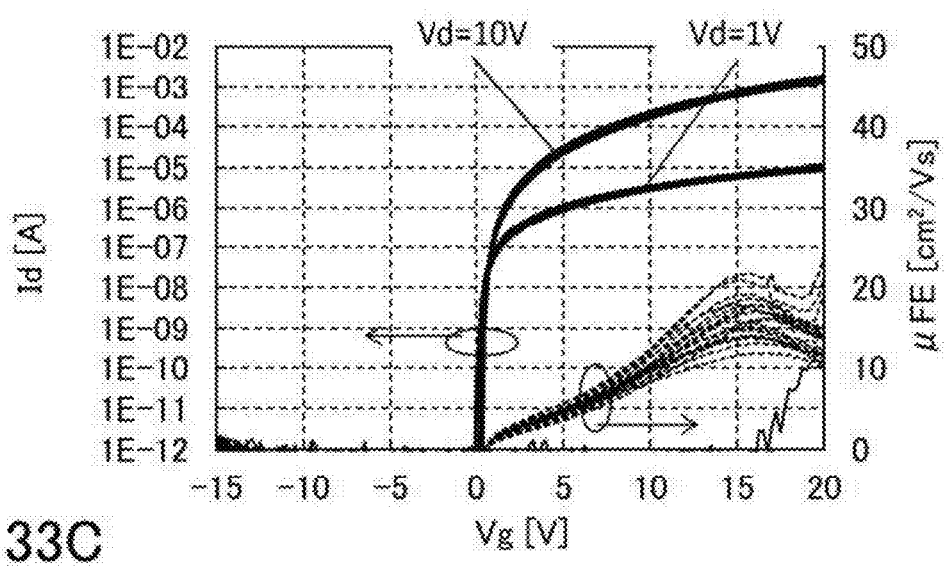
Figure 33C:
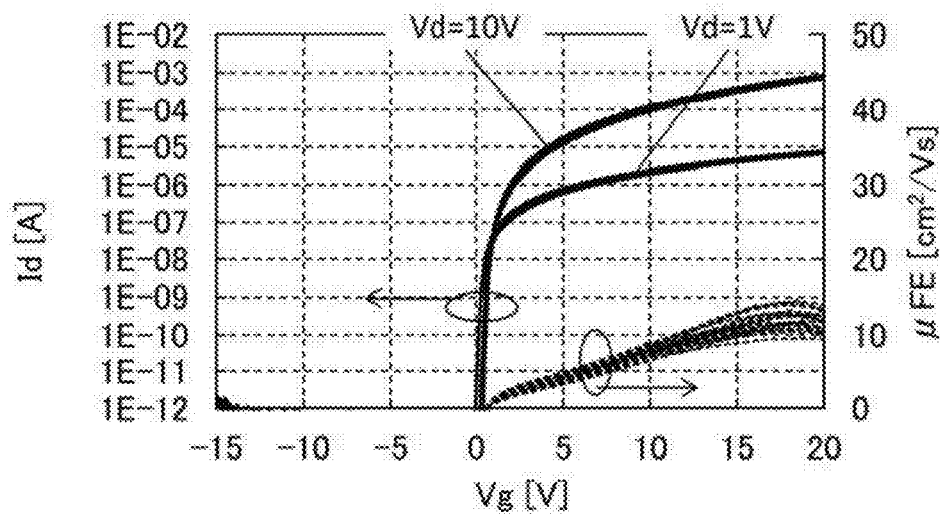

FIGS. 33A to 33C show drain current-gate voltage (Id-Vg) characteristics of the transistors of Sample A1 fabricated in this example.

Note that FIG. 33A shows the characteristics of the transistors with a size of W/L=50 μm/1.5 μm, FIG. 33B shows the characteristics of the transistors with a size of W/L=50 μm/2.0 μm, and FIG. 33C shows the characteristics of the transistors with a size of W/L=50 μm/3.0 μm. In FIGS. 33A to 33C, the first vertical axis indicates Id [A], the second vertical axis indicates field-effect mobility (μFE [cm$^2$/Vs]), and the horizontal axis indicates Vg [V].

As conditions for measuring the Id-Vg characteristics of each transistor, a voltage applied to the conductive film 106 functioning as the first gate electrode of each transistor (hereinafter the voltage is also referred to as gate voltage (Vg)) and a voltage applied to the oxide semiconductor film 112 functioning as the second gate electrode of each transistor (hereinafter the voltage is also referred to as back gate voltage (Vbg)) changed from −15 V to +20 V in increments of 0.25 V. A voltage applied to the conductive film 120a functioning as a source electrode (hereinafter the voltage is also referred to as source voltage (Vs)) was 0 V (comm), and a voltage applied to the conductive film 120b functioning as a drain electrode (hereinafter the voltage is also referred to as drain voltage (Vd)) was 1 V and 10 V. Note that in the transistor with a size of W/L=50 μm/1.5 μm, the voltage Vg and Vbg each changed from −15 V to +15 V.

As shown in FIGS. 33A to 33C, the electrical characteristics of Sample A1 fabricated in this example were favorable regardless of the channel length (L).

Figure 34A:
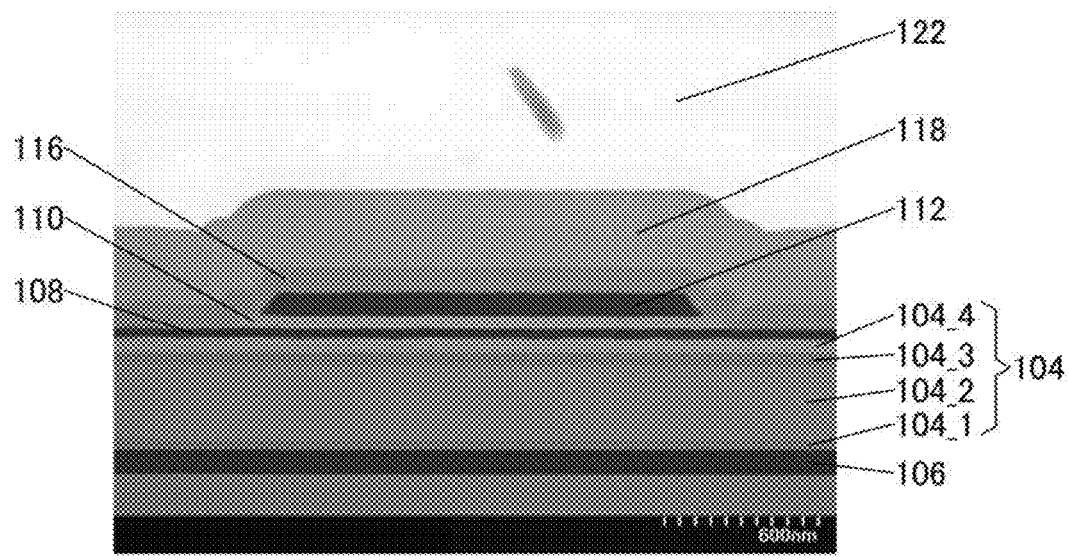
FIGS. 34A and 34B are cross-sectional TEM images of transistors in an example.
Figure 34B:
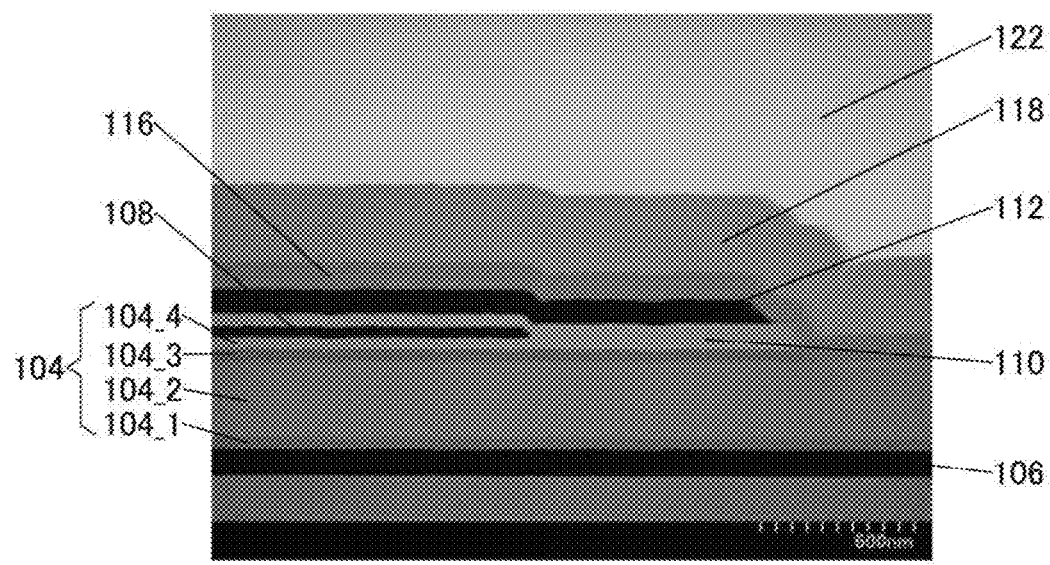

Next, the cross section of the formed transistor with a size of W/L=50 μm/20 μm was observed. FIGS. 34A and 34B show the results of the cross-sectional observation of the transistor. Note that a transmission electron microscope (TEM) was used for the cross-sectional observation.

FIG. 34A shows a cross section taken along the dashed-dotted line X1-X2 in FIG. 7A, and FIG. 34B shows a cross section taken along the dashed-dotted line Y1-Y2 in FIG. 7A.

As shown in FIGS. 34A and 34B, Sample A1 fabricated in this example had a favorable cross-sectional shape.

The structure, method, and the like described in this example can be combined as appropriate with any of the other structures, methods, and the like described in the other examples and the embodiments.

Example 2

For evaluation in this example, a transistor corresponding to the transistor 100A illustrated in FIGS. 3A to 3C was formed. The transistor was evaluated by electrical characteristics measurement and reliability test.

Moreover, in this example, Samples B1, B2, and B3 each including the transistor corresponding to the transistor 100A illustrated in FIGS. 3A to 3C were fabricated. As the transistor size of Sample B1, the channel length L was set to 3 μm and the channel width W was set to 50 μm. As the transistor size of Sample B2, the channel length L was set to 2 μm and the channel width W was set to 50 μm. As the transistor size of Sample B3, the channel length L was set to 1.5 μm and the channel width W was set to 3 μm.

Figure 35A:
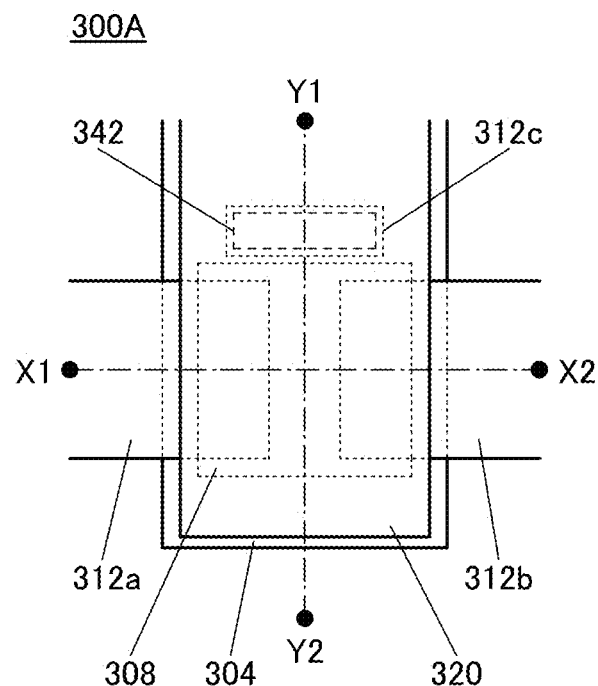
FIGS. 35A to 35C are a top view and cross-sectional views illustrating the structure of a transistor for comparison in an example.
Figure 35B:
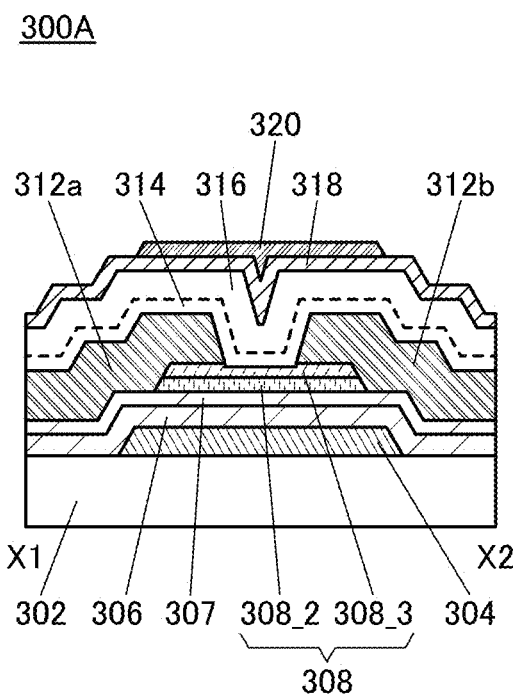
Figure 35C:
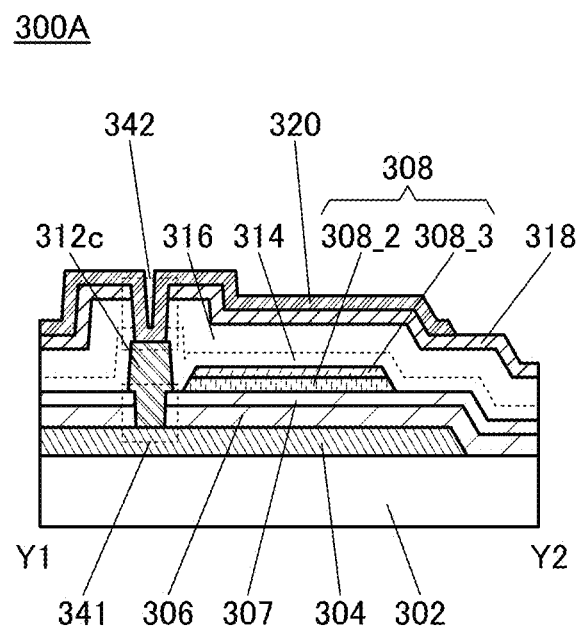

Note that for comparison with Sample B1, Sample C1 including a transistor 300A for comparison was fabricated. FIGS. 35A to 35C illustrate the structure of the transistor 300A for comparison.

The transistor 100A illustrated in FIGS. 3A to 3C is a staggered transistor, whereas the transistor 300A for comparison is an inverted staggered transistor.

FIG. 35A is a top view of the transistor 300A. FIG. 35B is a cross-sectional view taken along the dashed-dotted line X1-X2 in FIG. 35A. FIG. 35C is a cross-sectional view taken along the dashed-dotted line Y1-Y2 in FIG. 35A.

The transistor 300A includes a conductive film 304 functioning as a first gate electrode over a substrate 302, an insulating film 306 over the substrate 302 and the conductive film 304, an insulating film 307 over the insulating film 306, an oxide semiconductor film 308 over the insulating film 307, a conductive film 312a electrically connected to the oxide semiconductor film 308 and functioning as a source electrode, a conductive film 312b electrically connected to the oxide semiconductor film 308 and functioning as a drain electrode, an insulating film 314 over the oxide semiconductor film 308 and the conductive films 312a and 312b, an insulating film 316 over the insulating film 314, an insulating film 318 over the insulating film 316, and a conductive film 320 over the insulating film 318. Note that the oxide semiconductor film 308 has a stacked-layer structure of an oxide semiconductor film 308_2 and an oxide semiconductor film 3083 over the oxide semiconductor film 3082.

The insulating films 314, 316, and 318 in the transistor 300A function as a second gate insulating film.

The conductive film 320 in the transistor 300A functions as a second gate electrode (also referred to as a back gate electrode). As illustrated in FIG. 35C, the conductive film 320 is connected to the conductive film 304 functioning as the first gate electrode through a conductive film 312c in an opening 341 provided in the insulating films 306 and 307 and an opening 342 provided in the insulating films 314, 316, and 318. Therefore, the same potential is applied to the conductive films 320 and 304. The transistor 300A has the s-channel structure described above.

As the transistor size of Sample C1, the channel length L was set to 3 μm and the channel width W was set to 50 μm. Note that in this example, 10 transistors were formed in each of Samples B1 to B3 and Sample C1.

2-1. METHOD FOR FABRICATION SAMPLES B1 TO B3

A method for fabricating Samples B1 to B3 used in this example is described below. In the description below, the same reference numerals are used for a structure similar to the structure of the transistor 100A illustrated in FIGS. 3A and 3B.

First, the substrate 102 was prepared. As the substrate 102, a glass substrate was used. Next, the conductive film 106 was formed over the substrate 102. As the conductive film 106, a 100-nm-thick tungsten film was formed with a sputtering apparatus.

Next, the insulating film 104 was formed over the substrate 102 and the conductive film 106. Note that in this example, as the insulating film 104, the insulating films 104_1, 104_2, 104_3, and 104_4 were successively formed in this order with a PECVD apparatus in a vacuum. A 50-nm-thick silicon nitride film was formed as the insulating film 104_1. A 300-nm-thick silicon nitride film was formed as the insulating film 104_2. A 50-nm-thick silicon nitride film was formed as the insulating film 104_3. A 50-nm-thick silicon oxynitride film was formed as the insulating film 104_4.

Next, an oxide semiconductor film was formed over the insulating film 104 and was processed into an island shape, whereby the oxide semiconductor film 108 was formed. A 40-nm-thick oxide semiconductor film was formed as the oxide semiconductor film 108. Note that a sputtering apparatus was used to form the oxide semiconductor film 108, a metal oxide of In:Ga:Zn=4:2:4.1 [atomic ratio] was used as a sputtering target, and an AC power supply was used to supply power to the sputtering target. Note that processing into the oxide semiconductor film 108 was performed by a wet etching method.

Next, an insulating film to be the insulating film 110 was formed over the insulating film 104 and the oxide semiconductor film 108. As the insulating film, a 30-nm-thick silicon oxynitride film, a 100-nm-thick silicon oxynitride film, and a 20-nm-thick silicon oxynitride film were successively formed with a PECVD apparatus in a vacuum.

Next, heat treatment was performed. The heat treatment was performed at 350° C. in a nitrogen atmosphere for one hour.

Next, the opening 143 was formed. Processing into the opening 143 was performed by a dry etching method.

Next, an oxide semiconductor film was formed over the insulating film and was processed into an island shape, whereby the oxide semiconductor film 112 was formed. A 100-nm-thick oxide semiconductor film was formed as the oxide semiconductor film 112. The composition of the oxide semiconductor film 112 was the same as that of the oxide semiconductor film 108 described above. The insulating film was processed in succession to the oxide semiconductor film 112, whereby the insulating film 110 having an island shape was formed.

Note that processing into the oxide semiconductor film 112 was performed by a wet etching method, and processing into the insulating film 110 was performed by a dry etching method.

Next, an impurity element was added from above the insulating film 104, the oxide semiconductor film 108, the insulating film 110, and the oxide semiconductor film 112. A doping apparatus was used for the impurity element addition treatment, in which argon was used as the impurity element.

Next, the insulating film 116 was formed over the insulating film 104 and the oxide semiconductor films 108 and 112. As the insulating film 116, a 100-nm-thick silicon nitride film was formed with a PECVD apparatus.

Next, the insulating film 118 was formed over the insulating film 116. As the insulating film 118, a 300-nm-thick silicon oxynitride film was formed with a PECVD apparatus.

Next, a mask was formed over the insulating film 118, and the openings 141a and 141b were formed in the insulating films 116 and 118 using the mask. Processing into the openings 141a and 141b was performed with a dry etching apparatus.

Next, a conductive film was formed over the insulating film 118 so as to fill the openings 141a and 141b and was processed into island shapes, whereby the conductive films 120a and 120b were formed.

As the conductive films 120a and 120b, a 50-nm-thick titanium film, a 400-nm-thick aluminum film, and a 100-nm-thick titanium film were successively formed with a sputtering apparatus in a vacuum.

Next, heat treatment was performed. The heat treatment was performed at 250° C. in a nitrogen atmosphere for one hour.

Through the above-described steps, Samples B1 to B3 were fabricated.

2-2. METHOD FOR FABRICATING SAMPLE C1

A method for fabricating Sample C1 used in this example is described below.

First, the substrate 302 was prepared. As the substrate 302, a glass substrate was used. Next, the conductive film 304 was formed over the substrate 302. As the conductive film 304, a 100-nm-thick tungsten film was formed with a sputtering apparatus.

Next, the insulating films 306 and 307 were formed over the substrate 302 and the conductive film 304. Note that in this example, as the insulating film 306, a first insulating film, a second insulating film, and a third insulating film were successively formed in this order with a PECVD apparatus in a vacuum. A 50-nm-thick silicon nitride film was formed as the first insulating film. A 300-nm-thick silicon nitride film was formed as the second insulating film.

A 50-nm-thick silicon nitride film was formed as the third insulating film. A 50-nm-thick silicon oxynitride film was formed as the insulating film 307.

Next, an oxide semiconductor film was formed over the insulating film 307 and was processed into an island shape, whereby the oxide semiconductor film 308 was formed. The oxide semiconductor film 308 had a stacked-layer structure of the oxide semiconductor film 308_2 having a thickness of 10 nm and the oxide semiconductor film 308_3 having a thickness of 15 nm. Note that a sputtering apparatus was used to form the oxide semiconductor film 308_2, a metal oxide of In:Ga:Zn=4:2:4.1 [atomic ratio] was used as a sputtering target, and an AC power supply was used to supply power to the sputtering target. Moreover, the sputtering apparatus was used to form the oxide semiconductor film 308_3, a metal oxide of In:Ga:Zn=1:1:1.2 [atomic ratio] was used as a sputtering target, and an AC power supply was used to supply power to the sputtering target. Note that processing into the oxide semiconductor film 308 was performed by a wet etching method.

Next, the opening 341 was formed in the insulating films 306 and 307. Processing into the opening 341 was performed with a dry etching apparatus.

Next, a conductive film was formed over the insulating film 307 and the oxide semiconductor film 308 and was processed into island shapes, whereby the conductive films 312a and 312b were formed. As the conductive films 312a to 312c, a 50-nm-thick tungsten film, a 400-nm-thick aluminum film, and a 100-nm-thick titanium film were stacked in this order with a sputtering apparatus.

Next, a surface of the oxide semiconductor film 308 (on a back channel side) was cleaned. As the cleaning method, a phosphoric acid solution obtained by diluting phosphoric acid (concentration of 85 vol %) 100 times with water was applied to the oxide semiconductor film 308 and the conductive films 312a and 312b with a spin cleaning apparatus. Note that the cleaning was performed for 15 seconds.

Next, the insulating films 314 and 316 were formed over the oxide semiconductor film 308 and the conductive films 312a and 312b. As the insulating film 314, a 40-nm-thick silicon oxynitride film was formed with a PECVD apparatus. As the insulating film 316, a 400-nm-thick silicon oxynitride film was formed with a PECVD apparatus.

Next, heat treatment was performed. The heat treatment was performed at 350° C. in a nitrogen atmosphere for one hour.

Then, a 5-nm-thick ITSO film was formed over the insulating film 316 with a sputtering apparatus. Subsequently, oxygen addition treatment was performed on the oxide semiconductor film 308 and the insulating films 306 and 307 through the ITSO film. The oxygen addition treatment was performed with an ashing apparatus under the conditions where the substrate temperature was 40° C., an oxygen gas at a flow rate of 250 sccm was introduced into a chamber, the pressure was 15 Pa, and an RF power of 4500 W was supplied for 120 seconds between parallel-plate electrodes provided in the ashing apparatus so as to apply a bias to the substrate side.

Next, the ITSO film was removed to expose the insulating film 316. The ITSO film war removed using a wet etching apparatus in such a manner that etching was performed using an oxalic acid solution at a concentration of 5% for 300 seconds and then etching was performed using hydrofluoric acid at a concentration of 0.5% for 15 seconds.

Next, the insulating film 318 was formed over the insulating film 316. As the insulating film 318, a 100-nm-thick silicon nitride film was formed with a PECVD apparatus.

Next, the opening 342 that reaches the conductive film 312c was formed. Processing into the opening 342 was performed with a dry etching apparatus.

Then, a conductive film was formed in a desired position over the conductive film 312c and the insulating film 318 to cover the opening 342, whereby the conductive film 320 was formed. As the conductive film 320, a 100-nm-thick ITSO film was formed with a sputtering apparatus.

Next, heat treatment was performed. The heat treatment was performed at 250° C. in a nitrogen atmosphere for one hour.

Through the above-described steps, Sample C1 for comparison was fabricated.

2-3. ELECTRICAL CHARACTERISTICS OF TRANSISTOR

Figure 36:
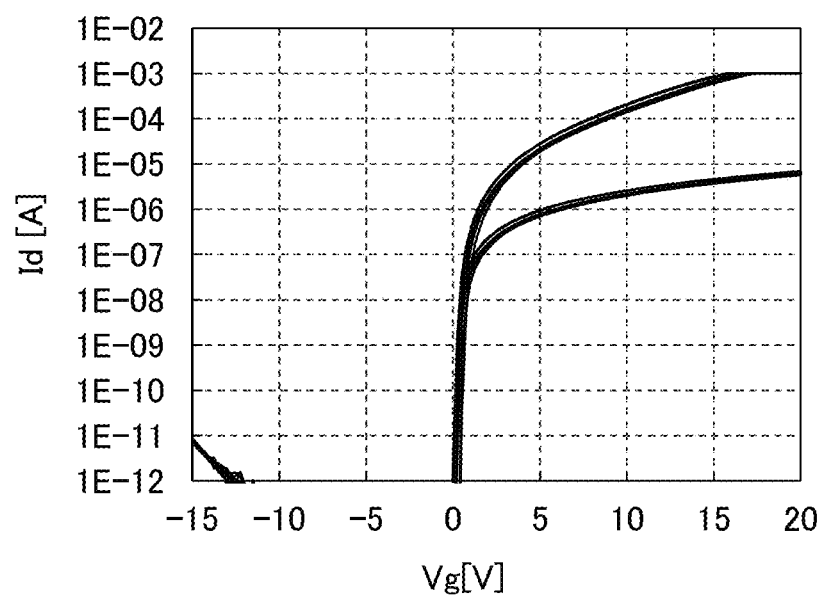
FIG. 36 shows electrical characteristics of transistors in an example.
Figure 37:
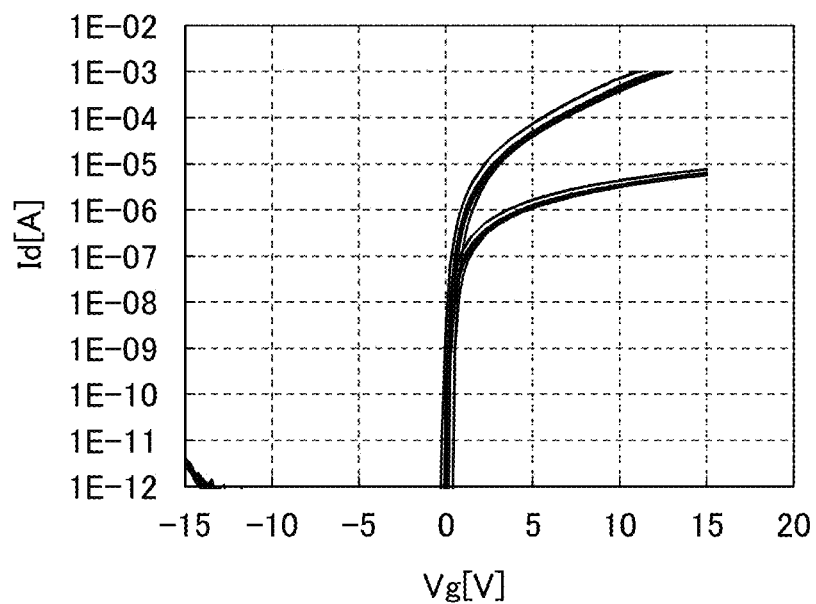
FIG. 37 shows electrical characteristics of transistors in an example.
Figure 38:
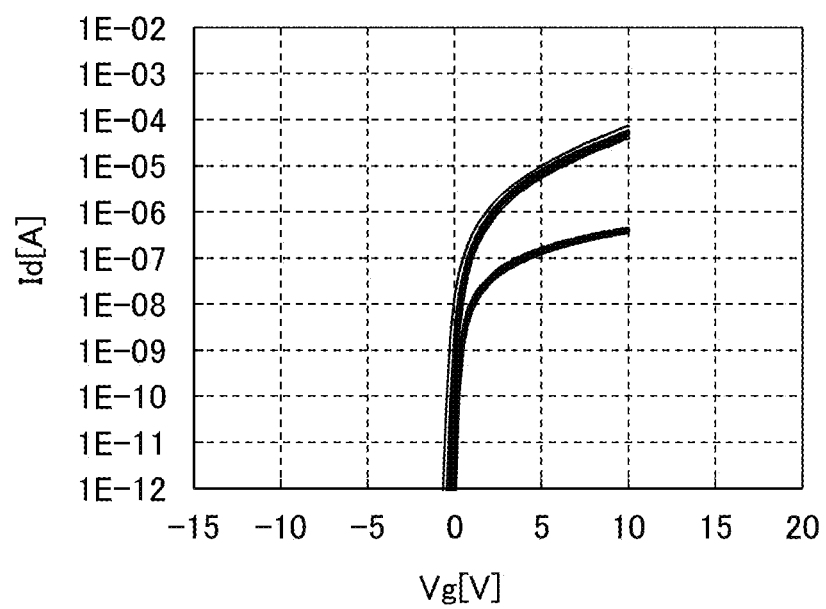
FIG. 38 shows electrical characteristics of transistors in an example.
Figure 39:
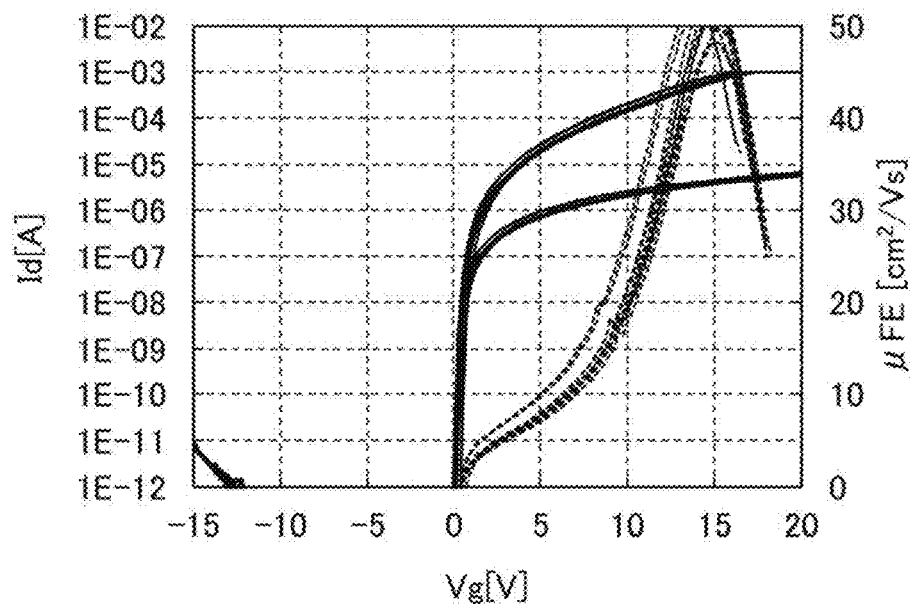
FIG. 39 shows electrical characteristics of transistors in an example.
Figure 40:
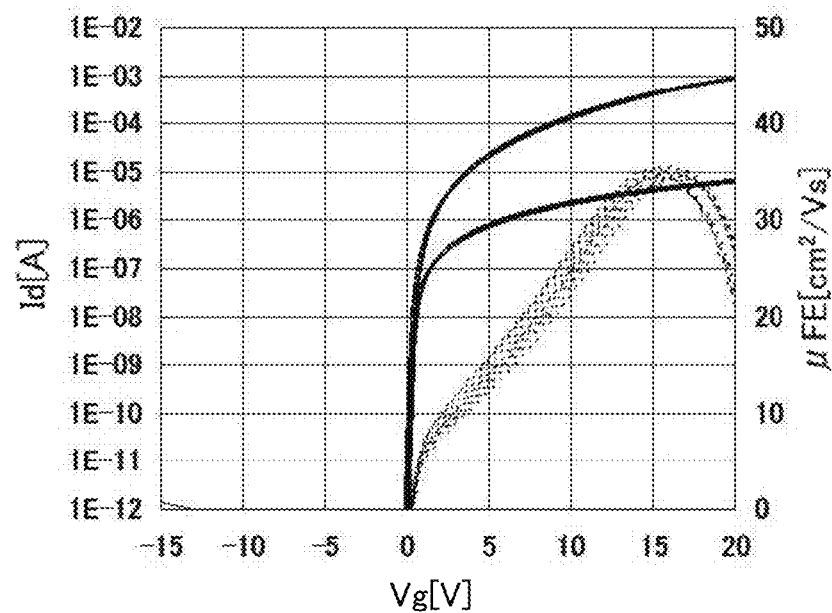
FIG. 40 shows electrical characteristics of transistors in an example.

FIGS. 36, 37, 38, 39, and 40 show drain current-gate voltage (Id-Vg) characteristics of the transistors of fabricated Samples B1 to B3 and Sample C1. Note that FIG. 36 shows the characteristics of the transistors of Sample B1, FIG. 37 shows the characteristics of the transistors of Sample B2, and FIG. 38 shows the characteristics of the transistors of Sample B3. FIG. 39 shows the characteristics of the transistors of Sample B1, and FIG. 40 shows the characteristics of the transistors of Sample C1. Note that FIG. 39 is a graph in which the field-effect mobility of the transistors of Sample B1 is superimposed on the Id-Vg characteristics shown in FIG. 36. In each of FIGS. 36 to 40, data of the 10 transistors are superimposed on each other.

In FIGS. 36 to 38, the vertical axis indicates Id [A], and the horizontal axis indicates Vg [V]. In FIGS. 39 to 40, the first vertical axis indicates Id [A], the second vertical axis indicates field-effect mobility ($\mu$FE [cm$^2$/Vs]), and the horizontal axis indicates Vg [V].

As conditions for measuring the Id-Vg characteristics of each transistor of Sample B1, a voltage applied to the conductive film 106 functioning as the first gate electrode of each transistor (hereinafter the voltage is also referred to as back gate voltage (Vbg)) and a voltage applied to the oxide semiconductor film 112 functioning as the second gate electrode of each transistor (hereinafter the voltage is also referred to as gate voltage (Vg)) changed from −15 V to +20 V in increments of 0.25 V. As conditions for measuring the Id-Vg characteristics of each transistor of Sample B2, back gate voltage (Vbg) and gate voltage (Vg) of each transistor changed from −15 V to +15 V in increments of 0.25 V. As conditions for measuring the Id-Vg characteristics of each transistor in Sample B3, back gate voltage (Vbg) and gate voltage (Vg) of each transistor changed from −15 V to +10 V in increments of 0.25 V. As conditions for measuring the Id-Vg characteristics of each transistor in Sample C1, a voltage applied to the conductive film 304 functioning as the first gate electrode of each transistor (gate voltage (Vg)) and a voltage applied to the conductive film 320 functioning as the second gate electrode of each transistor (back gate voltage (Vbg)) changed from −15 V to +15 V in increments of 0.25 V.

In Samples B1 to B3 and Sample C2, a voltage applied to the conductive film (the conductive film 120a or 312a) functioning as a source electrode (hereinafter the voltage is also referred to as source voltage (Vs)) was 0 V (comm), and a voltage applied to the conductive film (the conductive film 120b or 312b) functioning as a drain electrode (hereinafter the voltage is also referred to as drain voltage (Vd)) was 0.1 V and 20 V.

The results in FIGS. 36 to 38 show that the transistor of one embodiment of the present invention was a normally-off transistor even when the channel length was reduced to 1.5 μm. Furthermore, the results show that Samples B1 to B3 had less variation in the substrate surface.

The results in FIGS. 39 and 40 show that the field-effect mobility of both of Sample B1 and Sample C1 exceeds 30 cm$^2$/Vs. However, when Sample B1 and Sample C1 were compared with each other, Sample B1 of one embodiment of the present invention had higher field-effect mobility than Sample C1.

2-5. Constant-Current Stress Test>

Next, a constant-current stress test was performed on Sample B1 and Sample C1. Note that the constant-current stress test was performed under an air atmosphere in a dark state (dark).

Note that the measurement of Id-Vg characteristics was performed by measuring drain current when drain voltage was set to 0.1 V and 10 V and gate voltage was swept in the range of −15 V to 15 V.

In the constant-current stress test for Sample B1, the substrate temperature was set at room temperature, and the first measurement of Id-Vg characteristics and Id-Vd characteristics was performed. Then, the substrate temperature was set to 60° C., a source potential was set to a ground potential (GND), a drain potential was set to 10 V, and a gate potential was set to 1.88 V, and the state was maintained for 48 hours. After that, the second measurement of Id-Vg characteristics and Id-Vd characteristics was performed.

In the constant-current stress test for Sample C1, the substrate temperature was set at room temperature, and the first measurement of Id-Vg characteristics and Id-Vd characteristics was performed. Then, the substrate temperature was set to 60° C., a source potential was set to a ground potential (GND), a drain potential was set to 10 V, and a gate potential was set to 1.99 V, and the state was maintained for 24 hours. After that, the second measurement of Id-Vg characteristics and Id-Vd characteristics was performed.

Figure 41A:
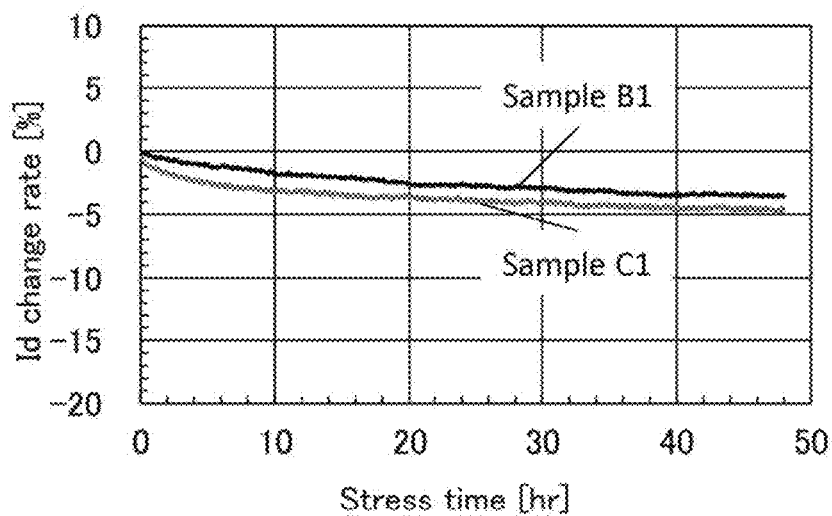
FIGS. 41A to 41C show Id change rates of transistors, Id-Vg characteristics before and after a stress test, and Id-Vd characteristics before and after the stress test.
Figure 41B:
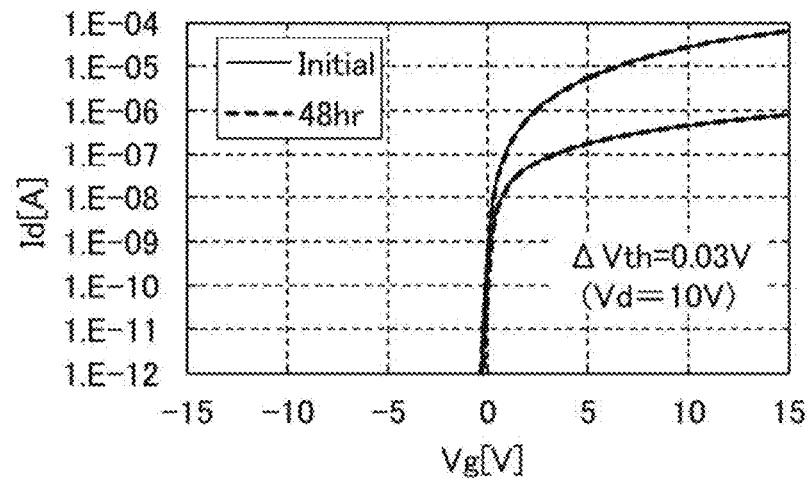
Figure 41C:
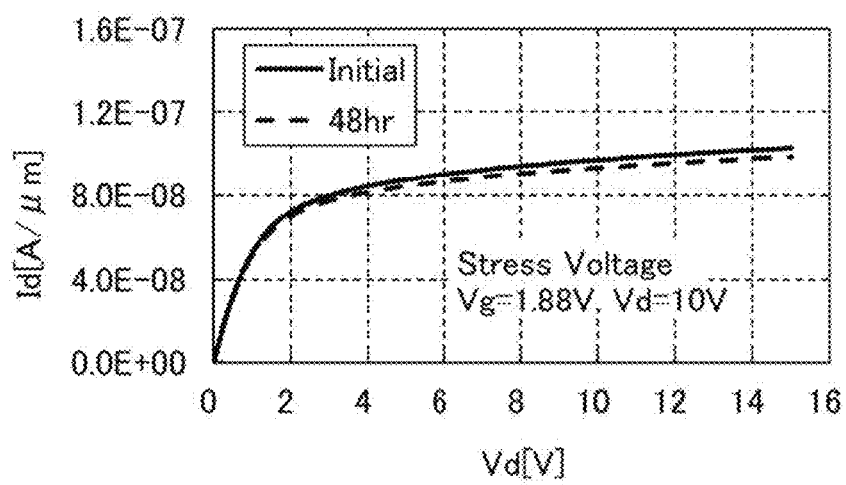

The results of the constant-current stress test performed on Sample B1 and Sample C1 are shown in FIGS. 41A to 41C. Note that FIG. 41A shows the change rates of drain currents (Id) of Sample B1 and Sample C1 with respect to stress time. FIG. 41B shows the Id-Vg characteristics of Sample B1 before and after the stress test, and FIG. 41C shows the Id-Vd characteristics of Sample B1 before and after the stress test.

Note that in FIG. 41A, a black solid line indicates the measurement result of Sample B1, and a gray solid line indicates those of Sample C1. In FIG. 41B, a solid line indicates the Id-Vg characteristics before the stress test, and a dashed line indicates those after the stress test. In FIG. 41C, a solid line indicates the Id-Vd characteristics before the stress test, and a dashed line indicates those after the stress test.

As shown in FIGS. 41A to 41C, the amount of change in the drain current before and after the stress test is small in Sample B1 of one embodiment of the present invention. This also shows that a semiconductor device including the transistor of one embodiment of the present invention has high reliability.

The structure, method, and the like described in this example can be combined as appropriate with any of the other structures, methods, and the like described in the other examples and the embodiments.

Example 3

In this example, Sample D1 in which transistors of one embodiment of the present invention were formed was fabricated, and the cross-sectional shape of Sample D1 was observed.

3-1. CROSS-SECTIONAL OBSERVATION

In Sample D1, a planarization insulating film was formed over transistors corresponding to the transistor 100A illustrated in FIGS. 3A to 3C. As the transistor size of Sample D1, the channel length L was set to 2 μm and the channel width W was set to 50 μm.

The structure of Sample D1 is described below with the reference numerals and the like of the transistor 100A illustrated in FIGS. 3A to 3C.

As the conductive film 106, a stacked-layer film of a 10-nm-thick tantalum nitride film and a 100-nm-thick copper film was formed with a sputtering apparatus. As the insulating film 104, a 400-nm-thick silicon nitride oxide film and a 50-nm-thick silicon oxynitride film were formed with a PECVD apparatus. As the oxide semiconductor film 108, a 40-nm-thick In—Ga—Zn oxide film was formed. Note that a sputtering apparatus was used to form the In—Ga—Zn oxide, a metal oxide of In:Ga:Zn=1:1:1.2 [atomic ratio] was used as a sputtering target, and an AC power supply was used to supply power to the sputtering target. As the insulating film 110, a 100-nm-thick silicon oxynitride film was formed with a PECVD apparatus. As the oxide semiconductor film 112, a 100-nm-thick In—Ga—Zn oxide was formed with a sputtering apparatus. Note that the sputtering apparatus was used to form the In—Ga—Zn oxide, a metal oxide of In:Ga:Zn=4:2:4.1 [atomic ratio] was used as a sputtering target, and an AC power supply was used to supply power to the sputtering target. As the insulating film 116, a 100-nm-thick silicon nitride film was formed with a PECVD apparatus. As the insulating film 118, a 400-nm-thick silicon oxynitride film was formed with a PECVD apparatus. As the conductive films 120a and 120b, a 50-nm-thick copper alloy (Cu—Mn) film and a 100-nm-thick copper film were formed with a sputtering apparatus.

Moreover, in Sample D1, a 1.5-μm-thick acrylic-based resin film was formed as an insulating film 158 over the insulating film 118 and the conductive films 120a and 120b.

Figure 42:
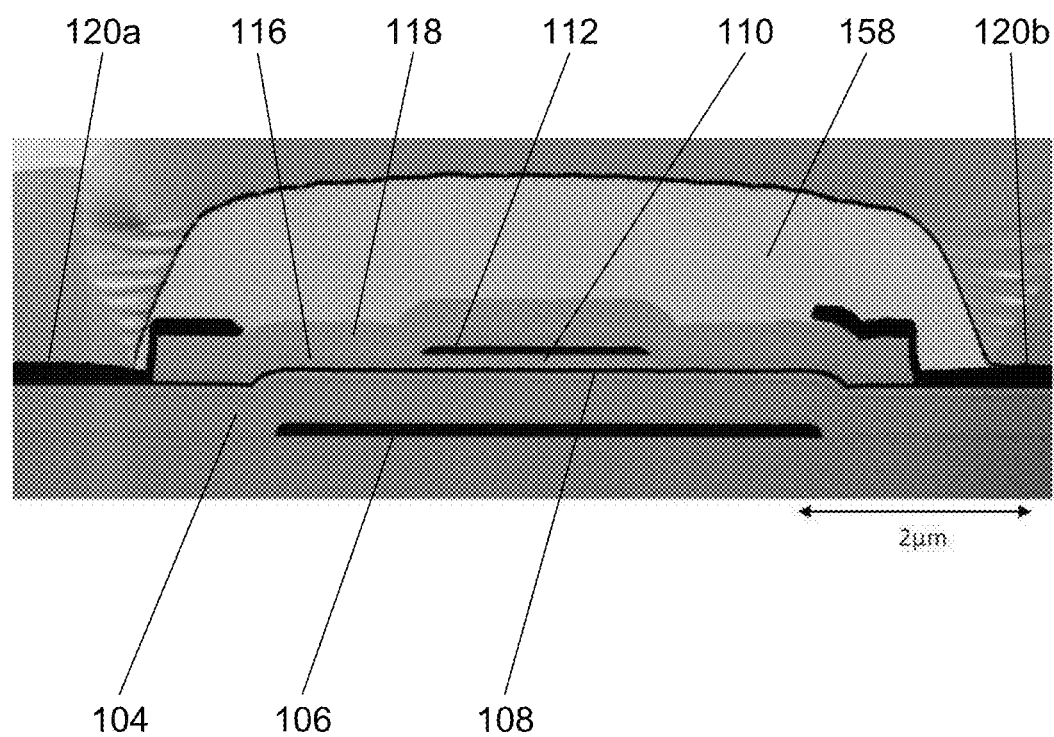
FIG. 42 is a cross-sectional TEM image of a transistor in an example.

FIG. 42 shows the observation result of the cross section of Sample D1 fabricated in the above-described manner. As shown in FIG. 42, Sample D1 fabricated in this example was confirmed to have a favorable cross-sectional shape. The result indicates that parasitic capacitance is small particularly because the channel length L is 2.01 μm and the distance between the conductive film 106 functioning as the first gate electrode and the conductive films 120a and 120b functioning as the source and drain electrodes is long.

The structure described in this example can be combined as appropriate with any of the other structures described in the other examples and the embodiments.

REFERENCE NUMERALS

100: transistor, 100A: transistor, 100B: transistor, 100C: transistor, 100D: transistor, 100E: transistor, 100F: transistor, 100G: transistor, 102, substrate, 104: insulating film, 104_1: insulating film, 104_2: insulating film, 104_3: insulating film, 104_4: insulating film, 106: conductive film, 107: oxide semiconductor film, 108: oxide semiconductor film, 108_1: oxide semiconductor film, 1082: oxide semiconductor film, 1083: oxide semiconductor film, 108d: drain region, 108f: region, 108i: channel region, 108s: source region, 110: insulating film, 110_0: insulating film, 112: oxide semiconductor film, 112_0: oxide semiconductor film, 112a: conductive film, 112b: conductive film, 114: conductive film, 116: insulating film, 118: insulating film, 120: conductive film, 120a: conductive film, 120b: conductive film, 122: insulating film, 140: mask, 141a: opening, 141b: opening, 143: opening, 145: impurity element, 147: hollow region, 150: transistor, 150A: transistor, 150B: transistor, 158: insulating film, 300A: transistor, 302: substrate, 304: conductive film, 306: insulating film, 307: insulating film, 308: oxide semiconductor film, 3082: oxide semiconductor film, 3083: oxide semiconductor film, 312a: conductive film, 312b: conductive film, 312c: conductive film, 314: insulating film, 316: insulating film, 317: insulating film, 318: insulating film, 320: conductive film, 341: opening, 342: opening, 501: pixel circuit, 502: pixel portion, 504: driver circuit portion, 504a: gate driver, 504b: source driver, 506: protection circuit, 507: terminal portion, 550: transistor, 552: transistor, 554: transistor, 560: capacitor, 562: capacitor, 570: liquid crystal element, 572: light-emitting element, 700: display device, 701: substrate, 702: pixel portion, 704: source driver circuit portion, 705: substrate, 706: gate driver circuit portion, 708: FPC terminal portion, 710: signal line, 711: wiring portion, 712: sealant, 716: FPC, 730: insulating film, 732: sealing film, 734: insulating film, 736: coloring film, 738: light-blocking film, 750: transistor, 752: transistor, 760: connection electrode, 770: planarization insulating film, 772: conductive film, 774: conductive film, 775: liquid crystal element, 776: liquid crystal layer, 778: structure, 780: anisotropic conductive film, 782: light-emitting element, 784: conductive film, 786: EL layer, 788: conductive film, 790: capacitor, 1280a: p-channel transistor, 1280b: n-channel transistor, 1280c: n-channel transistor, 1281: capacitor, 1282: transistor, 1311: wiring, 1312: wiring, 1313: wiring, 1314: wiring, 1315: wiring, 1316: wiring, 1317: wiring, 1351: transistor, 1352: transistor, 1353: transistor, 1354: transistor, 1360: photoelectric conversion element, 1401: signal, 1402: signal, 1403: signal, 1404: signal, 1405: signal, 8000: display module, 8001: upper cover, 8002: lower cover, 8003: FPC, 8004: touch panel, 8005: FPC, 8006: display panel, 8007: backlight, 8008: light source, 8009: frame, 8010: printed circuit board, 8011: battery, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television device, 9101: portable information terminal, 9102: portable information terminal, 9200: portable information terminal, 9201: portable information terminal.

This application is based on Japanese Patent Application serial no. 2015-104502 filed with Japan Patent Office on May 22, 2015 and Japanese Patent Application serial no. 2015-150231 filed with Japan Patent Office on Jul. 30, 2015, the entire contents of which are hereby incorporated by reference.

The invention claimed is:

1. A semiconductor device comprising:
an oxide semiconductor film;
a first insulating film overlapping with the oxide semiconductor film;
a metal oxide film in contact with the first insulating film;
a first conductive film overlapping with the oxide semiconductor film;
a second insulating film comprising hydrogen and overlapping with the first conductive film;
a second conductive film electrically connected to the oxide semiconductor film; and
a third conductive film electrically connected to the oxide semiconductor film,
wherein the oxide semiconductor film has a first region in contact with the second insulating film, and
wherein the metal oxide film has a crystal part in which a plurality of spots is observed in form of a ring by a nanobeam electron diffraction pattern.

2. A semiconductor device comprising:
an oxide semiconductor film;
a first insulating film overlapping with the oxide semiconductor film;
a metal oxide film in contact with the first insulating film;
a first conductive film overlapping with the oxide semiconductor film;
a second insulating film comprising hydrogen and overlapping with the first conductive film;
a second conductive film electrically connected to the oxide semiconductor film; and
a third conductive film electrically connected to the oxide semiconductor film,
wherein the oxide semiconductor film has a first region in contact with the second insulating film,
wherein the metal oxide film has a plurality of crystal parts, and
wherein a crystal orientation between one of the plurality of crystal parts and another one of the plurality of crystal parts differs.

3. The semiconductor device according to claim 1, wherein no grain boundary is observed in the metal oxide film in a high-resolution TEM image.

4. The semiconductor device according to claim 2, wherein no grain boundary is observed in the metal oxide film in a high-resolution TEM image.

5. The semiconductor device according to claim 1, wherein each of the oxide semiconductor film and the metal oxide film comprises In, Ga, and Zn.

6. The semiconductor device according to claim 2, wherein each of the oxide semiconductor film and the metal oxide film comprises In, Ga, and Zn.

7. The semiconductor device according to claim 1,
wherein the second insulating film is in contact with side surfaces and a top surface of the oxide semiconductor film, and
wherein the second insulating film is in contact with side surfaces of the first insulating film and side surfaces of the metal oxide film.

8. The semiconductor device according to claim 2,
wherein the second insulating film is in contact with side surfaces nd a top surface of the oxide semiconductor film, and
wherein the second insulating film is in contact with side surfaces of the first insulating film and side surfaces of the metal oxide film.

9. The semiconductor device according to claim 1, wherein the oxide semiconductor film further has a second region in contact with the first insulating film.

10. The semiconductor device according to claim 1, wherein the first insulating film comprises one of silicon oxide, silicon nitride, and silicon nitride oxide.

11. The semiconductor device according to claim 1, wherein the metal oxide film and the first conductive film function as a gate electrode of a transistor.

12. The semiconductor device according to claim 2, wherein the oxide semiconductor film further has a second region in contact with the first insulating film.

13. The semiconductor device according to claim 2, wherein the first insulating film comprises one of silicon oxide, silicon nitride, and silicon nitride oxide.

14. The semiconductor device according to claim 2, wherein the metal oxide film and the first conductive film function as a gate electrode of a transistor.

* * * * *